United States Patent
Chou et al.

(10) Patent No.: US 10,170,714 B2
(45) Date of Patent: Jan. 1, 2019

(54) DISPLAY PANEL

(71) Applicant: AU OPTRONICS CORPORATION, Hsin-chu (TW)

(72) Inventors: Chia-Tien Chou, Hsin-chu (TW); Ya-Chun Chang, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/645,213

(22) Filed: Jul. 10, 2017

(65) Prior Publication Data

US 2018/0013081 A1    Jan. 11, 2018

(51) Int. Cl.
*H01L 27/32* (2006.01)
*H01L 51/05* (2006.01)
(Continued)

(52) U.S. Cl.
CPC ...... *H01L 51/0516* (2013.01); *H01L 27/1255* (2013.01); *H01L 27/323* (2013.01);
(Continued)

(58) Field of Classification Search
CPC ............. H01L 27/3253; H01L 27/3256; H01L 27/323; H01L 27/3225; H01L 27/326; H01L 27/3262; H01L 27/3258; H01L 27/1255; H01L 51/56; H01L 51/0516; H01L 51/05; H01L 51/5012; H01L 2227/32; H01L 2227/323
See application file for complete search history.

(56) References Cited

U.S. PATENT DOCUMENTS 6,583,846 B1 * 6/2003 Yanagawa ......... G02F 1/133707
349/110
7,511,794 B2   3/2009 Lin et al.
(Continued)

FOREIGN PATENT DOCUMENTS

CN     101059738 A    10/2007
CN     101339314 A     1/2009
(Continued)

OTHER PUBLICATIONS

Office Action issued by the State Intellectual Property Office of the Peoples Republic of China dated Aug. 22, 2018 for Application No. CN201610721098.9.

*Primary Examiner* — Michael M Trinh
(74) *Attorney, Agent, or Firm* — Tim Tingkang Xia, Esq.; Locke Lord LLP

(57) ABSTRACT

A display panel includes a first substrate, an upper capacitor electrode, a capacitor dielectric layer, a second substrate opposite to the first substrate, a conductive bump, an electroluminescent layer, and a counter electrode. The upper capacitor electrode is disposed on an inner surface of the second substrate. The upper capacitor electrode is disposed on an inner surface of the second substrate. The capacitor dielectric layer covers the upper capacitor electrode of the second substrate. The first substrate has at least one pixel electrode and a first capacitor electrode separated from the pixel electrode. The conductive bump is protrusively disposed on the first capacitor electrode of the first substrate. The electroluminescent layer is sandwiched between the pixel electrode and the counter electrode.

42 Claims, 45 Drawing Sheets

(51) Int. Cl.
  *H01L 51/50* (2006.01)
  *H01L 51/56* (2006.01)
  *H01L 27/12* (2006.01)
  *H01L 51/10* (2006.01)
  *H01L 51/00* (2006.01)

(52) U.S. Cl.
  CPC ...... *H01L 27/3225* (2013.01); *H01L 27/3253* (2013.01); *H01L 27/3258* (2013.01); *H01L 27/3265* (2013.01); *H01L 51/05* (2013.01); *H01L 51/5012* (2013.01); *H01L 51/56* (2013.01); *H01L 51/0002* (2013.01); *H01L 51/102* (2013.01); *H01L 2227/323* (2013.01)

(56) References Cited

U.S. PATENT DOCUMENTS

| | | | |
|---|---|---|---|
| 7,554,644 B2 | 6/2009 | Chang | |
| 7,872,724 B2 * | 1/2011 | Yoon | G02F 1/13306 349/156 |
| 8,441,181 B2 * | 5/2013 | Kim | H01L 27/3251 313/504 |
| 8,810,130 B2 * | 8/2014 | Fukunaga | H01L 51/0097 313/506 |
| 2003/0071956 A1 | 4/2003 | Sasaki et al. | |
| 2005/0098901 A1 | 5/2005 | Chang et al. | |
| 2011/0037729 A1 | 2/2011 | Cho et al. | |
| 2011/0193475 A1 | 8/2011 | Kim | |
| 2013/0113734 A1 | 5/2013 | Cho et al. | |
| 2013/0181923 A1 | 7/2013 | Chen et al. | |
| 2014/0193934 A1 | 7/2014 | Kim | |
| 2015/0115293 A1 | 4/2015 | Wu et al. | |
| 2015/0380467 A1 * | 12/2015 | Su | H01L 27/323 257/40 |
| 2017/0147112 A1 | 5/2017 | Wang et al. | |
| 2018/0013086 A1 * | 1/2018 | Chou | G02F 1/1345 |

FOREIGN PATENT DOCUMENTS

| | | |
|---|---|---|
| CN | 101398572 A | 4/2009 |
| CN | 102375264 A | 3/2012 |
| CN | 104238201 A | 12/2014 |
| CN | 104915084 A | 9/2015 |
| JP | 2006215226 A | 8/2006 |
| TW | I267993 B | 12/2006 |

* cited by examiner

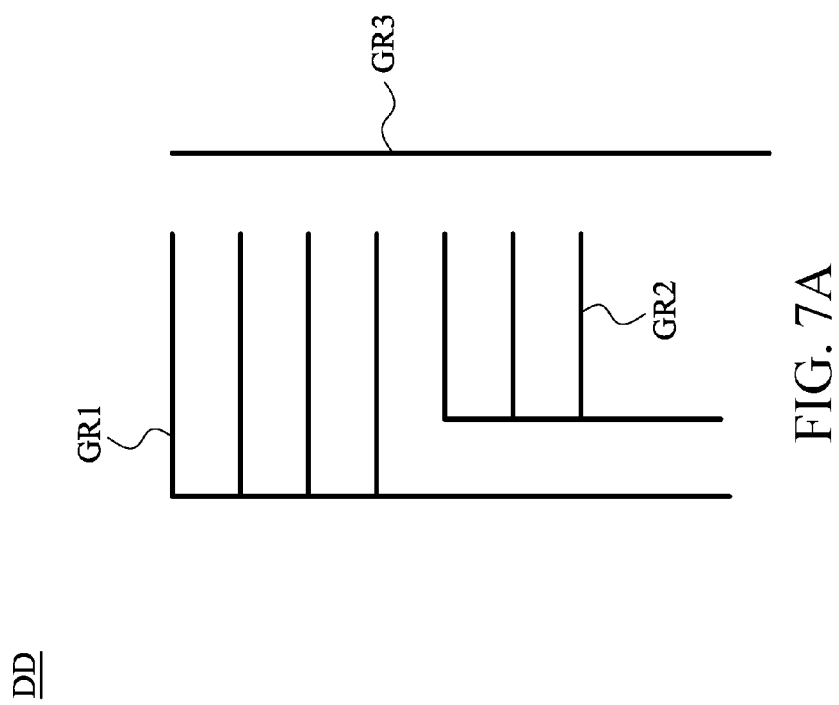

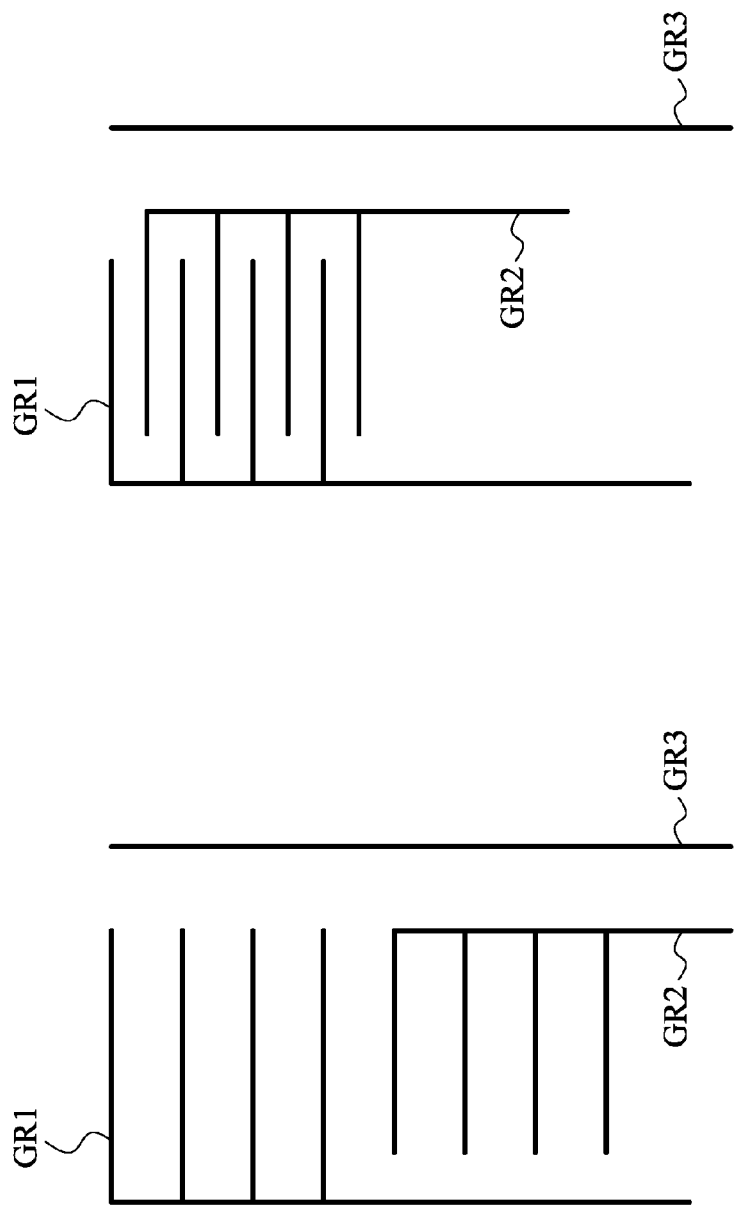

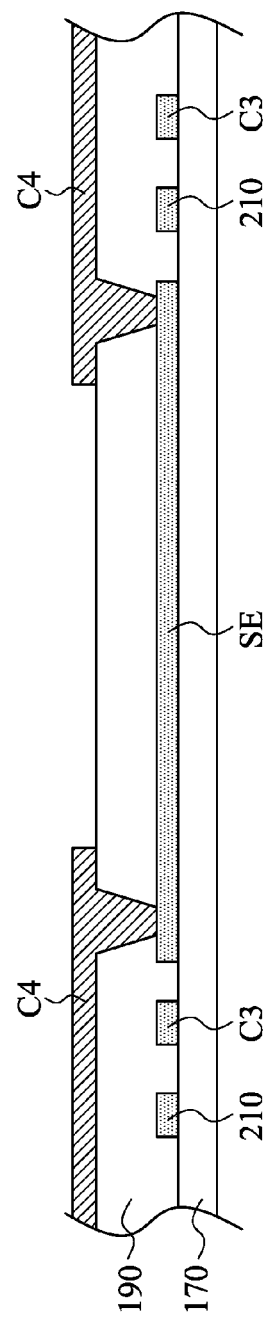

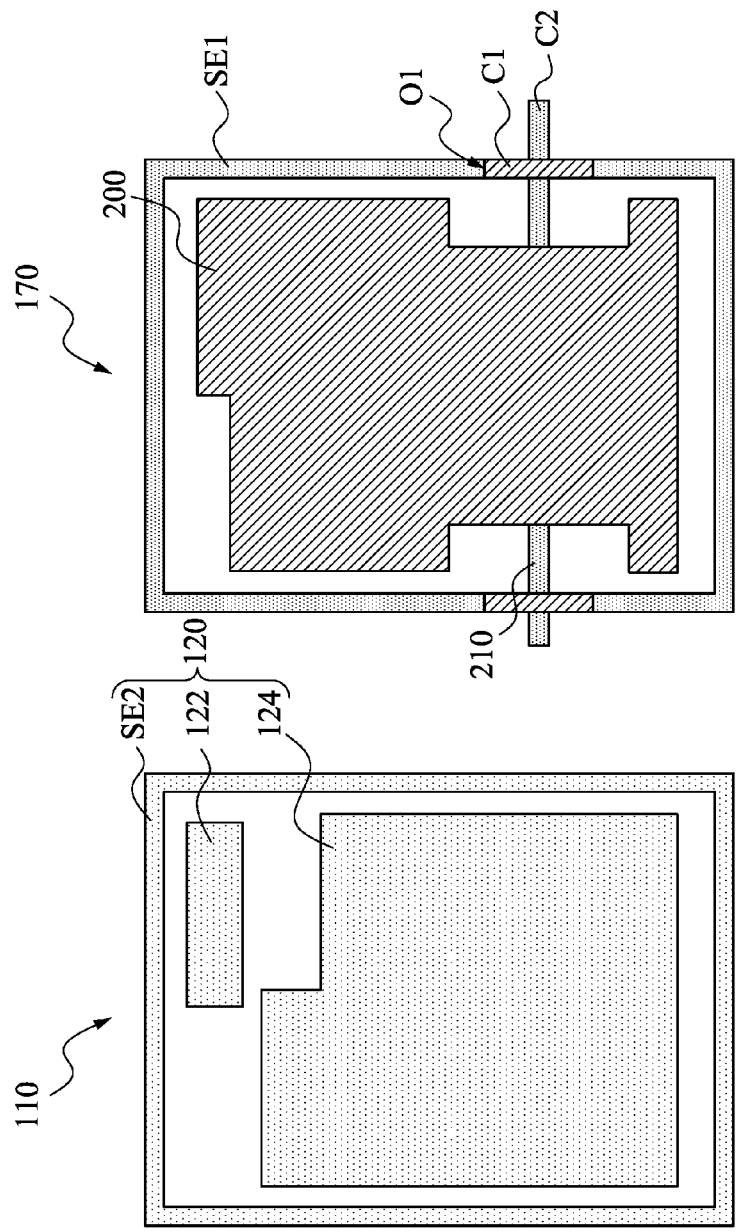

DISPLAY PANEL

CROSS-REFERENCE TO RELATED PATENT APPLICATION

This application claims the benefit of priority to Taiwan Patent Application No. 105121780, filed Jul. 11, 2016. The entire content of the above identified application is incorporated herein by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD

The present disclosure relates to a display panel.

BACKGROUND

In various flat-panel displays, organic light emitting displays (OLED) are expected to become the mainstream of next-generation flat-panel displays because of advantages such as a wide viewing angle, a desirable chromatic contrast effect, a high speed of response, and a low cost.

There are various types of OLEDs, for example, a top emission type, a bottom emission type or a double-sided emission type. To keep a needed storage capacitor, a sufficient area usually needs to be reserved. For a bottom emission type display and a double-sided emission type display, when a storage capacitor is disposed, an effective light emitting area (effective display area) becomes very small, resulting in a problem of a relatively small aperture ratio. In addition, to design an extra touch sensing element inside an OLED, a process becomes more complex, and a problem that an aperture ratio becomes smaller also occurs.

SUMMARY

At least one of the embodiments of the present disclosure provides a subpixel of a display panel. It is designed that a capacitor dielectric layer is provided inside the subpixel, so as to increase an area for a storage capacitor, that is, a storage capacitor element (solid state) is located between two substrates, and increase an aperture ratio. In one of the embodiments, a self-capacitance or mutual-capacitance sensing electrode is designed, and the sensing electrode and a patterned conductive layer inside the subpixel are formed at the same time, so as to provide the subpixel with a sensing (for example, touch control) function and a display function, and to simplify process steps to reduce a cost. In addition, it may be designed that the sensing electrode is located near a wire, to prevent a light emitting area from being affected.

An aspect of the present disclosure provides a display panel, having a first substrate and a second substrate disposed on the first substrate. The display panel includes a plurality of subpixels, where at least one of the subpixels includes a data line, a scan line, a power line, a switch element, a driving element, a passivation layer, a patterned electrode layer, an electroluminescent layer, a counter electrode, a conductive bump, an upper capacitor electrode, and a capacitor dielectric layer. The switch element is disposed on the first substrate, and includes a first end, a second end, and a first gate. The first end is electrically connected to the data line that extends in a first direction, the first gate is electrically connected to the scan line that extends in a second direction, and the first direction is not parallel to the second direction. The driving element is disposed on the first substrate, and includes a first end, a second end, and a second gate. The first end is electrically connected to the power line, the second gate is electrically connected to the second end of the switch element, and the power line is electrically connected to a first voltage source. The passivation layer is disposed on the first substrate, and covers the scan line, the data line, the power line, the switch element, and the driving element. The passivation layer includes a first contact hole and a second contact hole. The patterned electrode layer is disposed on the passivation layer of the first substrate. The patterned electrode layer includes a first capacitor electrode and a pixel electrode separated from the first capacitor electrode. The pixel electrode is electrically connected to the second end of the driving element via the first contact hole. The first capacitor electrode is electrically connected to the second end of the switch element via the second contact hole. The electroluminescent layer is located on the pixel electrode of the first substrate. The counter electrode is disposed on the electroluminescent layer of the first substrate and is electrically connected to a second voltage source, where the second voltage source is different from the first voltage source. The conductive bump is protrusively disposed on the first capacitor electrode of the first substrate, where the conductive bump includes a conductive material. The upper capacitor electrode is disposed on an inner surface of the second substrate. The capacitor dielectric layer covers the upper capacitor electrode of the second substrate, where the conductive bump, the capacitor dielectric layer, and the upper capacitor electrode form a storage capacitor.

In one of the embodiments of the present disclosure, the subpixel further includes a second capacitor electrode, disposed on the capacitor dielectric layer of the second substrate and located between the capacitor dielectric layer and the conductive bump, where two opposite surfaces of the second capacitor electrode are respectively in contact with the capacitor dielectric layer and the conductive bump, and the conductive bump, the capacitor dielectric layer, the second capacitor electrode, and the upper capacitor electrode form the storage capacitor.

In one of the embodiments of the present disclosure, a lower surface of the second capacitor electrode has a concave first portion and a protrusive second portion located on at least one side of the first portion, where a top portion of the conductive bump is corresponding to the first portion on the lower surface of the second capacitor electrode.

In one of the embodiments of the present disclosure, each subpixel has a light emitting area and a non-light emitting area at least disposed on a side of the light emitting area, the first capacitor electrode is located in the non-light emitting area, the conductive bump includes a bump and a third capacitor electrode. The bump is located on the first capacitor electrode. The third capacitor electrode at least covers the bump and extends and is connected to the first capacitor electrode.

In one of the embodiments of the present disclosure, the bump has at least one opening, and the third capacitor electrode is electrically connected to the first capacitor electrode through the opening.

In one of the embodiments of the present disclosure, the display panel further includes a bank, disposed on the passivation layer and having a first opening and a second opening, where the first opening does not cover at least a part of the first capacitor electrode, the second opening does not cover at least a part of the pixel electrode, and the electroluminescent layer and the counter electrode are located in the second opening.

In one of the embodiments of the present disclosure, a thickness of the conductive bump is greater than a thickness of the bank.

In one of the embodiments of the present disclosure, each subpixel has a light emitting area corresponding to the electroluminescent layer and a non-light emitting area at least disposed on a side of the light emitting area, and the display panel has at least two first sensing electrode regions and at least two second sensing electrode regions separated from the first sensing electrode regions, where the display panel further includes a plurality of sensing electrodes, respectively disposed on subpixels of the first sensing electrode regions and the second sensing electrode regions on the second substrate, the sensing electrode of each subpixel is partially overlapped with the non-light emitting area, and the sensing electrodes in the first sensing electrode regions and the sensing electrodes in the second sensing electrode regions are separated.

In one of the embodiments of the present disclosure, the display panel further includes at least one first connection electrode, disposed on the second substrate, where the first connection electrode is adapted to connect upper capacitor electrodes of two adjacent subpixels, and the first connection electrode and the sensing electrode are separated and partially overlapped. Each subpixel of the first sensing electrode regions and the second sensing electrode regions disposed on the second substrate further includes a second capacitor electrode, disposed on the second substrate and located between the capacitor dielectric layer and the conductive bump, where the second capacitor electrode and the upper capacitor electrode are at least partially overlapped.

In one of the embodiments of the present disclosure, the first sensing electrode regions and the second sensing electrode regions are respectively arranged in different extending directions, where the extending directions are interlaced with each other. The display panel has at least one first bridge electrode region and at least one the second bridge electrode region adjacent to the first bridge electrode region, the first bridge electrode region is located between the first sensing electrode region and the second bridge electrode region, and the second bridge electrode region is located in an interlaced position between the extending directions of the first sensing electrode regions and the second sensing electrode regions, where the display panel further includes a second connection electrode and a third connection electrode. The second connection electrode is disposed on the second substrate, and located at each subpixel of the first bridge electrode region and the second bridge electrode region, so as to connect the sensing electrodes located in the first sensing electrode regions. The third connection electrode is disposed on the second substrate, and is located at each subpixel of the second bridge electrode region, so as to connect the sensing electrodes located in the second sensing electrode regions, where the second connection electrode and the third connection electrode are separated and interlaced.

In one of the embodiments of the present disclosure, the second connection electrode includes at least one first sub-electrode segment and at least one second sub-electrode segment. The first sub-electrode segment is located between two adjacent subpixels in the first bridge electrode region, where the first sub-electrode segment and the sensing electrode located in the first bridge electrode region are partially overlapped and connected. The second sub-electrode segment is connected to the first sub-electrode segment.

In one of the embodiments of the present disclosure, each subpixel has a light emitting area corresponding to the electroluminescent layer and a non-light emitting area at least disposed on a side of the light emitting area, and the display panel has at least two first sensing electrode regions and at least two second sensing electrode regions separated from the first sensing electrode regions, where the display panel further includes a plurality of sensing electrodes and at least one first connection electrode. The sensing electrodes are respectively disposed in the subpixels of the first sensing electrode regions and the second sensing electrode regions on the second substrate, and the sensing electrode is partially overlapped with the light emitting area in each subpixel, where the sensing electrodes in the first sensing electrode regions and the sensing electrodes in the second sensing electrode regions are separated. The first connection electrode is disposed on the second substrate, where the first connection electrode connects sensing electrodes of two adjacent subpixels.

In one of the embodiments of the present disclosure, the upper capacitor electrode is partially overlapped with the non-light emitting area, and the subpixel further includes a second capacitor electrode and at least one second connection electrode. The second capacitor electrode is disposed on the second substrate and located between the capacitor dielectric layer and the conductive bump, where the second capacitor electrode is partially overlapped with the upper capacitor electrode. The second connection electrode is disposed on the second substrate, where the second connection electrode connects upper capacitor electrodes of two adjacent subpixels, and the second connection electrode and the first connection electrode are separated and interlaced.

In one of the embodiments of the present disclosure, the first sensing electrode regions and the second sensing electrode regions are respectively arranged in different extending directions, where the extending directions are interlaced with each other. The display panel has a bridge electrode region located in an interlaced position between the extending directions of the first sensing electrode regions and the second sensing electrode regions, where the display panel further includes a third connection electrode, disposed on the second substrate, and is located in each subpixel of the bridge electrode region, so as to connect the sensing electrodes located in the second sensing electrode regions, and the third connection electrode and the sensing electrode of each subpixel located at the bridge electrode region are separated.

In one of the embodiments of the present disclosure, the first sensing electrode regions and the second sensing electrode regions are respectively arranged in different extending directions, where the extending directions are interlaced with each other. The display panel has a bridge electrode region located in an interlaced position between the extending directions of the first sensing electrode regions and the second sensing electrode regions, where the display panel further includes a plurality of second capacitor electrodes, at least one second connection electrode, and at least one third connection electrode. The second capacitor electrodes are disposed on the second substrate, and are respectively located between the capacitor dielectric layer and the conductive bump in each subpixel area, where the second capacitor electrodes are partially overlapped with the upper capacitor electrode. The second connection electrode is disposed on the second substrate, and is located in each subpixel of the bridge electrode region, so as to electrically connect the sensing electrodes located in the second sensing electrode regions, where the second connection electrode and a sensing electrode of each subpixel located in the bridge electrode region are separated. The third connection electrode is disposed on the second substrate, and is located in the subpixel of the bridge electrode region, so as to connect the second connection electrodes of two adjacent subpixel areas located in each bridge electrode region.

In one of the embodiments of the present disclosure, each subpixel has a light emitting area corresponding to the electroluminescent layer and a non-light emitting area at least disposed on a side of the light emitting area, and the display panel has a plurality of first sensing electrode regions. The patterned electrode layer further includes a sensing electrode, disposed in each subpixel of the first sensing electrode region of the first substrate, and the sensing electrode of each subpixel is partially overlapped with the non-light emitting area, where the sensing electrode of each subpixel at least partially surrounds the pixel electrode and the first capacitor electrode, and the pixel electrode and the first capacitor electrode are separated from the sensing electrode.

In one of the embodiments of the present disclosure, the display panel further includes a bank, disposed on the passivation layer of the first substrate and having a first opening and a second opening, where the first opening does not cover at least a part of the first capacitor electrode, the second opening does not cover at least a part of the pixel electrode, and the electroluminescent layer and the counter electrode are located in the second opening, where the bank covers a sensing electrode.

In one of the embodiments of the present disclosure, the subpixel has a light emitting area corresponding to the electroluminescent layer and a non-light emitting area at least disposed on a side of the light emitting area, and the display panel has a plurality of sensing electrode regions, where the display panel further includes a plurality of sensing electrodes, respectively disposed in the subpixels in the sensing electrode regions of the first substrate, and the sensing electrode of each subpixel is partially overlapped with the non-light emitting area. The sensing electrode of each subpixel at least partially surrounds the counter electrode, and the pixel electrode, the counter electrode, and the first capacitor electrode are all separated from the sensing electrode.

In one of the embodiments of the present disclosure, the display panel further includes at least one first connection electrode, respectively disposed between two adjacent subpixels in each sensing electrode region, so as to connect the counter electrodes of the subpixels, and the pixel electrode, the sensing electrode, and the first capacitor electrode of each subpixel are all separated from the first connection electrode.

In one of the embodiments of the present disclosure, the display panel further includes a bank, disposed on the passivation layer of the first substrate and having a first opening and a second opening, where the first opening does not cover at least a part of the first capacitor electrode, the second opening does not cover at least a part of the pixel electrode, and the electroluminescent layer and the counter electrode are located in the second opening, where the sensing electrode is disposed on the bank, and the bank covers the first connection electrode.

In one of the embodiments of the present disclosure, the subpixel has a light emitting area corresponding to the electroluminescent layer and a non-light emitting area at least disposed on a side of the light emitting area, and the display panel has at least one second sensing electrode region that is interlaced with and separated from the first sensing electrode regions, where the patterned electrode layer further includes at least one first sensing electrode, disposed at and connected to each subpixel of the first sensing electrode region of the first substrate, and the first sensing electrode is partially overlapped with the non-light emitting area. The sensing electrode of each subpixel at least partially surrounds and is separated from the pixel electrode and the first capacitor electrode, where the display panel further includes a bank and a plurality of second sensing electrodes. The bank is disposed on the passivation layer of the first substrate and has a first opening and a second opening, the first opening does not cover at least a part of the first capacitor electrode, the second opening does not cover at least a part of the pixel electrode, and the electroluminescent layer and the counter electrode are located in the second opening. The bank covers the first sensing electrode. The second sensing electrodes are respectively disposed on and are connected to each subpixel of the second sensing electrode region of the first substrate, and the second sensing electrodes are partially overlapped with the non-light emitting area, where the second sensing electrodes are disposed on the bank and at least partially surround the counter electrode, the counter electrode of each subpixel is separated from the second sensing electrodes, and the first sensing electrode is separated from the second sensing electrodes.

In one of the embodiments of the present disclosure, the first sensing electrode regions and the second sensing electrode region are respectively arranged in different extending directions, and are interlaced with each other to have at least one interlaced area, and the first and second sensing electrodes are at least partially overlapped in the interlaced area, where the display panel further includes at least one first connection electrode and at least one second connection electrode. The first connection electrode is disposed at each subpixel of the first substrate, so as to connect the second sensing electrodes of each subpixel. The second connection electrode is disposed at each subpixel of the first substrate, the second connection electrode is located on the bank and is adapted to connect counter electrodes of two adjacent subpixels in the interlaced area, and the first connection electrode and the second connection electrode are interlaced with each other.

in one of the embodiments of the present disclosure, the bank further covers a part of the first connection electrode.

In one of the embodiments of the present disclosure, each subpixel has a light emitting area corresponding to the electroluminescent layer and a non-light emitting area at least disposed on a side of the light emitting area, and the display panel has at least one first sensing electrode region and at least one second sensing electrode region that is interlaced with and separated from the first sensing electrode region, where the display panel further includes a plurality of first sensing electrodes and at least one second sensing electrode. The first sensing electrodes are respectively disposed at and are connected to each subpixel of the first sensing electrode region of the second substrate, and the first sensing electrodes is partially overlapped with the non-light emitting area, where a capacitor upper electrode of each subpixel is separated from the first sensing electrodes. A plurality of second sensing electrodes are disposed at and are connected to each subpixel of the second sensing electrode region of the first substrate, and the second sensing electrodes are partially overlapped with the non-light emitting area, where the second sensing electrodes of each subpixel at least partially surround the pixel electrode and the first capacitor electrode, and the pixel electrode and the first capacitor electrode are both separated from the second sensing electrodes.

In one of the embodiments of the present disclosure, the display panel further includes a bank, disposed on the passivation layer of the first substrate and having a first opening and a second opening, where the first opening does not cover at least a part of the first capacitor electrode, the second opening does not cover at least a part of the pixel electrode, and the electroluminescent layer and the counter electrode are located in the second opening.

In one of the embodiments of the present disclosure, the first sensing electrode region and the second sensing electrode region are respectively arranged in different extending directions, and are interlaced with each other to have at least one interlaced area, and the first and second sensing electrodes are at least partially overlapped in the interlaced area, where the display panel further includes at least one first connection electrode and at least one second connection electrode. The first connection electrode is disposed at each subpixel of the second substrate, so as to connect the first sensing electrodes of each subpixel, where the second capacitor electrode of each subpixel is separated from each first connection electrode where the second capacitor electrode is located. The second connection electrode is disposed at each subpixel of the second substrate and connects capacitor upper electrodes of two adjacent subpixels, and the first connection electrode and the second connection electrode are interlaced.

In one of the embodiments of the present disclosure, the bank covers the second sensing electrodes, the capacitor dielectric layer covers the first sensing electrodes, the second connection electrode, and the upper capacitor electrode, and the first connection electrode is located on the capacitor dielectric layer.

In one of the embodiments of the present disclosure, the display panel further includes at least one third connection electrode, disposed at each subpixel of the first substrate and connecting counter electrodes of two adjacent subpixels, the pixel electrode and the third connection electrode are separated, and the third connection electrode and the second sensing electrodes are interlaced.

In one of the embodiments of the present disclosure, the second sensing electrodes are located on a bank, the bank covers a part of the third connection electrode, the capacitor dielectric layer covers the first sensing electrodes, the second connection electrode, and the upper capacitor electrode, and the first connection electrode is located on the capacitor dielectric layer.

In one of the embodiments of the present disclosure, the first sensing electrode region and the second sensing electrode region are respectively arranged in different extending directions, and are interlaced with each other to have at least one interlaced area, and the first and second sensing electrodes are at least partially overlapped in the interlaced area, where the first sensing electrodes are located on the capacitor dielectric layer, and the bank covers a part of the second sensing electrodes.

In one of the embodiments of the present disclosure, the first sensing electrode region and the second sensing electrode region are respectively arranged in different extending directions, and are interlaced with each other to have at least one interlaced area, and the first and second sensing electrodes are at least partially overlapped in the interlaced area, where the display panel further includes at least one first connection electrode and at least one second connection electrode. The first connection electrode is disposed at each subpixel of the first substrate, so as to connect the first sensing electrodes of each subpixel, where the first capacitor electrode of each subpixel is separated from each first connection electrode where the first capacitor electrode is located. The second connection electrode is disposed at each subpixel of the first substrate and connects counter electrodes of two adjacent subpixels, and the first connection electrode and the second connection electrode are interlaced.

In one of the embodiments of the present disclosure, the first sensing electrodes are located on the capacitor dielectric layer, the second sensing electrodes and the second connection electrode are located on the bank, and the bank covers the first connection electrode.

An aspect of the present disclosure provides a display panel, including a substrate, an upper capacitor electrode, a capacitor dielectric layer, a first sensing electrode, a counter substrate, a conductive bump, an electroluminescent layer, and a counter electrode. The upper capacitor electrode is disposed on an inner surface of the substrate. The capacitor dielectric layer covers the upper capacitor electrode. The first sensing electrode is disposed on the inner surface of the substrate. The counter substrate is disposed opposite the substrate, where the counter substrate has at least one a pixel electrode and a first capacitor electrode separated from the pixel electrode, the pixel electrode is connected to an end of a driving element, a gate of the driving element is electrically connected to an end of a switch element, and the first capacitor electrode is connected to the end of the switch element. The conductive bump is disposed on the first capacitor electrode of the counter substrate and is partially overlapped with the upper capacitor electrode in a vertical projection direction. The electroluminescent layer is sandwiched between the substrate and the counter substrate, and is located on the pixel electrode. The counter electrode is disposed on the electroluminescent layer.

In one of the embodiments of the present disclosure, the first sensing electrode surrounds the upper capacitor electrode.

In one of the embodiments of the present disclosure, the display panel further includes a first connection electrode and a second capacitor electrode. The first connection electrode is disposed on an inner surface of the substrate and is electrically connected to the upper capacitor electrode or the first sensing electrode. The second capacitor electrode is disposed on the inner surface of the substrate and is located on a side, facing and close to the counter substrate, of the capacitor dielectric layer.

In one of the embodiments of the present disclosure, the display panel further includes a second sensing electrode, disposed on the inner surface of the substrate or an inner surface of the counter substrate, where the second sensing electrode and the first sensing electrode are interlaced.

In one of the embodiments of the present disclosure, the upper capacitor electrode surrounds the first sensing electrode.

An aspect of the present disclosure provides a display panel, including a substrate, an upper capacitor electrode, a capacitor dielectric layer, a first sensing electrode, a patterned electrode layer, a counter substrate, a conductive bump, an electroluminescent layer, and a counter electrode. The upper capacitor electrode is disposed on an inner surface of the substrate. The capacitor dielectric layer covers the upper capacitor electrode. The patterned electrode layer is disposed on an inner surface of the counter substrate, where the patterned electrode layer includes a pixel electrode and a first capacitor electrode separated from the pixel electrode, the pixel electrode is connected to an end of a driving element, a gate of the driving element is electrically connected to an end of a switch element, and the first capacitor electrode is connected to the end of the switch element. The conductive bump is disposed on the first capacitor electrode of the counter substrate and is partially overlapped with the upper capacitor electrode in a vertical projection direction. The electroluminescent layer is located on the pixel electrode. The counter electrode is disposed on the electroluminescent layer. The first sensing electrode is disposed on the inner surface of the counter substrate.

In one of the embodiments of the present disclosure, the patterned electrode layer further includes a first connection electrode, disposed on the counter substrate and electrically connected to the counter electrode.

In one of the embodiments of the present disclosure, the display panel further includes a second sensing electrode, disposed on the counter substrate and interlaced with the first sensing electrode.

In one of the embodiments of the present disclosure, the patterned electrode layer further includes a second connection electrode, electrically connected to the second sensing electrode.

In one of the embodiments of the present disclosure, the display panel further includes a bank, disposed on the patterned electrode layer of the counter substrate and having a first opening and a second opening, where the first opening does not cover at least a part of the first capacitor electrode, the second opening does not cover at least a part of the pixel electrode, and the electroluminescent layer and the counter electrode are located in the second opening.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

FIG. 7A is a schematic top view of a display panel according to a fourth embodiment of the present disclosure;

FIG. 7E and FIG. 7F are schematic top views of a display panel according to some embodiments of the present disclosure;

FIG. 10D is a schematic cross-sectional view along a line 10D-10D in FIG. 10A;

FIG. 14C is a schematic top view of some elements of a first substrate and some elements of a second substrate of the subpixel of the display panel in FIG. 14B;

DETAILED DESCRIPTION

Some of the embodiments of the present disclosure are disclosed below with reference to the accompanying drawings. For clear description, many details in practice will be described together in the following description. However, it should be understood that these details in practice should not be used to limit the present disclosure. That is, in one of the embodiments of the present disclosure, these details in practice are not essential. In addition, to simplify the accompanying drawings, some conventional structures and elements are shown in a simple schematic manner in the accompanying drawings. Further, the term "connect" or "electrically connected," as used herein, refers to the direct or indirect physical or electrical contact between or among two or more components, or the mutual operation or action of two or more components.

Figures 1A, 1B:
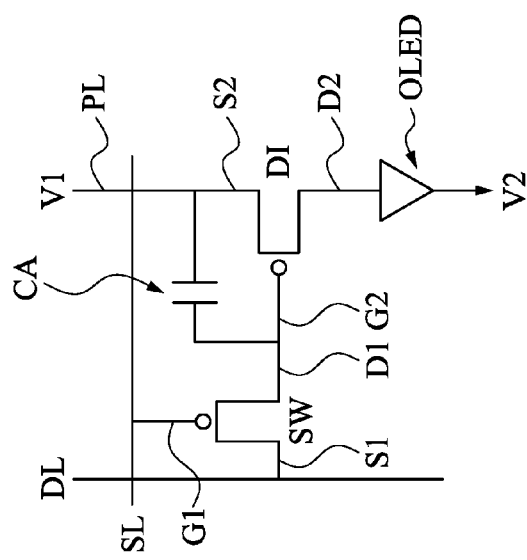
FIG. 1A is an equivalent circuit diagram of a subpixel of a display panel according to some embodiments of the present disclosure.
FIG. 1B is an equivalent circuit diagram of a subpixel of a display panel according to some embodiments of the present disclosure.

In one of the embodiments of the present disclosure, a display panel includes a plurality of subpixels 100. FIG. 1A is an equivalent circuit diagram of a subpixel 100 of the display panel according to some embodiments of the present disclosure. As shown in FIG. 1A, the subpixel 100 in one of the embodiments of the present disclosure at least includes a data line DL, a scan line SL, a power line PL, a switch element SW, a driving element DI, a capacitor element CA, and an electroluminescent element OLED. It should be noted that according to a design requirement, the subpixel 100 of the present disclosure may also include another thin film transistor, and there may be a plurality of capacitor elements CA.

In one of the embodiments of the present disclosure, the switch element SW includes two ends S1 and D1 and a first gate G1. One of the ends S1 and D1 is electrically connected to the data line DL, and the first gate G1 is electrically connected to the scan line SL. The driving element DI includes two ends S2 and D2 and a second gate G2. One of the ends S2 and D2 is electrically connected to the power line PL, and the other one of the ends S2 and D2 is electrically connected to the electroluminescent element OLED, and the second gate G2 is electrically connected to the other one of the ends S1 and D1 of the switch element SW. An end of the capacitor element CA is electrically connected to the second gate G2, and the other end of the capacitor element CA is electrically connected to the power line PL.

In one of the embodiments of the present disclosure, the capacitor element CA is a storage capacitor (solid state storage capacitor). When an electric signal passes through the switch element SW and is transferred to the second gate G2, the capacitor element CA may keep a voltage of the second gate G2 stable.

Herein, the switch element SW and the driving element DI may be a thin film transistor, and a type of the thin film transistor includes a bottom gate type, a top gate type, or another suitable type. In FIG. 1A of the present disclosure, for example, the switch element SW and the driving element DI are P-type thin film transistors. However, in an actual configuration, the switch element SW and the driving element DI may also be N-type thin film transistors shown as the switch element SW and the driving element DI in FIG. 1B to design a pixel circuit. Alternatively, one of the switch element SW and the driving element DI is a P-type thin film transistor, and the other one is an N-type thin film transistor. A semiconductor layer of the thin film transistor may have a single-layer or multiple-layer structure, and a material of the semiconductor layer includes amorphous silicon, polycrystalline silicon, microcrystalline silicon, monocrystalline silicon, a metal oxide semiconductor material, a metal nitride semiconductor material, a metal oxynitride semiconductor material, an organic semiconductor material or another appropriate material.

Figure 2A:
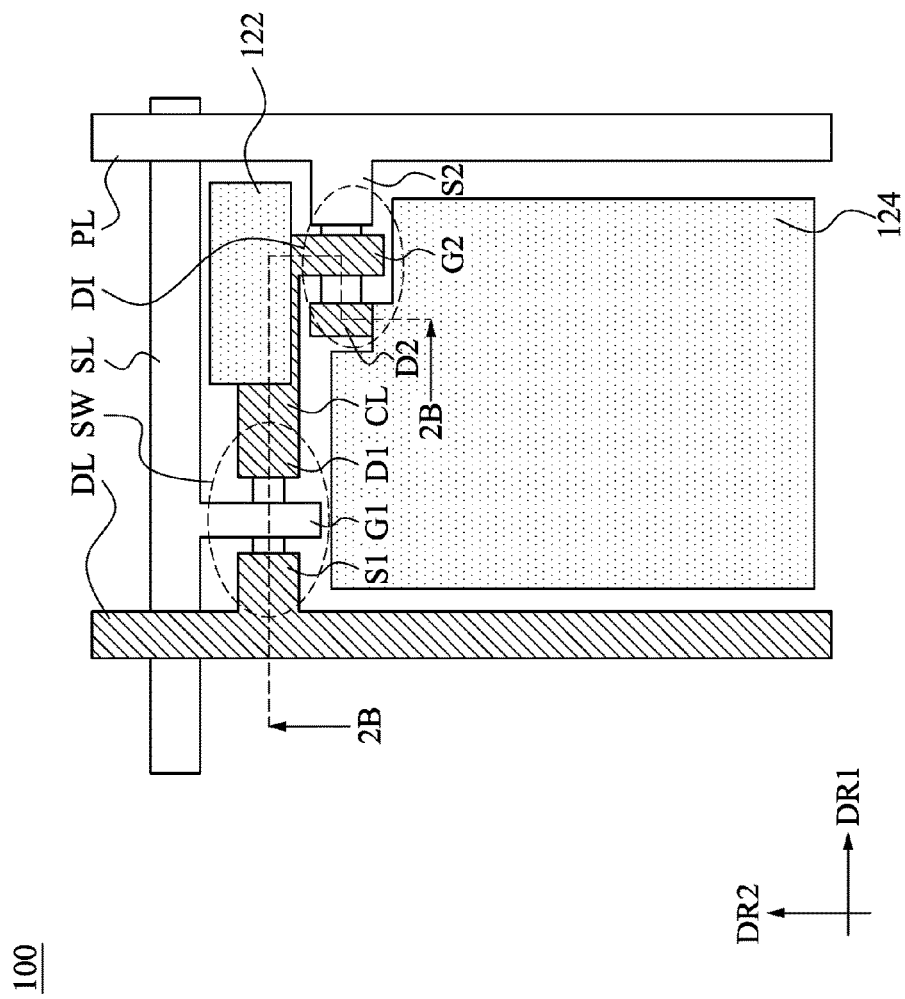
FIG. 2A is a top view of a subpixel of a display panel according to a first embodiment of the present disclosure.
Figure 2B:
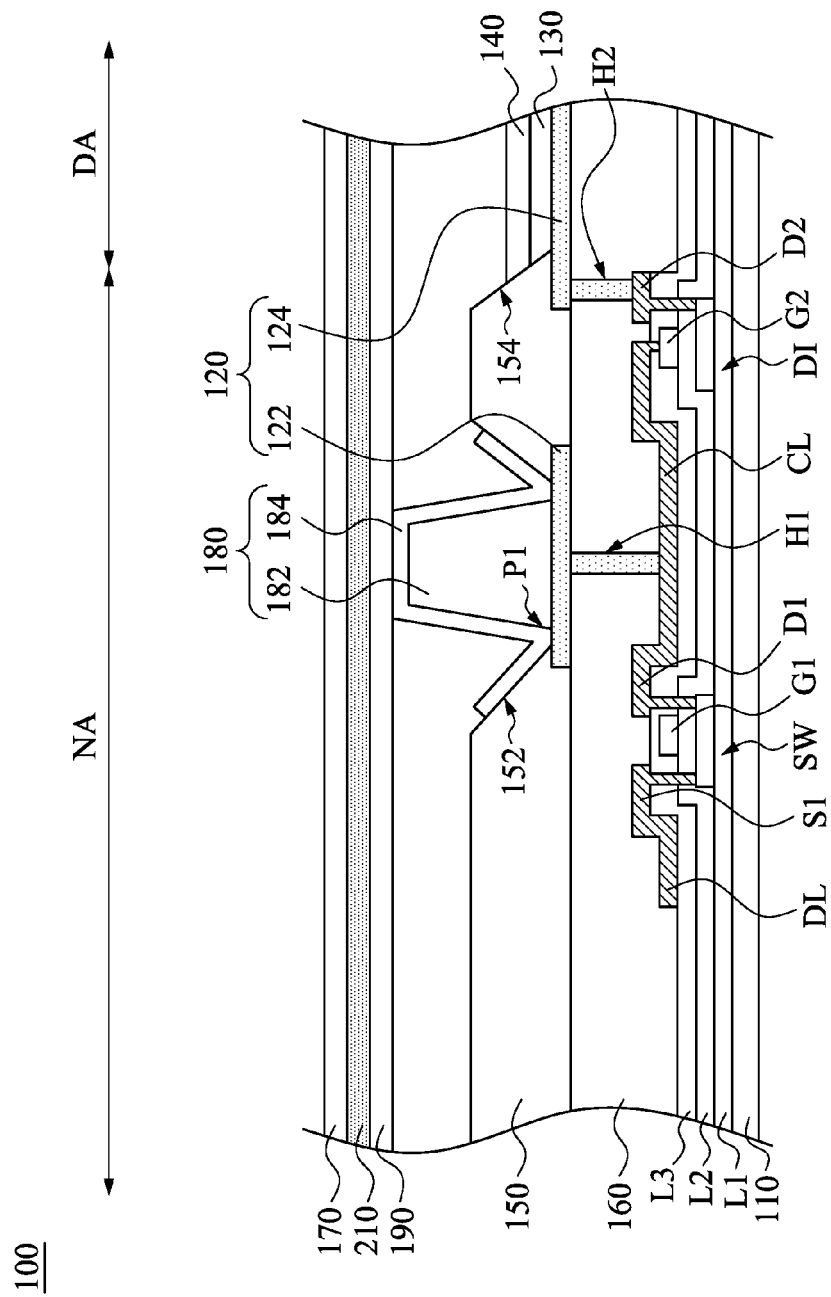
FIG. 2B is a cross-sectional view of a line 2B-2B according to FIG. 2A.

FIG. 2A is a schematic top view of a subpixel 100 of a display panel according to a first embodiment of the present disclosure. FIG. 2B is a schematic cross-sectional view according to a line 2B-2B in FIG. 2A. The display panel has a first substrate (or referred to as a counter substrate) 110 and a second substrate (or referred to as a substrate) 170 disposed on the first substrate 110. Referring to FIG. 1A, FIG. 2A, and FIG. 2B together, in one of the embodiments of the present disclosure, at least some of the subpixels 100 at least include a data line DL, a scan line SL, a power line PL, a switch element SW, a driving element DI, a patterned electrode layer 120, an electroluminescent layer 130, a counter electrode 140, a passivation layer 160, a conductive bump 180, an upper capacitor electrode 210, and a capacitor dielectric layer 190.

The switch element SW, the driving element DI, the data line DL, the scan line SL, and the power line PL are disposed on the first substrate 110. The scan line SL extends in a first direction DR1, and the data line DL extends in a second direction DR2, where the second direction DR2 is not parallel to the first direction DR1, that is, the first direction DR1 and the second direction DR2 are interlaced. In one of the embodiments of the present disclosure, for example, the first direction DR1 and the second direction DR2 are set to be substantially perpendicular to each other; however, the present disclosure is not limited thereto. The power line PL is electrically connected to a first voltage source V1. In this embodiment, a second gate G2 of the driving element DI is electrically connected to an end D1 of the switch element SW via a connection wire CL. A configuration of the switch element SW and the driving element DI is substantially as discussed above in FIG. 1A or FIG. 1B, and is no longer elaborated herein. For example, the switch element SW and the driving element DI in FIG. 2B are top-gate-type thin film transistors, and the rest types are described above. For simplification, for example, a top-gate-type thin film transistor includes a semiconductor layer (not shown), the first gate G1/the second gate G2 are disposed on the semiconductor layer (not shown), a gate insulation layer L2 is sandwiched between the semiconductor layer (not shown) and the first gate G1/the second gate G2. An inter-level dielectric layer L3 covers the first gate G1/the second gate G2 and the gate insulation layer L2, and two ends S1 and D1/S2 and D2 of the thin film transistor are respectively connected to the semiconductor layer (not shown). A bottom-gate-type thin film transistor includes a first gate G1/a second gate G2, where a semiconductor layer (not shown) is disposed on the first gate G1/the second gate G2, the gate insulation layer L2 is sandwiched between the semiconductor layer (not shown) and the first gate G1/the second gate G2, and two ends S1 and D1/S2 and D2 of the thin film transistor are respectively connected to the semiconductor layer (not shown). A buffer layer L1 may be selectively disposed on an inner surface of the first substrate 110, and is sandwiched between the inner surface of the first substrate 110 and the gate insulation layer L2. For the gate insulation layer L2, the inter-level dielectric layer L3, and buffer layer L1, a material of a subsequent passivation layer 160 may be selected, and at least two of the foregoing may be substantially the same or different.

The passivation layer 160 is disposed on the first substrate 110, and covers the scan line SL, the data line DL, the power line PL, the switch element SW, the driving element DI, the connection wire CL, and the first substrate 110, and the passivation layer 160 has a first contact hole H1 and a second contact hole H2. The passivation layer 160 may have a single-layer or multiple-layer structure, and a material of the passivation layer may be an inorganic material (for example, silicon oxide, silicon nitride, silicon nitroxide or another suitable material), an organic material (for example, a photoresist, polyimide (PI), benzocyclobutene (BCB) or another suitable material) or another suitable material.

The patterned electrode layer 120 is disposed on the passivation layer 160 of the first substrate 110. The patterned electrode layer 120 includes a first capacitor electrode 122 and a pixel electrode 124 separated from the first capacitor electrode 122. The pixel electrode 124 is electrically connected to an end D2 of the driving element DI via the second contact hole H2, and the first capacitor electrode 122 is electrically connected to the connection wire CL via the first contact hole H1. The first capacitor electrode 122 and the connection wire CL are at least partially overlapped, so as to be electrically connected by the first contact hole H1. The first capacitor electrode 122 is not overlapped with (in a direction of a vertical projection on the first substrate) the semiconductor layer (not shown, as shown in FIG. 2A or FIG. 2B) of the driving element DI and the switch element SW, so as to reduce a coupling effect of the first capacitor electrode 122 on the driving element DI and the switch element SW. The connection wire CL is located between the driving element DI and the switch element SW, and is made of a conductor material, for example, metal, alloy, an ohm contact semiconductor layer (for example, a heavily-doped semiconductor layer). A resistance of the connection wire CL is less than that of the semiconductor layer itself (for example, an intrinsic layer or a lightly-doped semiconductor layer), or another suitable material, or a combination of the foregoing.

The patterned electrode layer 120 may have a single-layer or multiple-layer structure, and a material of the patterned electrode layer 120 includes a transparent conductive material (for example, indium tin oxide, indium zinc oxide, zinc oxide, a carbon nanotube, indium gallium zinc oxide, or another suitable material), a non-transparent conductive material (for example, metal, alloy, or another suitable material), or another suitable material. For example, according to that the display panel is a bottom emission type (that is, light leaves from only an outer surface of the first substrate 110) or a double-sided emission type (that is, light respectively leaves from outer surfaces of the first substrate 110 and the second substrate 170), the patterned electrode layer 120 is made of a transparent conductive material. According to that the display panel is a top emission type (that is, light leaves from only an outer surface of the second substrate 170), the patterned electrode layer 120 is made of a non-transparent conductive material.

In one of the embodiments of the present disclosure, the display panel may selectively further includes a bank (or namely dam) 150, where the bank 150 is disposed on the passivation layer 160 of the first substrate 110. The bank 150 may cover a part of the patterned electrode layer 120. The bank 150 has a first opening 152 and a second opening 154. The first opening 152 does not cover (or namely not shield) at least a part of the first capacitor electrode 122, that is, the first opening 152 uncovers (or referred to as "shows" or "exposes") at least a part of the first capacitor electrode 122. The second opening 154 does not cover at least a part of the pixel electrode 124, that is, the second opening 154 uncovers (or referred to as "shows" or "exposes") at least a part of the pixel electrode 124. In other words, the first opening 152 is vertically projected on the first capacitor electrode 122 (the first substrate), and the first opening 152 and the first capacitor electrode 122 are at least partially overlapped. It may be seen that the first opening 152 is located on at least a part of the first capacitor electrode 122. The second opening 154 is vertically projected on the pixel electrode 124 (the first substrate) and the second opening 154 and the pixel electrode 124 are at least partially overlapped. It may be seen that the second opening 154 is located on at least a part of the pixel electrode 124. The electroluminescent layer 130 and the counter electrode 140 are located in the second opening 154. Therefore, the bank 150 may make it easy for the electroluminescent layer 130 to be placed inside the second opening 154. In other embodiments, the electroluminescent layer 130 can be covering at least parts of bank 150, for example, the electroluminescent layer 130 is not only on the second opening, but also on at least parts of the bank 150 (such as top and/or one side of the bank 150). The bank 150 may have a single-layer or multiple-layer structure, and a material of the bank 150 may be an inorganic material (for example, silicon oxide, silicon nitride, silicon nitroxide, or another suitable material), an organic material (for example, a photoresist, PI, BCB, or another suitable material), or another suitable material. In an embodiment of the present disclosure, an organic material is used as an example; however, the present disclosure is not limited thereto.

In one of the embodiments of the present disclosure, the electroluminescent layer 130 is located on the pixel electrode 124 of the first substrate 110. The counter electrode 140 is disposed on the electroluminescent layer 130 of the first substrate 110 and is electrically connected to a second voltage source V2 (as shown in FIG. 1A or FIG. 1B). The second voltage source V2 is different from the first voltage source V1. The electroluminescent layer 130 may be formed of an organic light emitting material, an inorganic light emitting material or a combination of the foregoing. In this way, the pixel electrode 124, the electroluminescent layer 130, and the counter electrode 140 together form the foregoing electroluminescent element OLED (for example, referring to FIG. 1A or FIG. 1B). The counter electrode 140 may have a single-layer or multiple-layer structure, and a material of the counter electrode 140 includes a transparent conductive material (for example, indium tin oxide, indium zinc oxide, zinc oxide, carbon nanotube, indium gallium zinc oxide, or another suitable material), a non-transparent conductive material (for example, metal, alloy, or another suitable material), or another suitable material. For example, according to that the display panel is a bottom emission type (that is, light leaves from only an outer surface of the first substrate 110), the counter electrode 140 is made of a non-transparent conductive material. According to that the display panel is a top emission type (that is, light leaves from only an outer surface of the second substrate 170) and a double-sided emission type (that is, light respectively leaves from outer surfaces of the first substrate 110 and the second substrate 170), the counter electrode 140 is made of a transparent conductive material.

In one of the embodiments of the present disclosure, the subpixel 100 has a light emitting area DA corresponding to the electroluminescent layer 130 and a non-light emitting area NA at least disposed on a side of the light emitting area DA. In one of the embodiments, the data line DL, the scan line SL, the power line PL, the switch element SW, and the driving element DI are disposed in the non-light emitting area NA, thereby preventing a display effect from being affected because light cannot be transmitted.

In one of the embodiments of the present disclosure, the conductive bump 180 is protrusively disposed on the first capacitor electrode 122 of the first substrate 110. The conductive bump 180 may include a single-layer or multiple-layer structure, and a material of the conductive bump 180 includes a conductive polymer (for example, metal exists in a molecular formula, an intrinsic conductive polymer, a polymer (for example, conductive glue) mixed with nano-particles or micro-scale particles, or another suitable material), a non-transparent conductive material (for example, metal, alloy, or another suitable material), a transparent conductive material (for example, indium tin oxide, indium zinc oxide, zinc oxide, a carbon nanotube, indium gallium zinc oxide, or another suitable material), or another suitable material. Generally speaking, to increase conductivity of the conductive bump 180, preferably, for a material of the conductive bump 180, a non-transparent conductive material (for example, metal, alloy, or another appropriate material) may be selected. The conductive bump 180 is disposed corresponding to the first capacitor electrode 122 in a vertical projection direction on the first substrate, that is, the conductive bump 180 is on the first capacitor electrode 122, and the conductive bump 180 is overlapped with the first capacitor electrode 122 in the vertical projection direction. For example, when the bank 150 is disposed in the display panel, at least a part of the conductive bump 180 is located in the first opening 152. A thickness (a distance from a bottom surface to a top surface) of the conductive bump 180 is greater than or substantially equal to a thickness (a distance from a bottom surface to a top surface) of the bank 150. That is, a top portion (surface) of the conductive bump 180 is convex from or is substantially flush with a top portion (surface) of the bank 150; however, the present disclosure is not limited thereto.

The upper capacitor electrode 210 is disposed on an inner surface of the second substrate 170, and the capacitor dielectric layer 190 covers the upper capacitor electrode 210. In this embodiment, a surface of the capacitor dielectric layer 190 is in contact with the top portion of the conductive bump 180. The conductive bump 180, the capacitor dielectric layer 190, and the upper capacitor electrode 210 form a storage capacitor, that is, the foregoing capacitor element CA (for example, referring to FIG. 1A or FIG. 1B). The capacitor dielectric layer 190 may have a single-layer or multiple-layer structure, and a material of the capacitor dielectric layer 190 includes a non-self-emission material (that is, non-electroluminescent material), for example, an inorganic material (for example, silicon nitride, silicon oxide, silicon nitroxide, or another suitable material), an organic material (for example, a photoresist, PI, BCB or another suitable material), a light conversion material (for example, a color photoresist, quantum dot/rod or another suitable material), or another suitable material.

In one of the embodiments, the display panel is a top emission type or a double-sided emission type, and the upper capacitor electrode 210 is made of a non-transparent conductive material. The upper capacitor electrode 210 may be not disposed in a light emitting area DA (that is, the upper capacitor electrode 210 is disposed in only a non-light emitting area NA), or the upper capacitor electrode 210 is made of a transparent conductive material in the light emitting area DA while is made of a non-transparent conductive material in the non-light emitting area NA. In this way, a light ray may be emitted from the electroluminescent layer 130 and passes through the capacitor dielectric layer 190 and the outer surface of the second substrate 170, and is output from only the outer surface of the second substrate 170 (a top emission type), or a light ray may be emitted from the electroluminescent layer 130 and respectively passes through the capacitor dielectric layer 190 and the outer surface of the second substrate 170 and is output from the outer surface of the first substrate 110 (a double-sided emission type). The upper capacitor electrode 210 does not affect a light ray inside the light emitting area DA. In one of the embodiments, when the display panel is a top emission type or double-sided emission type and the upper capacitor electrode 210 is made of a transparent conductive material, the upper capacitor electrode 210 may completely cover the second substrate 170 and is disposed in the light emitting area DA and the non-light emitting area NA. In this way, a light ray may be emitted from the electroluminescent layer 130 and respectively output from the outer surface of the first substrate 110 and the outer surface of the second substrate 170 (the double-sided emission type) or is output from only the outer surface of the second substrate 170 (a top emission type).

Alternatively, in one of the embodiments, the display panel is a bottom emission type, and the upper capacitor electrode 210 is made of a non-transparent conductive material, the upper capacitor electrode 210 may completely cover the second substrate 170 and is disposed in the light emitting area DA and the non-light emitting area NA. In this way, after a light ray may be emitted from the electroluminescent layer 130, for example, most of the light passes through the pixel electrode 124, the passivation layer 160, the buffer layer L1, the gate insulation layer L2, the inter-level dielectric layer L3, and the outer surface of the first substrate 110, and is output from only the outer surface of the first substrate 110.

By means of the conductive bump 180, the capacitor dielectric layer 190, and the upper capacitor electrode 210, an interval (or namely gap) between the second substrate 170 and the first substrate 110 can be kept, meanwhile, the capacitor element CA is also formed, so as to keep a stable display effect of the subpixel. Further, the capacitor element CA of the present disclosure involves respectively a related design of the conductive bump 180 on the first substrate 110 and a related design of the upper capacitor electrode 210 on the second substrate 170, so that a bottom-emission or double-sided emission type display panel can be improved. Because a problem of a relatively small aperture ratio raised when a relatively large capacitor element area is designed only on the first substrate 110 is solved, it is seen that the resolution and/or brightness may be increased, for example, may be increased by approximately at least 50%. Further, a layout of the capacitor element CA of the present disclosure may be relatively loose (or namely relatively bigger toler-ance). Moreover, the related design on the second substrate 170 in this embodiment is relatively flat (for example, a thickness difference between the conductive bump and the inner surface of the second substrate 170 does not exist). As compared with that a great thickness variation exists on the second substrate 170 (for example, the thickness difference between the conductive bump and the inner surface of the second substrate 170 exists), in this embodiment, a yield of the display panel can be improved. In another embodiment, a top emission type display panel is also applicable.

In one of the embodiments of the present disclosure, the conductive bump 180 may selectively include a bump 182 and a third capacitor electrode 184. The bump 182 is located in the non-light emitting area NA. The third capacitor electrode 184 at least covers the bump 182 and extends and is connected to the first capacitor electrode 122. In one of the embodiments, preferably, the third capacitor electrode 184 and the counter electrode 140 may be formed by using a same patterned layer, and a material of the patterned layer may be a transparent conductive material or an opaque conductive material according to the foregoing type of the display panel. The third capacitor electrode 184 is separated from the counter electrode 140. The bump 182 may have a single-layer or multiple-layer structure, and a material of the bump 182 includes an insulation material (for example, reference may be made to the foregoing organic material, inorganic material or another suitable material, or the fore-going combination), a conductive material (for example, reference may be made to the foregoing conductive polymer, non-transparent conductive material, transparent conductive material, or another suitable material, or the foregoing combination) or the foregoing combination, or further the bump 182 has a same material as that of the foregoing bank 150 and is formed by using a same patterned layer. More-over, when the bump 182 is made of a non-transparent conductive material or a non-transparent material, the bump 182 is located in only the non-light emitting area NA, and the bump 182 corresponds to the foregoing first capacitor electrode 122, that is, the bump 182 is vertically projected on the first capacitor electrode 122 (or the first substrate), and the bump 182 and the first capacitor electrode 122 are at least partially overlapped.

In this embodiment, a gap P1 is provided between the bump 182 and the bank 150, and the bump 182 and the bank 150 are not directly connected. The third capacitor electrode 184 may be selectively in contact with the bank 150, and the third capacitor electrode 184 is connected to the first capaci-tor electrode 122 through the gap P1; however, the present disclosure is not limited thereto.

Figure 3C:
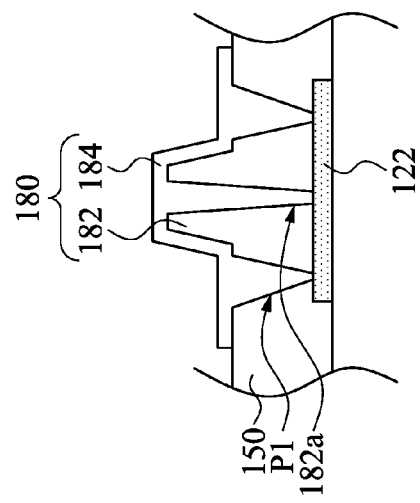
FIG. 3A to FIG. 3C are schematic cross-sectional views of a partial structure of a subpixel of a display panel in some embodiments.
Figure 3B:
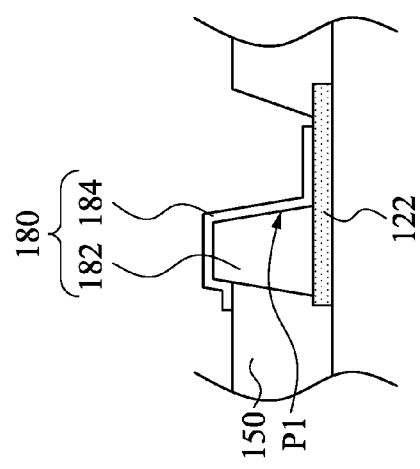
Figure 3A:
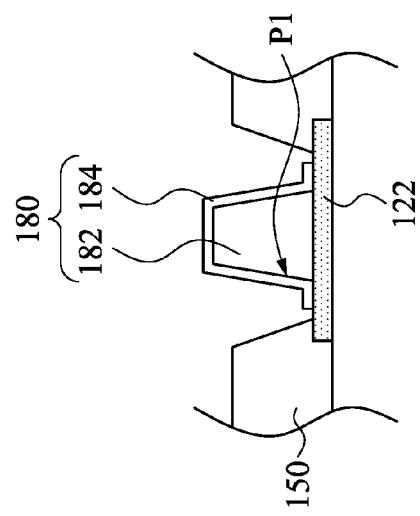

Referring to FIG. 3A to FIG. 3C, FIG. 3A to FIG. 3C are schematic cross-sectional views of a partial structure of a subpixel of a display panel in at least one of the embodi-ments. Referring to FIG. 3A, a gap P1 may exist between a bump 182 and a bank 150, the bump 182 and the bank 150 are not directly connected, a third capacitor electrode 184 may be not in contact with the bank 150, and the third capacitor electrode 184 is connected to a first capacitor electrode 122 through the gap P1. Alternatively, referring to FIG. 3B, in one of the embodiments, the bank 150 may be directly connected at one end of the bump 182, and the gap P1 is kept at another end. The third capacitor electrode 184 is connected to the first capacitor electrode 122 through the gap P1, where the bank 150 may be connected at three ends of the bump 182 at most. As the bump 182 is made of an insulation material, the third capacitor electrode 184 exists. As the bump 182 is made of a conductive material, the third capacitor electrode 184 may be selectively disposed. Fur-ther, referring to FIG. 3C, in one of the embodiments, the bump 182 has at least one opening 182a of which a vertical projection on a first substrate is partially overlapped with the first capacitor electrode 122, that is, the first capacitor electrode 122 is uncovered, and the third capacitor electrode 184 is electrically connected to the first capacitor electrode 122 through the opening 182a. The bump 182 and the bank 150 are connected, so that both the bump 182 and the bank 150 are made of an insulation material, and the third capacitor electrode 184 needs to exist. Therefore, stability of a conductive bump 180 in FIG. 3C is greater than that in FIG. 3B, and the stability of the conductive bump 180 in FIG. 3B is greater than that in FIG. 3A. In FIG. 3A to FIG. 3C, the bank 150 may be selectively retracted outside the first capacitor electrode 122, so as to increase a contact area between the first capacitor electrode 122 and the third capacitor electrode 184, thereby increasing the stability of electric conduction. In addition, shapes of vertical projec-tions of the foregoing openings 182a, 152, and 154 on the first substrate 110 may be a polygon, and in the present disclosure, a rectangle is used as an example; however, the present disclosure is not limited thereto. For a cross-sec-tional shape of the foregoing conductive bump 180 or bump 182 of the present disclosure, a trapezoid that facilitates manufacturing is used as an example; however, the present disclosure is not limited thereto, and another appropriate cross-sectional shape may also be used. For example, in another embodiment, the cross-sectional shape of the con-ductive bump 180 or bump 182 may be a step shape, so that the third capacitor electrode 184 has high gradeability and does not fracture easily.

In the foregoing embodiments, various embodiments of configuring the bump 182, the bank 150, and the third capacitor electrode 184 are shown. It should be understood that, these configurations may all be applied to another embodiment of the present disclosure, and are not described herein one by one.

Figure 4:
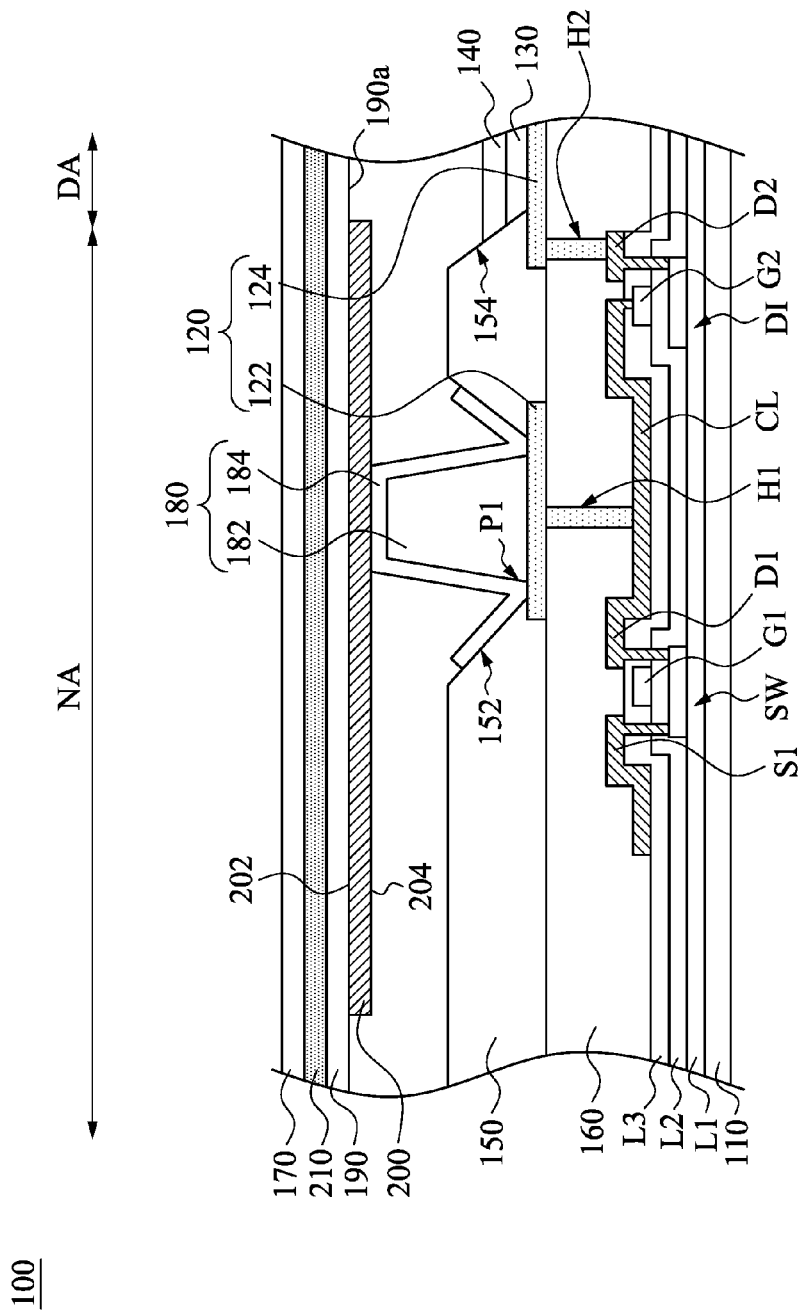
FIG. 4 is a cross-sectional view of a subpixel of a display panel according to a second embodiment of the present disclosure.

FIG. 4 is a cross-sectional view of a subpixel 100 of a display panel according to a second embodiment of the present disclosure. This embodiment is similar to the embodiment in FIG. 2B, and a difference lies in that the display panel of this embodiment further includes a second capacitor electrode 200, disposed between a capacitor dielectric layer 190 and a conductive bump 180, that is, the second capacitor electrode 200 is disposed on a capacitor dielectric layer 190 of a second substrate 170. Herein, two opposite surfaces 202 and 204 of the second capacitor electrode 200 are respectively in contact with the capacitor dielectric layer 190 and the conductive bump 180. The conductive bump 180, the capacitor dielectric layer 190, the second capacitor electrode 200, and an upper capacitor electrode 210 form a storage capacitor (solid state), that is, the second capacitor electrode 200, the conductive bump 180, and a first capacitor electrode 122 are used as one electrode (for example, a lower electrode) in the storage capacitor, and the upper capacitor electrode 210 is used as the other electrode (for example, an upper electrode) in the storage capacitor.

In some cases, for example, when planarization is not performed, a surface 190a of the capacitor dielectric layer 190 may have particular roughness, resulting in that the conductive bump 180 and the capacitor dielectric layer 190 may be not in complete contact, which affects a capacitance value.

In this embodiment, the second capacitor electrode 200 is directly disposed on the capacitor dielectric layer 190 of the second substrate 170, enabling the complete contact between the second capacitor electrode 200 and the capacitor dielectric layer 190. Specifically, the second capacitor electrode 200 is formed by depositing or coating a conductive material on the capacitor dielectric layer 190. The second capacitor electrode 200 may have a single-layer or multiple-layer structure, and a material of the second capacitor electrode 200 includes a conductive polymer (for example, metal elements exist in a molecular formula, an intrinsic conductive polymer, polymer mixed with nano particles (that is, a conductive glue), or another suitable material), a non-transparent conductive material (for example, metal, alloy, or another suitable material), a transparent conductive material (for example, indium tin oxide, indium zinc oxide, zinc oxide, carbon nanotube, indium gallium zinc oxide, or another suitable material), or another suitable material. To increase adhesiveness of the second capacitor electrode 200, the material (for example, conductive polymer) of the second capacitor electrode 200 may have suitable adhesion, so that the second capacitor electrode 200 is bonded to the surface 190a of the capacitor dielectric layer 190 and is filled in an uneven concave portion of the surface 190a.

In this embodiment, if a plurality of contact points exists on respective electrode surfaces of the second capacitor electrode 200 and the conductive bump 180, a voltage may be easily transferred from the conductive bump 180 to the second capacitor electrode 200. Therefore, by using the second capacitor electrode 200, the capacitor dielectric layer 190 and the conductive bump 180 may achieve a desirable electrical connection therebetween. In this way, the second capacitor electrode 200 (and the conductive bump 180), the capacitor dielectric layer 190, and the upper capacitor electrode 210 together form the foregoing capacitor element CA (for example, referring to FIG. 1A or FIG. 1B), so as to prevent the roughness of the surface 190a of the capacitor dielectric layer 190 from affecting a capacitance value. In addition, the lower electrode of the capacitor element CA is changed by using the second capacitor electrode 200 rather than the conductive bump 180 to determine an area of the lower electrode of the capacitor element CA, so that an overlapped area of vertical projections of the second capacitor electrode 200 and the upper capacitor electrode 210 is increased. Therefore, in a second embodiment of the present disclosure, as compared with a first embodiment, the capacitance value may be further increased by at least 50%.

Figure 5C:
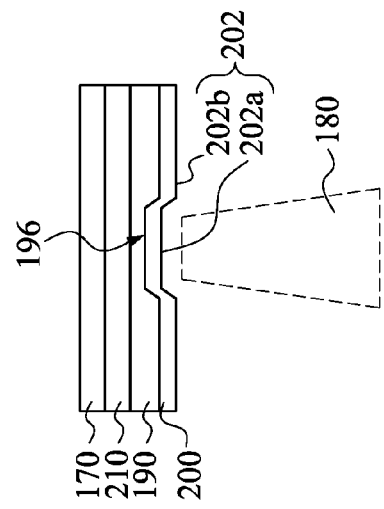
FIG. 5A to FIG. 5C are schematic cross-sectional views of a partial structure of a subpixel of a display panel in some embodiments.
Figure 5B:
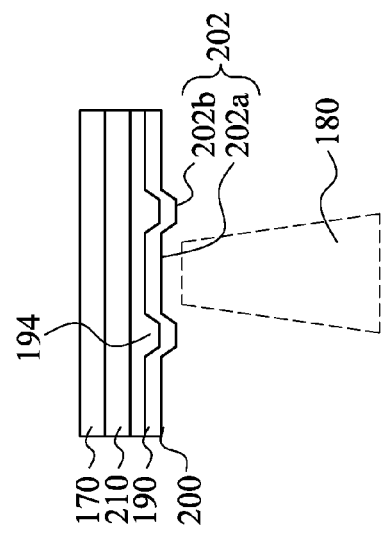
Figure 5A:
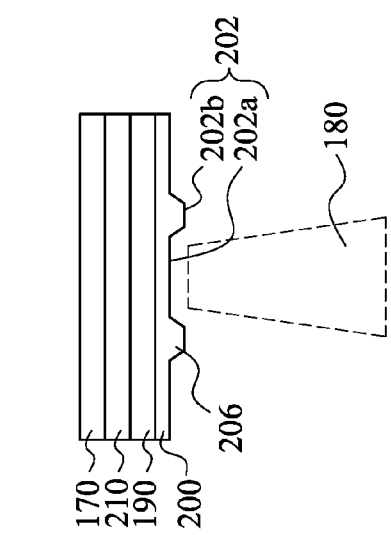

Herein, to facilitate alignment and fixation of some elements on a first substrate 110 and the second substrate 170, a corresponding structure, for example, a groove or a protrusion may be provided on a film layer of the second substrate, for example, the capacitor dielectric layer 190 or the second capacitor electrode 200, so that the conductive bump 180 is accommodated. Specifically, referring to FIG. 5A to FIG. 5C, FIG. 5A to FIG. 5C are schematic cross-sectional views of a partial structure of a subpixel of a display panel in at least one of the embodiments. In at least one of the embodiments of the present disclosure, it may be set that a lower surface 202 of the second capacitor electrode 200 has a first portion 202a and a second portion 202b located on at least one side of the first portion 202a. For example, the second portion 202b at least partially surrounds and protrudes from the first portion 202a, where a vertical projection of the conductive bump 180 on the lower surface 202 of the second capacitor electrode 200 is overlapped with the first portion 202a, so that a top portion (surface) of the conductive bump 180 is corresponding to (or namely accommodated at) the first portion 202a on the lower surface 202 of the second capacitor electrode 200.

Referring to FIG. 5A, the second capacitor electrode 200 may have a protrusion 206, which may be formed by providing an extra conductive layer or increasing a partial thickness of the second capacitor electrode 200. Alternatively, referring to FIG. 5B, the capacitor dielectric layer 190 may have a protrusion 194, which may be formed by providing an extra insulation layer or increasing a partial thickness of the capacitor dielectric layer 190. The second capacitor electrode 200 covers the capacitor dielectric layer 190 in a contoured manner, so that the lower surface 202 of the second capacitor electrode 200 has the first portion 202a and the second portion 202b located on at least one side of the first portion 202a. For example, the second portion 202b corresponds to the protrusion 194 and at least partially surrounds and protrudes from the first portion 202a. Moreover, referring to FIG. 5C, the capacitor dielectric layer 190 may have a groove 196, and the second capacitor electrode 200 covers the capacitor dielectric layer 190 in a contoured manner, so that the lower surface 202 of the second capacitor electrode 200 has the first portion 202a and the second portion 202b located on at least one side of the first portion 202a. For example, the first portion 202a corresponds to the groove 196, and the second portion 202b at least partially surrounds and protrudes from the first portion 202a. In another embodiment, the second capacitor electrode 200 may have a groove 196, so that the lower surface 202 of the second capacitor electrode 200 has the first portion 202a and the second portion 202b located on at least one side of the first portion 202a. For example, the first portion 202a corresponds to the groove 196, and the second portion 202b at least partially surrounds and protrudes from the first portion 202a. Certainly, the scope of the present disclosure should not be limited thereto. In another embodiment, the configuration of the second capacitor electrode 200 may be omitted, and only the capacitor dielectric layer 190 is adapted to limit the position of the conductive bump 180.

Figure 6:
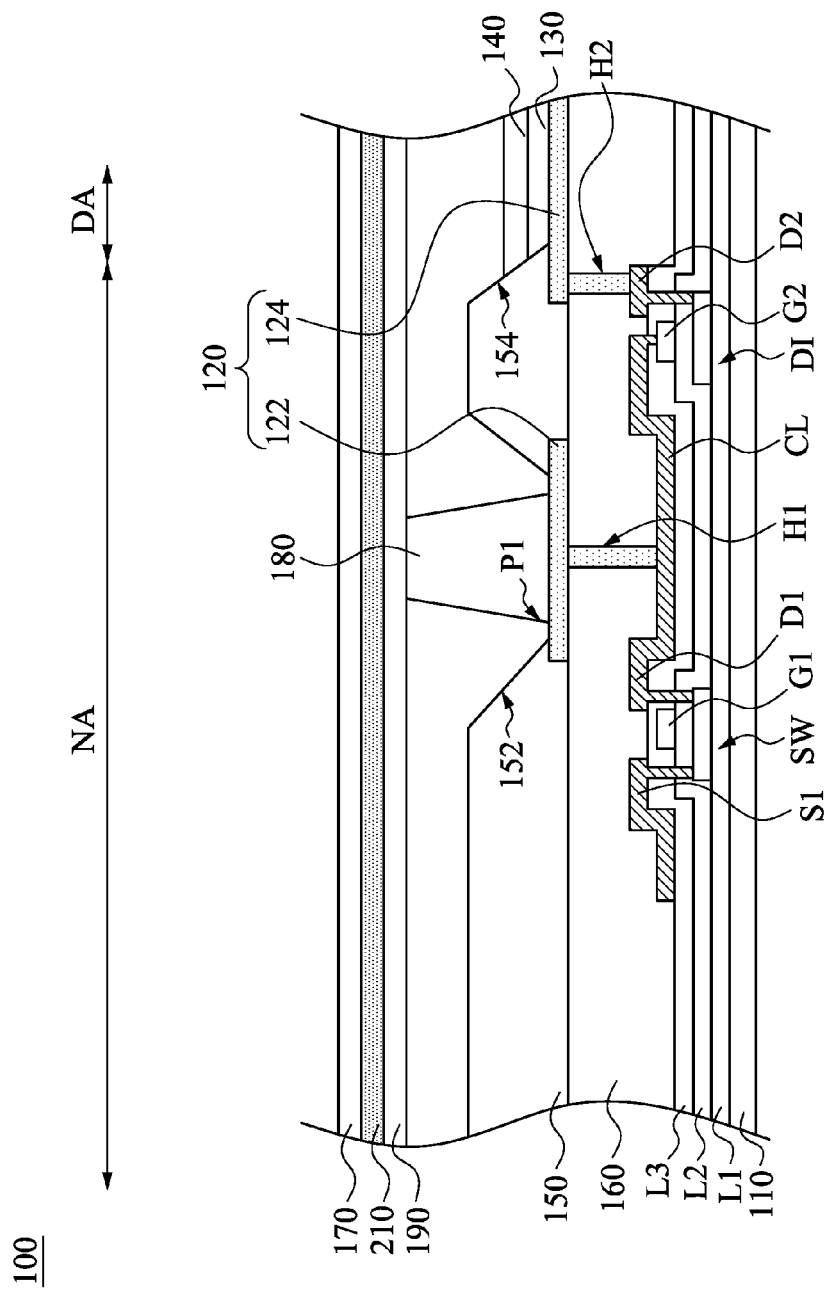
FIG. 6 is a cross-sectional view of a subpixel of a display panel according to a third embodiment of the present disclosure.

FIG. 6 is a cross-sectional view of a subpixel 100 of a display panel according to a third embodiment of the present disclosure. This embodiment is similar to the embodiment in FIG. 2B, and a difference lies in that a conductive bump 180 of this embodiment is made of a conductive material, for example, a metal material or another suitable conductive material, but it is not a composite layer formed of an insulation layer and a conductive layer.

Herein, the conductive bump 180 may include a single-layer or multiple-layer structure, and a material of the conductive bump 180 includes a conductive polymer (for example, metal elements exist in a molecular formula, an intrinsic conductive polymer, a polymer mixed with nano particles (that is, a conductive glue), or another suitable material), a non-transparent conductive material (for example, metal, alloy, or another appropriate material), a transparent conductive material (for example, indium tin oxide, indium zinc oxide, zinc oxide, a carbon nanotube, indium gallium zinc oxide, or another suitable material), or another suitable material. Generally speaking, to increase conductivity of the conductive bump 180, preferably, for the material of the conductive bump 180, a non-transparent conductive material (for example, metal, alloy, or another suitable material) is selected. In addition, as discussed above, in this embodiment, a third capacitor electrode 184 may be selectively disposed. In this way, the conductive bump 180, a capacitor dielectric layer 190, and an upper capacitor electrode 210 or the conductive bump 180 with the third capacitor electrode 184, the capacitor dielectric layer 190, and the upper capacitor electrode 210 form a storage capacitor, that is, the foregoing capacitor element CA (referring to FIG. 1A). In addition, in this embodiment, a second capacitor electrode 200 may also be selectively disposed. The second capacitor electrode 200 (and the conductive bump 180), the capacitor dielectric layer 190, and the upper capacitor electrode 210 together form the foregoing capacitor element CA.

Various subpixel structures are respectively described in the foregoing multiple embodiments. For the subpixel structures, further applications are provided below. For example, a sensing element is embedded in the display panel, that is, the sensing element is located between inner surfaces of a first substrate 110 and a second substrate 170. The sensing element may include a capacitive touch (position) sensing element, a capacitive touch (force) sensing element, a fingerprint recognition sensing element, an electromagnetic sensing element (for example, near-field communication sensing element, a wireless charging sensing element or another suitable element), or another suitable element, or a combination of at least two of the foregoing. Specifically, a sensing electrode and a connection electrode are disposed in these subpixels. The sensing electrode and the connection electrode may be formed by using a same patterned layer as any conductive layer, for example, the patterned electrode layer 120, the counter electrode 140, the third capacitor electrode 184, the upper capacitor electrode 210, and the second capacitor electrode 200 in the foregoing, in the subpixel 100. In another manner, the sensing electrode and the connection electrode may be formed by using a same patterned layer as a corresponding conductive layer, and are integrated in a pixel structural array inside the display panel, so that effects of sensing and display are achieved, and extra film layers and process steps may not be caused, which helps reduce a cost and a time of manufacturing.

In the following description in FIG. 7A to FIG. 12C, interlaced and non-interlaced sensing arrays are integrated.

Figure 7B:
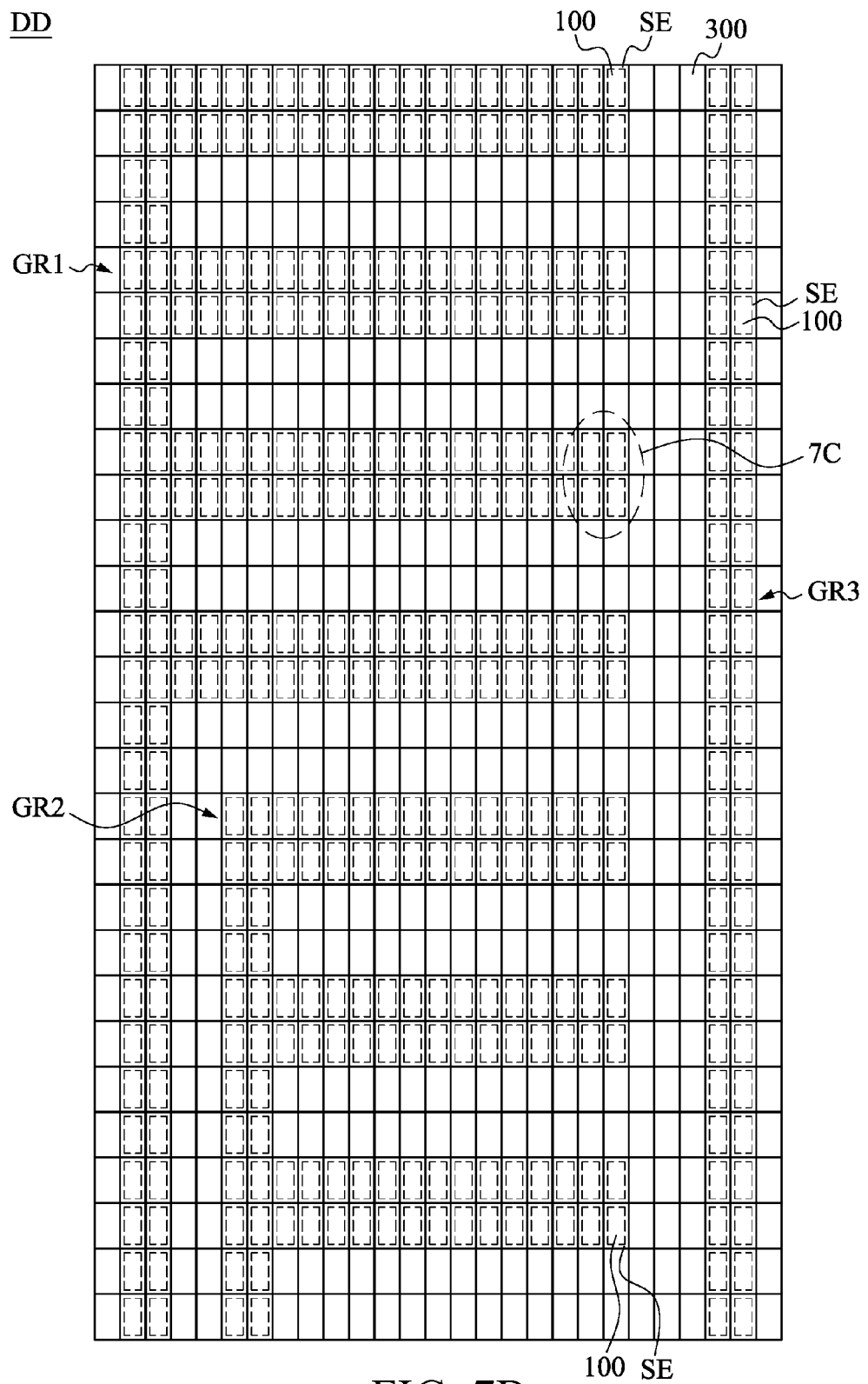
FIG. 7B is an enlarged view of the display panel in FIG. 7A.

FIG. 7A is a schematic top view of a display panel DD according to a fourth embodiment of the present disclosure. FIG. 7B is an enlarged view of the display panel DD in FIG. 7A. The display panel DD in this embodiment is similar to the display panel in the embodiment in FIG. 4. The display panel DD includes a plurality of subpixels 100 as discussed above, and a difference lies in that the display panel DD in this embodiment further includes a sensing electrode SE, and the sensing electrode SE is disposed on the second substrate 170. Specifically, the display panel DD includes a subpixel 100 that has the sensing electrode SE and a subpixel 300 that does not have a sensing electrode. For ease of description, only a partial structure of the display panel DD is shown herein, and only an example in which the sensing electrode SE is disposed around the subpixel 100 is used; however, in actual application, the scope of the present disclosure should not be limited thereto.

In this embodiment, the display panel DD has a first sensing electrode region GR1 and a second sensing electrode region GR2, and a third sensing electrode region GR3 that are separated from each other, where the third sensing electrode region GR3 may be selectively disposed. The sensing electrode SE is disposed in the subpixel 100 on the first sensing electrode region GR1, the second sensing electrode region GR2, and the third sensing electrode region GR3 that may be selectively disposed. The sensing electrode SE of the first sensing electrode region GR1, the sensing electrode SE of the second sensing electrode region GR2, and the sensing electrode SE of the third sensing electrode region GR3 are separated. The sensing electrodes SE in the subpixels 100 of the first sensing electrode region GR1 are electrically connected to each other, the sensing electrodes SE in the subpixels 100 of the second sensing electrode region GR2 are electrically connected to each other, and the sensing electrodes SE in the subpixels 100 of the third sensing electrode region GR3 are electrically connected to each other. The sensing electrodes SE in the subpixels 100 of the third sensing electrode region GR3 may be connected to a ground terminal (not shown) or floated. When a user touches the display panel DD, the sensing electrodes SE on the subpixels 100 of the first sensing electrode region GR1 and the second sensing electrode region GR2 have a capacitance change, so as to sense at least one of a position, a force, a fingerprint pattern of a finger or perform functions of the foregoing elements.

Figure 7C:
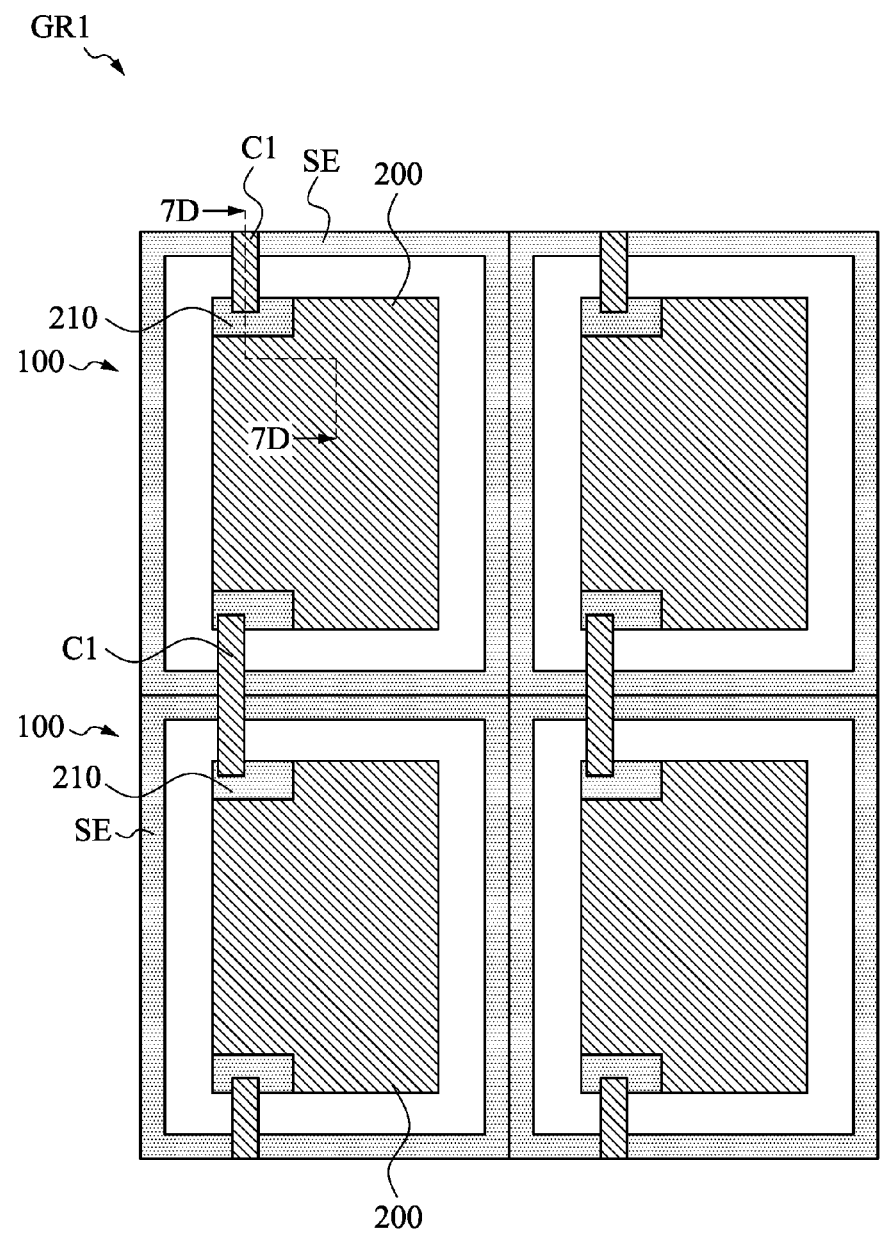
FIG. 7C is a schematic partial top view of the display panel in FIG. 7B.
Figure 7D:
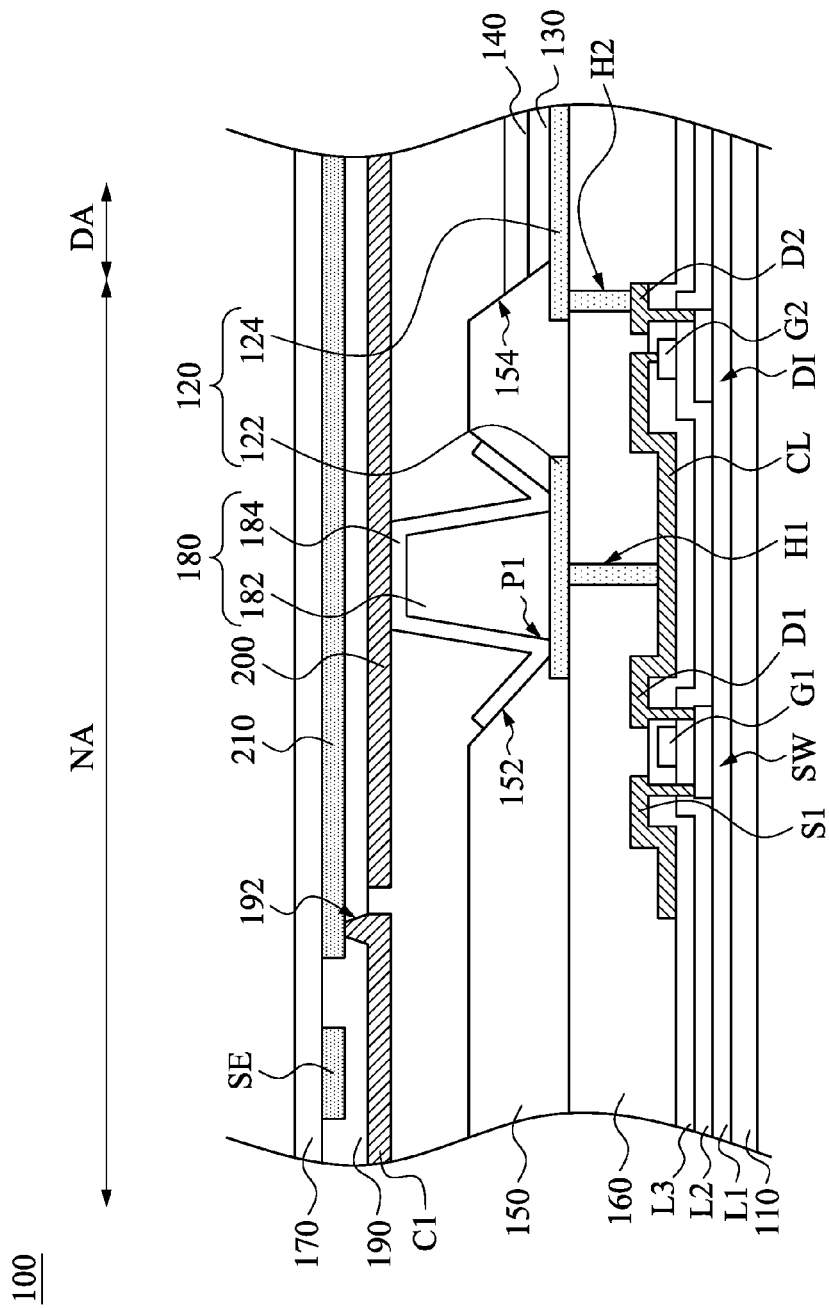
FIG. 7D is a schematic cross-sectional view along a line 7D-7D in FIG. 7C.

Specifically, referring to both FIG. 7B and FIG. 7C, FIG. 7C is a schematic top view of a partial 7C of the display panel DD in FIG. 7B. FIG. 7D is a schematic cross-sectional view along a line 7D-7D in FIG. 7C. Herein, FIG. 7C shows configurations of various elements on the second substrate 170, and in FIG. 7C, a direction from the first substrate 110 to the second substrate 170 is used as an observation direction. Herein, the sensing electrode SE of the subpixel 100 of the first sensing electrode region GR1 and the upper capacitor electrode 210 (refer to the foregoing embodiment) may be formed by using a same patterned layer. The sensing electrodes SE are located at a periphery of the upper capacitor electrode 210. For example, the sensing electrodes SE surround the upper capacitor electrode 210, and the sensing electrodes SE of adjacent subpixels 100 may be directly connected to each other.

Although not shown herein, the structures of the subpixel 100 of the second sensing electrode region GR2 and the subpixel 100 of the third sensing electrode region GR3 may be substantially the same as the structure of the subpixel 100 of the first sensing electrode region GR1. The sensing electrodes SE in the subpixels 100 of the second sensing electrode region GR2 and the sensing electrodes SE in the subpixels 100 of the third sensing electrode region GR3 that may be selectively disposed may be formed by using a same patterned layer as the upper capacitor electrode 210 (refer to the foregoing embodiment).

In one of the embodiments of the present disclosure, the display panel further includes at least one first connection electrodes C1 and the second capacitor electrodes 200. The first connection electrode C1 is disposed on the second substrate 170, and the first connection electrode C1 and the sensing electrode SE are separated and are partially overlapped in a vertical projection direction. In one of the embodiments, the first connection electrode C1 may traverse the sensing electrode SE and is electrically connected to upper capacitor electrodes 210 of two adjacent subpixels 100 through an opening 192 in the capacitor dielectric layer 190. A configuration of the second capacitor electrode 200 is the same as that discussed above, where the second capacitor electrode 200 and the upper capacitor electrode 210 are at least partially overlapped in the vertical projection direction. Herein, the first connection electrode C1 and the second capacitor electrode 200 may be formed by using a same patterned layer. Alternatively, in another embodiment, the sensing electrode SE is located at a periphery of the upper capacitor electrode 210. The sensing electrode SE has at least one opening, and the upper capacitor electrodes 210 of adjacent subpixels 100 may be directly connected to each other by passing through an opening of the sensing electrode SE. The first connection electrode C1 and the second capacitor electrode 200 may be formed by using a same patterned layer, the first connection electrode C1 traverses (or namely crossovers) the upper capacitor electrode 210 in the opening of the sensing electrode SE and is connected to the sensing electrode SE of the subpixel 100, and the first connection electrode C1 and the upper capacitor electrode 210 are separated and partially overlapped. Herein, the sensing electrode SE and the first connection electrode C1 are respectively partially overlapped with a non-light emitting area NA.

Herein, return to FIG. 7B again. The subpixel 300 may be any subpixel structure in the foregoing embodiments. However, the structure of the capacitor element of the present disclosure is still needed, and for the rest structure, reference may be made to another drawing of the present disclosure.

It should be understood that the scope of the present disclosure should not be limited to the arrangement of the subpixels 100 of the first sensing electrode region GR1 and the second sensing electrode region GR2 in FIG. 7A and FIG. 7B, that is, opening directions of the first sensing electrode region GR1 and the second sensing electrode region GR2 are a same direction. Referring to FIG. 7E and FIG. 7F, FIG. 7E and FIG. 7F are a schematic top view of the display panel DD according to some embodiments of the present disclosure. In another embodiment, the subpixels 100 of the first sensing electrode region GR1 and the second sensing electrode region GR2 may have different arrangement patterns, that is, the opening directions of the first sensing electrode region GR1 and the second sensing electrode region GR2 are different directions or are alternated with each other, and the foregoing sensing effect can also be achieved.

Although herein the sensing electrode SE is located at the periphery of the upper capacitor electrode 210, and the first connection electrode C1 needs to be disposed to connect upper capacitor electrodes 210 of adjacent subpixels 100, the present disclosure is not limited thereto. In another embodiment, the subpixel 100 may have another structure. For example, the upper capacitor electrode 210 may be located at a periphery of the sensing electrode SE. FIG. 8A to FIG. 8D below are used to describe other embodiments in which the upper capacitor electrode 210 is located at the periphery of the sensing electrode SE.

Figure 8A:
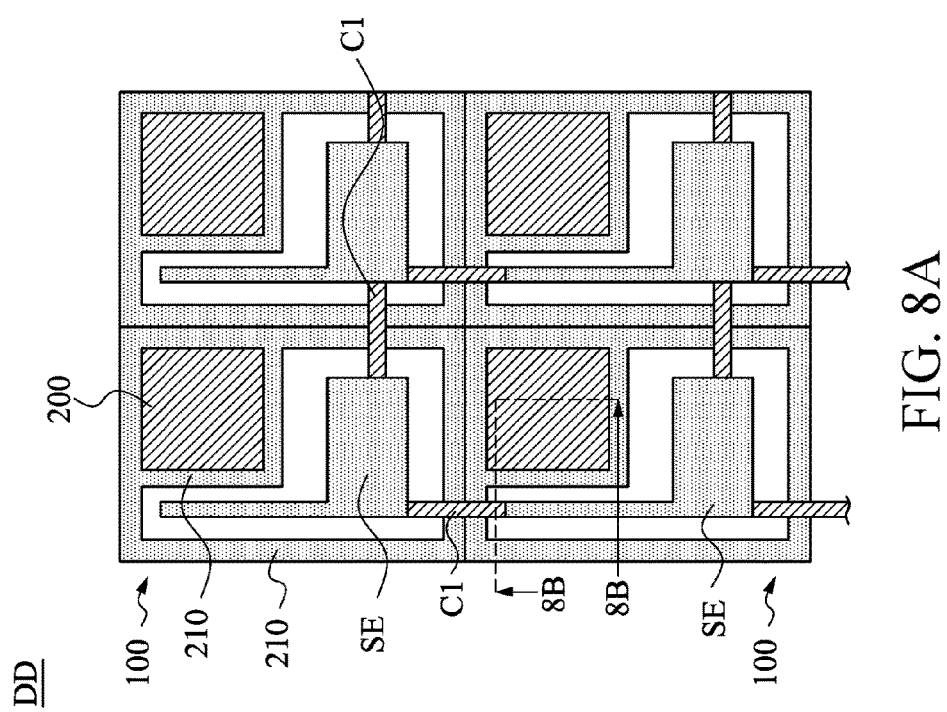
FIG. 8A is a schematic partial top view of a display panel according to a fifth embodiment of the present disclosure.
Figure 8B:
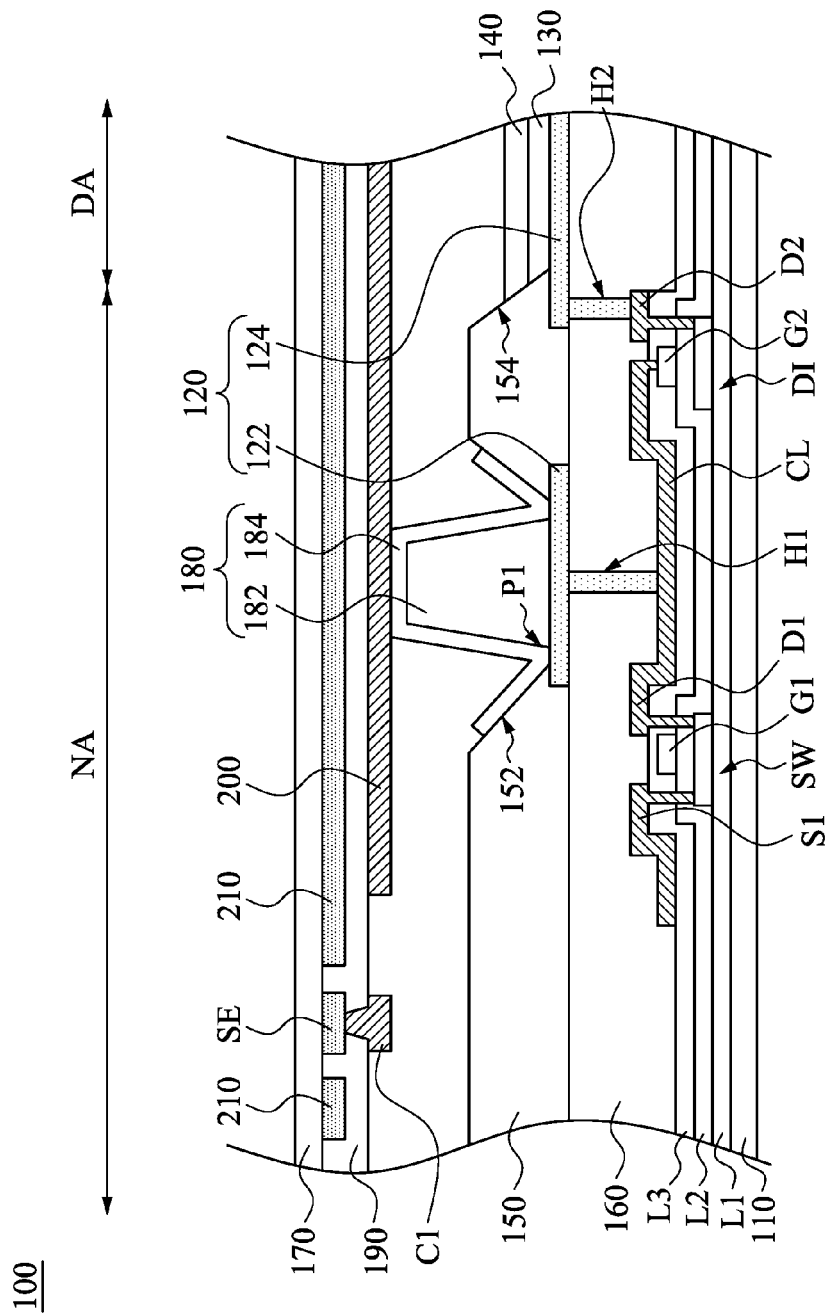
FIG. 8B is a schematic cross-sectional view along a line 8B-8B in FIG. 8A.
Figure 8C:
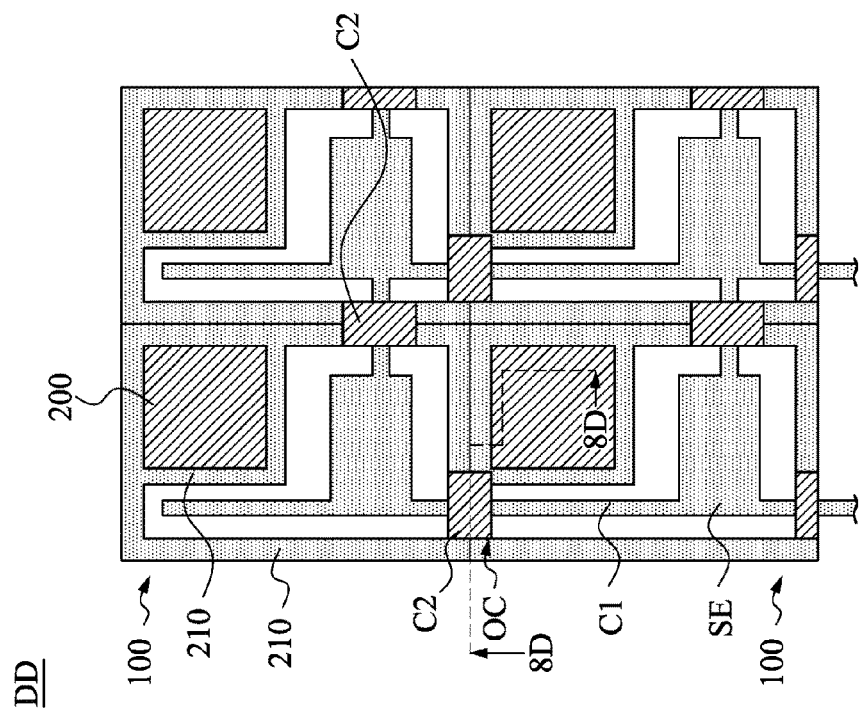
FIG. 8C is a schematic partial top view of a display panel according to a sixth embodiment of the present disclosure.
Figure 8D:
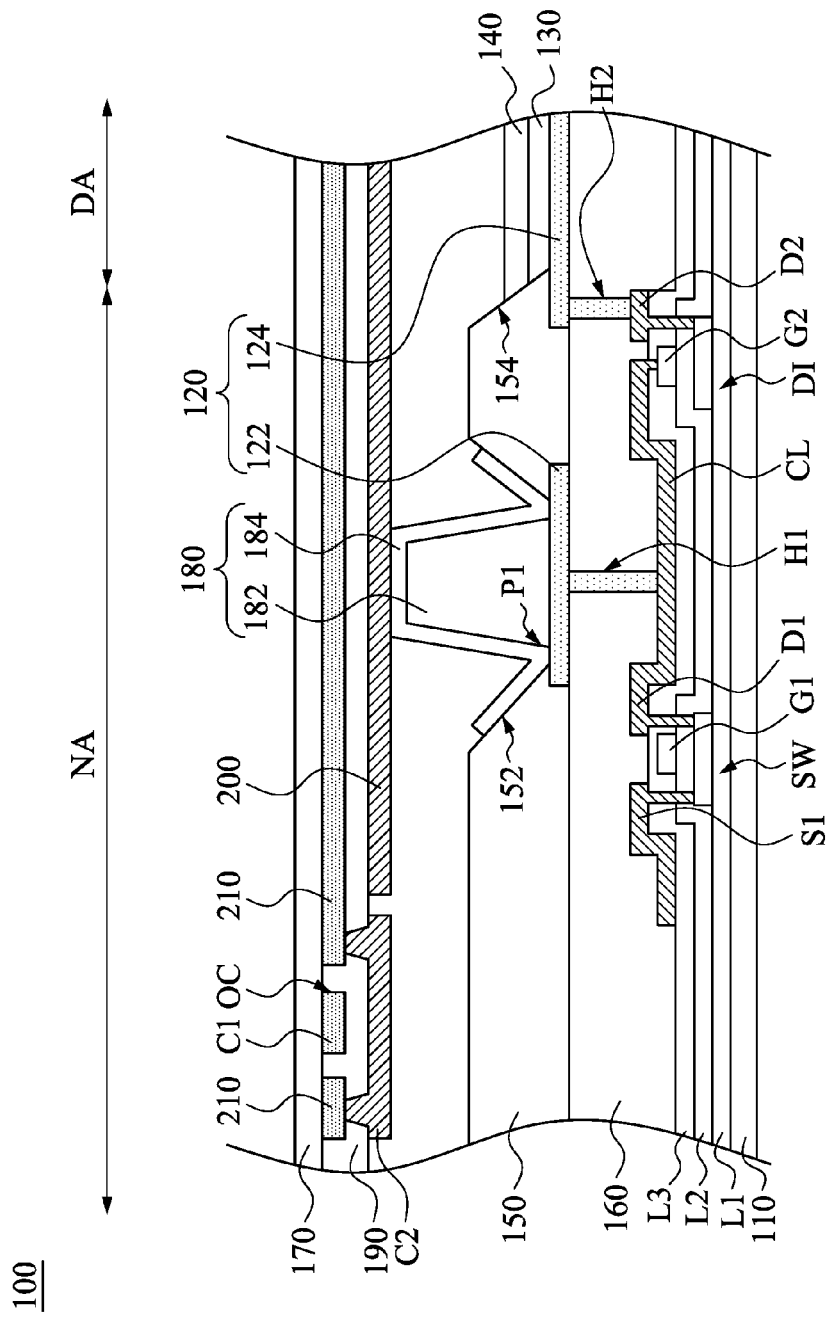
FIG. 8D is a schematic cross-sectional view along a line 8D-8D in FIG. 8C.

Referring to FIG. 8A to FIG. 8D, FIG. 8A is a schematic partial top view of a display panel DD according to a fifth embodiment of the present disclosure. FIG. 8B is a schematic cross-sectional view along a line 8B-8B in FIG. 8A. FIG. 8C is a schematic partial top view of the display panel DD according to a sixth embodiment of the present disclosure. FIG. 8D is a schematic cross-sectional view along a line 8D-8D in FIG. 8C. The embodiments in FIG. 8A to FIG. 8D are similar to the embodiments in FIG. 7A to FIG. 7D, and a difference lies in that a first connection electrode C1 is connected to sensing electrodes SE of two adjacent subpixels 100. In this embodiment, the sensing electrode SE may be partially overlapped with a light emitting area DA, and at least a part of an upper capacitor electrode 210 may be partially overlapped with the light emitting area DA, that is, at least a part of the upper capacitor electrode 210 may be located at the periphery of the sensing electrode SE. For example, at least a part of the upper capacitor electrode 210 may surround the sensing electrode SE. For ease of description, FIG. 8A and FIG. 8C only show structures of elements of an upper portion of a second substrate 170, where a direction from a first substrate 110 to the second substrate 170 is used as an observation direction in FIG. 8A and FIG. 8C.

Referring to FIG. 8A and FIG. 8B, the first connection electrode C1 and a second capacitor electrode 200 are formed by using a same patterned layer. The upper capacitor electrode 210 forms a receiving area (or namely accommodated region), which may make it easy for the sensing electrode SE to be located in the receiving area. The first connection electrode C1 and the second capacitor electrode 200 are formed by using a same patterned layer. The first connection electrode C1 traverses the upper capacitor electrode 210 and is electrically connected to sensing electrodes SE of two adjacent subpixels 100.

Alternatively, in another embodiment, referring to FIG. 8C and FIG. 8D, herein, the first connection electrode C1, the sensing electrode SE, and the upper capacitor electrode 210 are formed by using a same patterned layer. The display panel DD further includes at least one second connection electrode C2, and the second connection electrode C2 and the second capacitor electrode 200 are formed by using a same patterned layer. The second connection electrode C2 is disposed on the second substrate 170. For example, the second connection electrode C2 is disposed on a capacitor dielectric layer 190 of the second substrate 170, where the second connection electrode C2 is connected to upper capacitor electrodes 210 of two adjacent subpixels 100, and the second connection electrode C2 and the first connection electrode C1 are separated and partially overlapped. Herein, the second connection electrode C2 and the upper capacitor electrode 210 are partially overlapped. The second connection electrode C2 and the second capacitor electrode 200 are formed by using a same patterned layer.

Specifically, in FIG. 8C and FIG. 8D, the upper capacitor electrode 210 has an opening OC, and the first connection electrode C1 extends through the opening OC to electrically connect the sensing electrode SE of the subpixel 100 and the sensing electrode SE of another subpixel 100. The second connection electrode C2 is disposed on the second substrate 170, the second connection electrode C2 traverses the opening OC to be connected to the upper capacitor electrodes 210 on two sides of the first connection electrode C1, and the second connection electrode C2 and the first connection electrode C1 are separated and partially overlapped. It should be understood that, in multiple embodiments of the present disclosure, when the upper capacitor electrode 210 and the second capacitor electrode 200 are disposed, various sensing electrodes and connection electrodes are disposed at the same time, and the scope of the present disclosure should not be limited by those shown in the figures.

Other details in this embodiment are substantially the same as those in the foregoing embodiments, and are no longer elaborated herein.

FIG. 7A to FIG. 7D and FIG. 8A to FIG. 8D above respectively describe various embodiments of a non-interlaced manner in which the sensing electrode SE and the upper capacitor electrode 210 are formed by using a same patterned layer. Various embodiments of an interlaced manner in which the sensing electrode SE and the upper capacitor electrode 210 are formed by using a same patterned layer are described below.

Figure 9A:
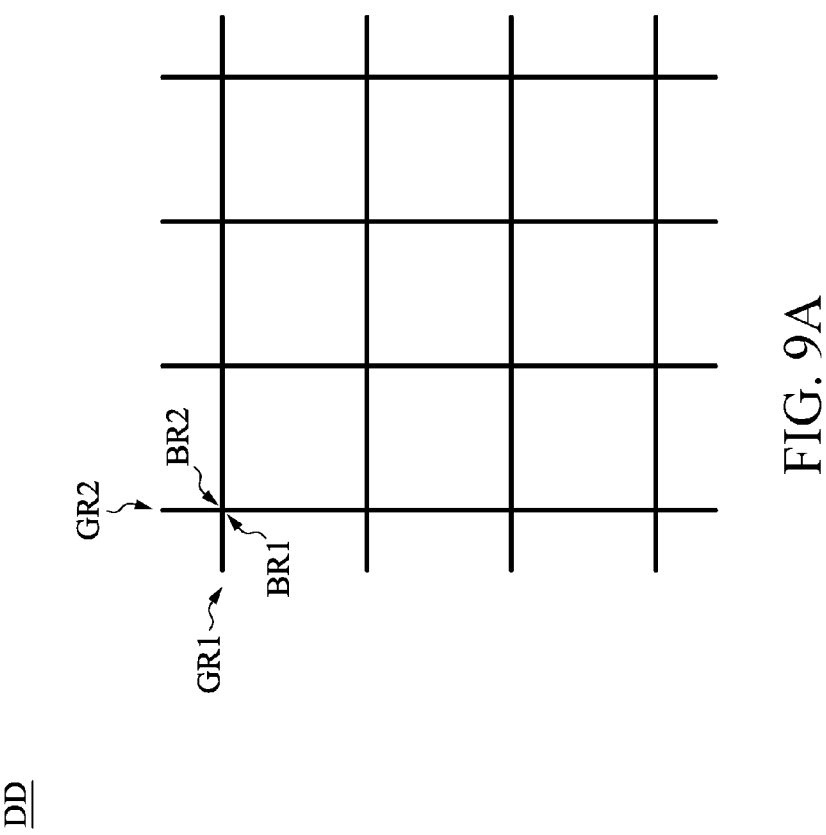
FIG. 9A is a schematic top view of a display panel according to a seventh embodiment of the present disclosure.
Figure 9B:
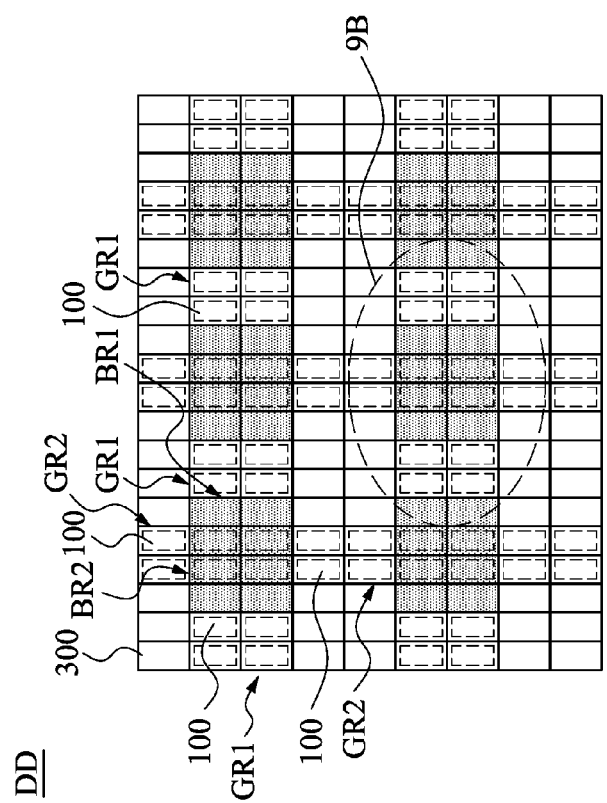
FIG. 9B is a partial enlarged view of the display panel in FIG. 9A.

Referring to FIG. 9A and FIG. 9B, FIG. 9A is a schematic top view of a display panel DD according to a seventh embodiment of the present disclosure. FIG. 9B is a partial enlarged view of the display panel in FIG. 9A. The display panel DD in this embodiment is similar to the display panel DD in the embodiment in FIG. 8A, and a difference lies in that an interlaced (or namely crossover, or namely intersect) configuration is used in this embodiment. Specifically, in this embodiment, the display panel DD has at least two first sensing electrode regions GR1, at least two second sensing electrode regions GR2 that are separated from the first sensing electrode regions GR1, a first bridge electrode region BR1, and a second bridge electrode region BR2, which are arranged to form an array of mutual-capacitance form sensing. The display panel DD further includes the subpixel 300 that does not have the sensing electrode.

Figure 9C:
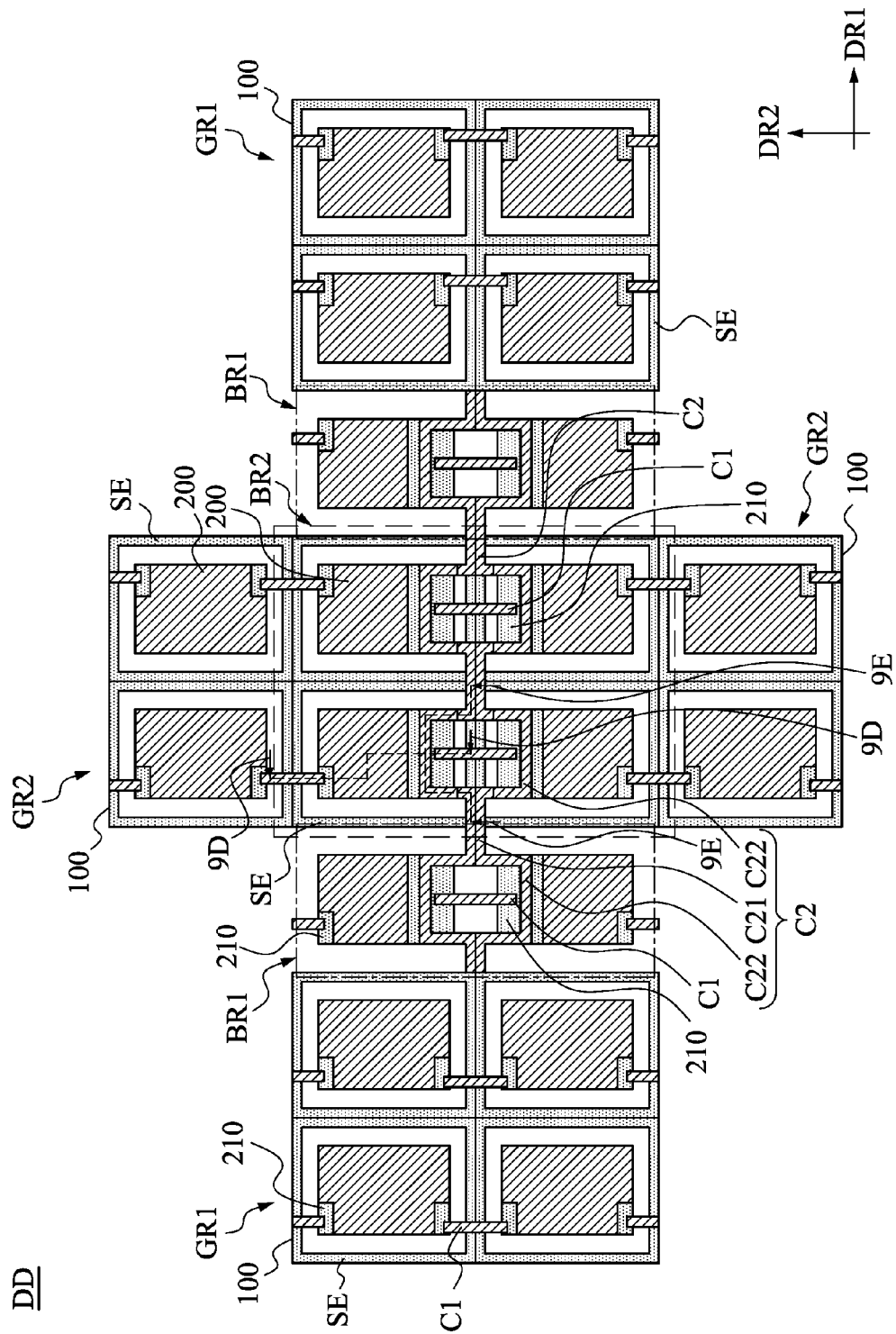
FIG. 9C is a partial enlarged view of the display panel in FIG. 9B.
Figure 9D:
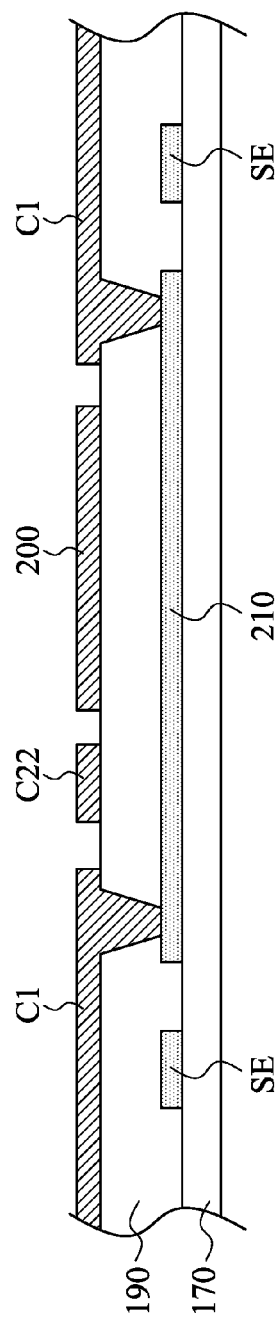
FIG. 9D is a schematic cross-sectional view along a line 9D-9D in FIG. 9C.
Figure 9E:
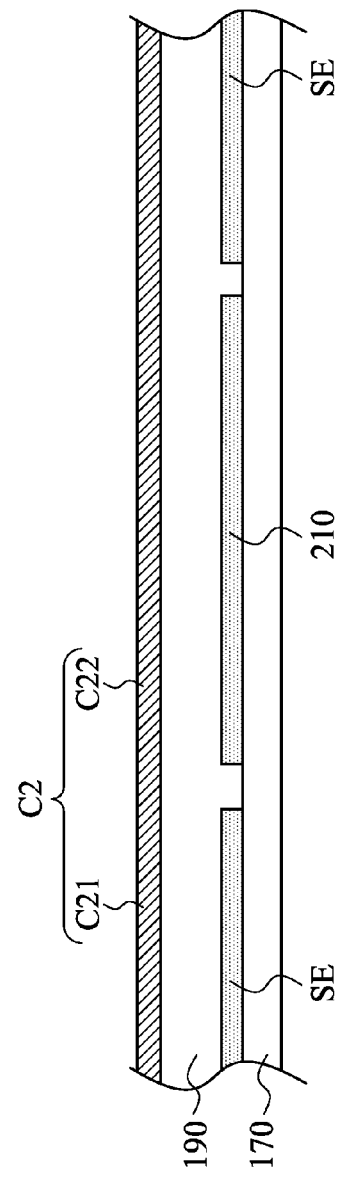
FIG. 9E is a schematic cross-sectional view along a line 9E-9E in FIG. 9C.

Specifically, referring to FIG. 9C, FIG. 9D, and FIG. 9E, FIG. 9C is an enlarged view of a part 9B of the display panel DD in FIG. 9B. FIG. 9D is a schematic cross-sectional view along a line 9D-9D in FIG. 9C. FIG. 9E is a schematic cross-sectional view along a line 9E-9E in FIG. 9C. In FIG. 9C, FIG. 9D, and FIG. 9E, a related design on a first substrate is omitted, and for the related design on the first substrate, reference may be made to the foregoing embodiments. In this embodiment, the display panel DD includes a first connection electrode C1 and a second connection electrode C2, which are formed by using a same patterned layer as the second capacitor electrode 200.

The first connection electrode C1 is disposed on the second substrate 170, and is located at each subpixel 100, so as to bridge upper capacitor electrodes 210 of adjacent subpixels 100.

The second connection electrode C2 is disposed on the second substrate 170, and is located at each subpixel 100 of the first bridge electrode region BR1 and the second bridge electrode region BR2, so as to bridge the sensing electrodes SE of the first sensing electrode regions GR1 located on two sides of the first bridge electrode region BR1 and the second bridge electrode region BR2, that is, to connect the sensing electrodes SE that transversely transfer a signal. In one of the embodiments of the present disclosure, the second connection electrode C2 includes at least one first sub-electrode segment C21 and at least one second sub-electrode segment C22. The first sub-electrode segment C21 is located between any two adjacent subpixels 100 of the first bridge electrode region BR1 and the second bridge electrode region BR2, and the first sub-electrode segment C21 is partially overlapped with the sensing electrode SE located in the second bridge electrode region BR2. The second sub-electrode segment C22 is located at each subpixel 100 of the first bridge electrode region BR1 and the second bridge electrode region BR2, so as to be connected to the first sub-electrode segment C21, and is partially overlapped with the upper capacitor electrode 210 of each subpixel 100 of the first bridge electrode region BR1 and the second bridge electrode region BR2.

The sensing electrode SE located at each subpixel 100 of the second bridge electrode region BR2 is adapted to connect the sensing electrodes SE of the second sensing electrode regions GR2 located at an upper end and a lower end of the second bridge electrode region BR2. The sensing electrodes SE of the second bridge electrode region BR2 and the second connection electrode C2 are separated and interlaced. For example, the sensing electrode SE of the second bridge electrode region BR2 and the second sub-electrode segment C22 of the second connection electrode C2 are interlaced. Preferably, the sensing electrode SE of the second bridge electrode region BR2 may extend from the sensing electrodes SE of the second sensing electrode regions GR2, pass through each subpixel 100 of the second bridge electrode region BR2, and be connected to sensing electrodes SE of another second sensing electrode region GR2. That is, the sensing electrode SE of the second bridge electrode region BR2 is used as a sensing electrode SE that transfers a signal vertically, so that a process is simplified and a yield is improved; however, the present disclosure is not limited thereto.

In this embodiment, the first connection electrode C1, the second connection electrode C2, and the second capacitor electrode 200 are formed by using a same patterned layer, and the sensing electrode SE and the upper capacitor electrode 210 are formed by using a same patterned layer; however, the present disclosure is not limited thereto.

Herein, the first bridge electrode region BR1 and the second bridge electrode region BR2 are separated and interlaced, which means: the subpixel 100 located in the first bridge electrode region BR1 does not have the sensing electrode SE, and two first bridge electrode regions BR1 are provided respectively on the left and right of the second bridge electrode region BR2. In this way, the sensing electrode SE is transversely disconnected in the first bridge electrode region BR1 and the second bridge electrode region BR2, and is separated from and interlaced with the sensing electrode SE of the second bridge electrode region BR2 by using the second connection electrode C2, to bridge the transverse first sensing electrode regions GR1. In addition, the configurations of the first connection electrode C1 and the second connection electrode C2 are not limited to those shown in the figures, and other film layers may be suitably configured to facilitate setting of these connection segments.

It should be noted that, the first connection electrode C1 exists in the subpixels of the first sensing electrode regions GR1 and the second sensing electrode regions GR2. Although in the foregoing embodiments, the sensing electrode SE is located at a periphery of the upper capacitor electrode 210, for example, the sensing electrode SE shown in FIG. 7C surrounds the upper capacitor electrode 210, the present disclosure is not limited thereto. In another embodiment, the subpixel 100 may have another structure. For example, the upper capacitor electrode 210 may be located at the periphery of the sensing electrode SE, and may be refer to the following embodiments.

Figure 10A:
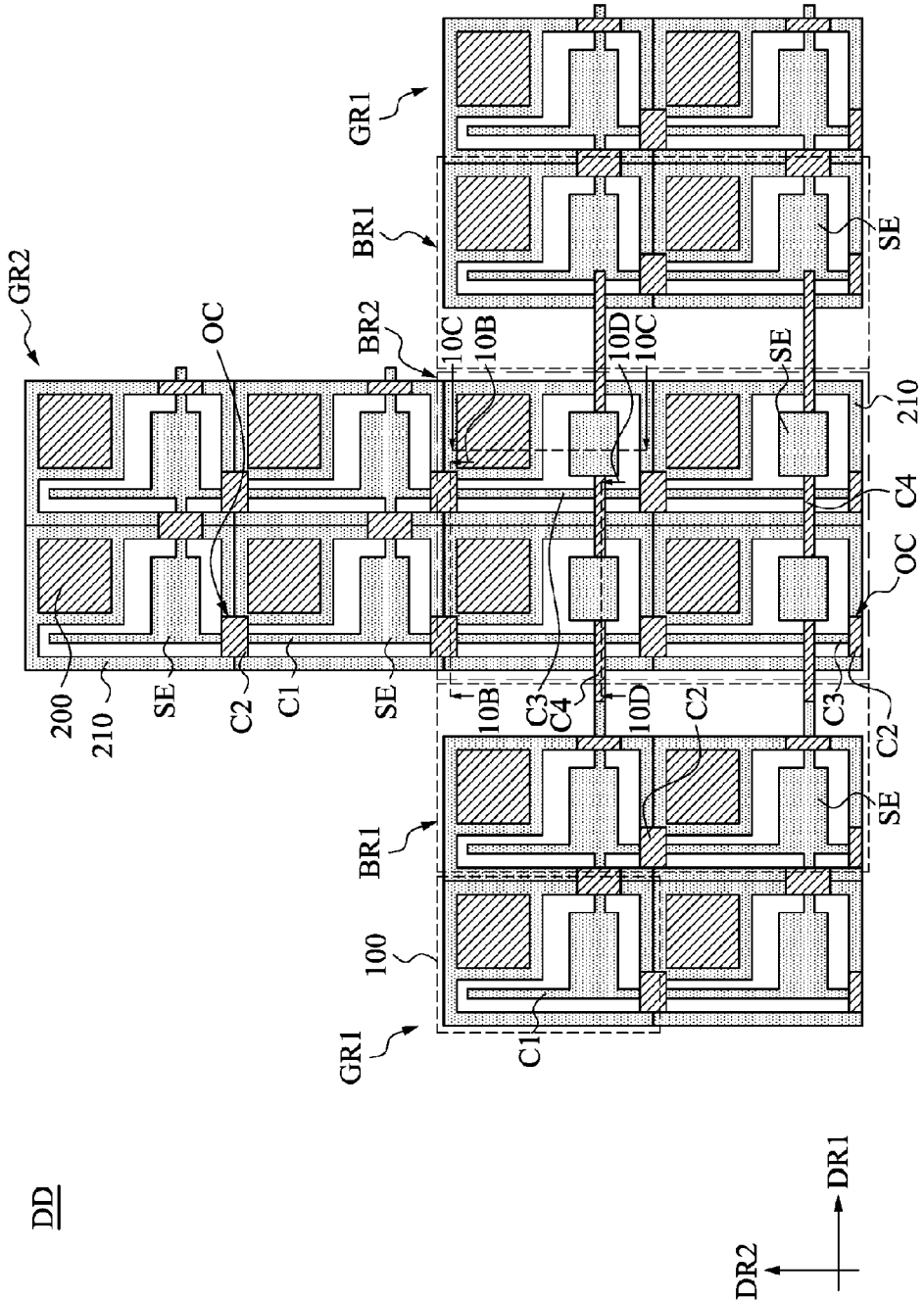
FIG. 10A is a schematic partial top view of a display panel according to an eighth embodiment of the present disclosure.

Referring to FIG. 10A, FIG. 10A is a schematic partial top view of a second substrate 170 of a display panel DD according to an eighth embodiment of the present disclosure. Herein, an upper capacitor electrode 210 may be located at a periphery of a sensing electrode SE by using a non-closed form. The display panel DD includes a first connection electrode C1, a second connection electrode C2, a third connection electrode C3, and a fourth connection electrode C4. Preferably, the second connection electrode C2, the fourth connection electrode C4, and a second capacitor electrode 200 are formed by a same patterned layer, and the first connection electrode C1, the third connection electrode C3, the sensing electrode SE, and the upper capacitor electrode 210 are formed by a same patterned layer; however, the present disclosure is not limited thereto. In some embodiments, a fourth connection electrode C4 of a subpixel of a second bridge electrode region BR2 and a third connection electrode C3 of the second bridge electrode region BR2 are formed by different patterned layers, and the fourth connection electrode C4 and the second connection electrode C2 of the subpixel of the second bridge electrode region BR2 are formed by a same patterned layer. The third connection electrode C3 of the subpixel of the second bridge electrode region BR2 and a first connection electrode C1 of another subpixel are formed by a same patterned layer.

Figure 10B:
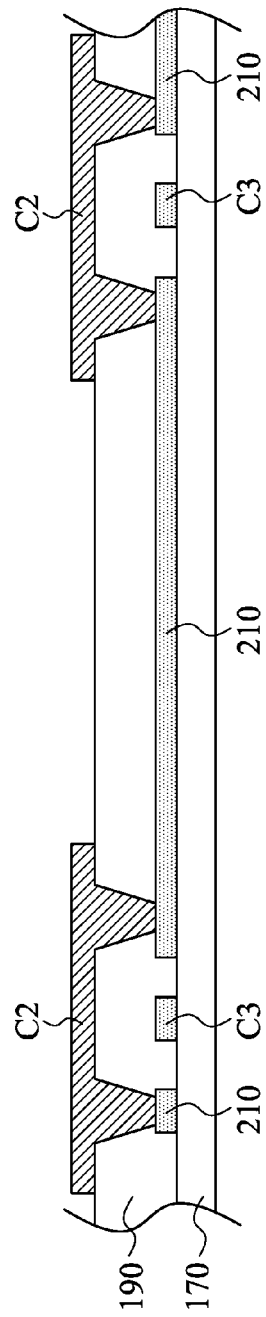
FIG. 10B is a schematic cross-sectional view of along a line 10B-10B in FIG. 10A.
Figure 10C:
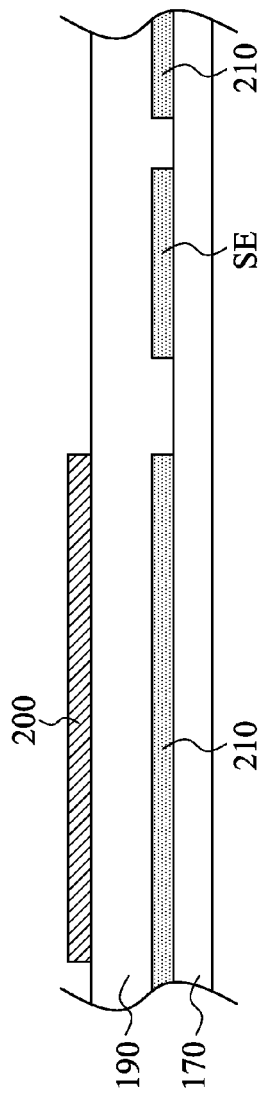
FIG. 10C is a schematic cross-sectional view of along a line 10C-10C in FIG. 10A.

Referring to FIG. 10A to FIG. 10D at the same time, FIG. 10B is a schematic cross-sectional view along a line 10B-10B in FIG. 10A. FIG. 10C is a schematic cross-sectional view along a line 10C-10C in FIG. 10A. FIG. 10D is a schematic cross-sectional view along a line 10D-10D in FIG. 10A. In FIG. 10A to FIG. 10D, a related design on a first substrate is omitted, and for the related design on the first substrate, reference may be made to the foregoing embodiment. The fourth connection electrode C4 is disposed on the second substrate 170, is located at each subpixel 100 of the second bridge electrode region BR2, so as to be connected to the sensing electrode SE located in the second bridge electrode region BR2, and is electrically connected to the sensing electrodes SE located at the first sensing electrode regions GR1. For example, the fourth connection electrode C4 located at the second bridge electrode region BR2 includes one in a first direction DR1 and one in a second direction DR2 different from the first direction DR1. The fourth connection electrode C4 in the first direction DR1 is connected to two adjacent subpixels 100, so as to be electrically connected to the sensing electrode SE of the first sensing electrode region GR1. The fourth connection electrode C4 in the second direction DR2 is only connected to the sensing electrode SE located in the second bridge electrode region BR2.

The second connection electrode C2 is disposed on the second substrate 170, and is located at each subpixel 100 of the first bridge electrode region BR1, the second bridge electrode region BR2, the first sensing electrode region GR1, and the second sensing electrode region GR2, so as to connect upper capacitor electrodes 210 of two adjacent subpixels 100. The second connection electrode C2 at least located in the second bridge electrode region BR2 may traverse (or namely crossover) an opening OC and the third connection electrode C3 to connect the upper capacitor electrodes 210 on two sides of the third connection electrode C3.

The third connection electrode C3 is disposed on the second substrate 170, and is located at each subpixel 100 of the second bridge electrode region BR2, so as to connect the sensing electrodes SE located in the second sensing electrode regions GR2, that is, form a sensing electrode SE that transfers a signal vertically. Specifically, the upper capacitor electrode 210 has the opening OC, the third connection electrode C3 passes through (extends through) the opening OC to connect the sensing electrode SE of the subpixel 100 and a sensing electrodes SE of another subpixels in the second sensing electrode regions GR2. The third connection electrode C3 located at each subpixel 100 of the second bridge electrode region BR2 is separated from the sensing electrode SE. Preferably, the third connection electrode C3 may be a part of the sensing electrode SE of the second bridge electrode region BR2, where the third connection electrode C3 is not connected to the sensing electrode SE located in the second bridge electrode region BR2, that is, the third connection electrode C3 is separated from the sensing electrode SE located in the second bridge electrode region BR2. In other words, the third connection electrode C3 located in the second bridge electrode region BR2 may extend from the sensing electrode SE of the second sensing electrode region GR2, pass through each subpixel 100 of the second bridge electrode region BR2, and be connected to a sensing electrode SE of another second sensing electrode region GR2, so as to form the sensing electrode SE that transfers a signal vertically, so that a process is simplified and a yield is improved; however, the present disclosure is not limited thereto. For the sensing electrode SE of the second substrate 170 in this embodiment and a related description of the sensing electrode SE, reference may be made to the description in FIG. 8C. It should be noted that, some elements on the second substrate 170 are used for description. The third connection electrode C3 and the fourth connection electrode C4 only exists at an interlaced position (area) in the subpixel of the second bridge electrode region BR2. Moreover, the first connection electrode C1 and the second connection electrode C2 exist in the subpixels of the first sensing electrode region GR1 and the second sensing electrode region GR2.

Figure 10E:
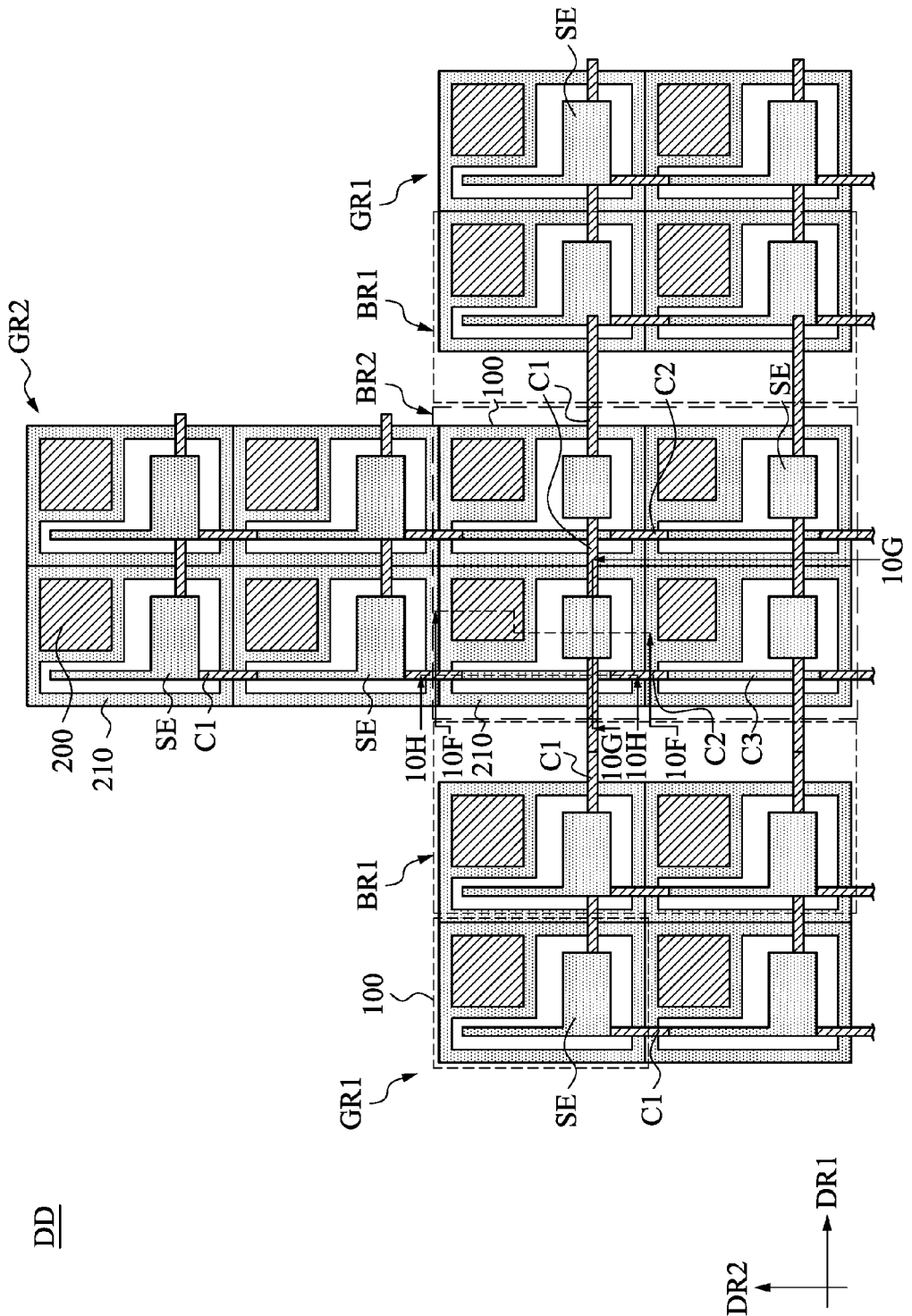
FIG. 10E is a schematic partial top view of a display panel according to some embodiments of the present disclosure.
Figure 10F:
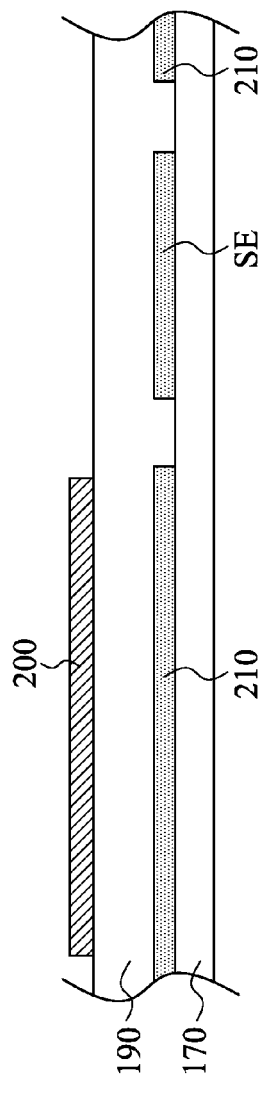
FIG. 10F is a schematic cross-sectional view along a line 10F-10F in FIG. 10E.

Alternatively, referring to FIG. 10E, FIG. 10E is a schematic partial top view of a second substrate 170 of the display panel DD according to some embodiments of the present disclosure. This embodiment is similar to the embodiment in FIG. 10A, and a difference lies in that an upper capacitor electrode 210 in this embodiment is located at a periphery of a sensing electrode SE to form a receiving area (or namely accommodated region), which may make it easy for the sensing electrode SE to be located in the receiving area. For example, reference may be made to the description in FIG. 8A. The display panel DD includes first connection electrodes C1, second connection electrodes C2, and third second connection electrodes C3.

Figure 10G:
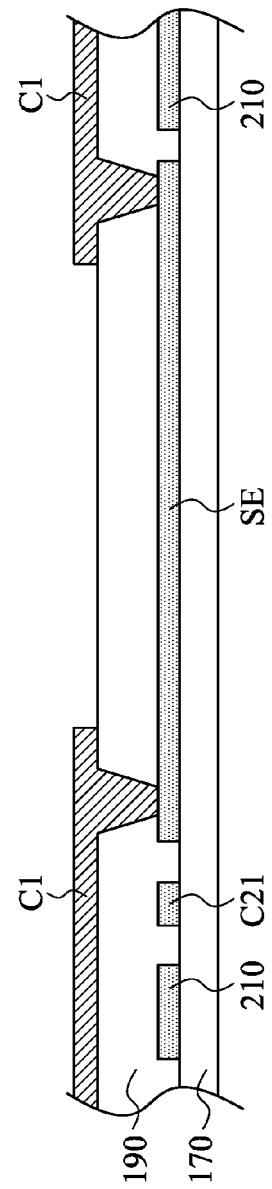
FIG. 10G is a schematic cross-sectional view along a line 10G-10G in FIG. 10E.
Figure 10H:
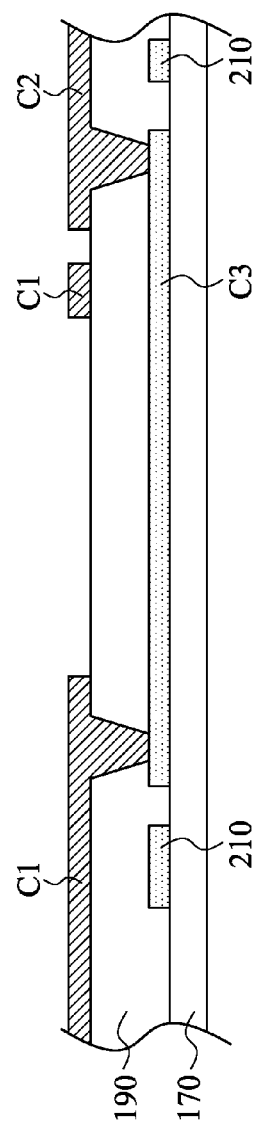
FIG. 10H is a schematic cross-sectional view along a line 10H-10H in FIG. 10E.

Referring to FIG. 10E to FIG. 10H, FIG. 10F is a schematic cross-sectional view along a line 10F-10F in FIG. 10E. FIG. 10G is a schematic cross-sectional view along a line 10G-10G in FIG. 10E. FIG. 10H is a schematic cross-sectional view along a line 10H-10H in FIG. 10E. In FIG. 10E to FIG. 10H, a related design on a first substrate is omitted, and for the related design on the first substrate, reference may be made to the foregoing embodiment. Herein, the first connection electrode C1, the second connection electrode C2, and a second capacitor electrode 200 are formed by a same patterned layer; however, the present disclosure is not limited thereto. The first connection electrode C1 traverses the upper capacitor electrode 210 to electrically connect a sensing electrode SE of a subpixel 100 and a sensing electrode SE of another subpixel 100, so as to enable sensing electrodes SE in a first sensing electrode region GR1 and in a second sensing electrode region GR2 to be electrically connected to each other, respectively. A third connection electrode C3 is located at each subpixel 100 of a second bridge electrode region BR2, to enable the sensing electrodes SE in the second sensing electrode region GR2 to be electrically connected, so as to form a sensing electrode SE that transfers a signal vertically. For example, the first connection electrodes C1 located between the subpixels 100 include connection electrodes that extend in a first direction DR1 and in a second direction DR2 different from the first direction DR1. The first connection electrode C1 of the first direction DR1 connects two transversely adjacent subpixels 100, so as to be electrically connected to the sensing electrode SE of each subpixel 100. The first connection electrode C1 in the second direction DR2 is adapted to connect sensing electrodes SE of two vertically adjacent subpixels 100.

The second connection electrode C2 is disposed on the second substrate 170, and extends and traverses the upper capacitor electrode 210 of each subpixel 100 located in the second bridge electrode region BR2, so as to be electrically connected to the third connection electrode C3 in the second bridge electrode region BR2, and further connect the sensing electrodes SE located in the second sensing electrode regions GR2. The second connection electrode C2 and the first connection electrode C1 are separated, and the third connection electrode C3 and the sensing electrodes SE located in the second bridge electrode region BR2 are separated. Preferably, the third connection electrode C3 and the sensing electrode SE of the second bridge electrode region BR2 may be formed by a same patterned layer. The third connection electrode C3 is not connected to the sensing electrodes SE located in the second bridge electrode region BR2, that is, the third connection electrode C3 and the sensing electrodes SE located in the second bridge electrode region BR2 are separated. The second connection electrode C2 and the first connection electrode C1 may be formed by a same patterned layer. In this way, the second connection electrode C2 located in the second bridge electrode region BR2 may extend from the third connection electrode C3, pass through each subpixel 100 of the second bridge electrode region BR2, and be connected to a sensing electrode SE of another second sensing electrode region GR2, so that a process is simplified and a yield is improved; however, the present disclosure is not limited thereto. It should be noted that, some elements on the second substrate 170 are used for description. Except that the designs of the connection electrodes and the sensing electrodes of the second bridge electrode region BR2 are different, subpixels of a first bridge electrode region BR1 have the first connection electrode C1, which has similar design to those in the subpixels of the first sensing electrode region GR1 and the second sensing electrode region GR2.

Various position designs of sensing electrodes are described above. It should be understood that, the film layers of the sensing electrode and the connection electrode are not limited to being on a same layer as the upper capacitor electrode 210 and the second capacitor electrode 200. In addition to the foregoing manner of configuring the sensing electrode, in at least one of the embodiments of the present disclosure, it may be further configured that the sensing electrode and another film layer are formed at the same time.

Figure 11A:
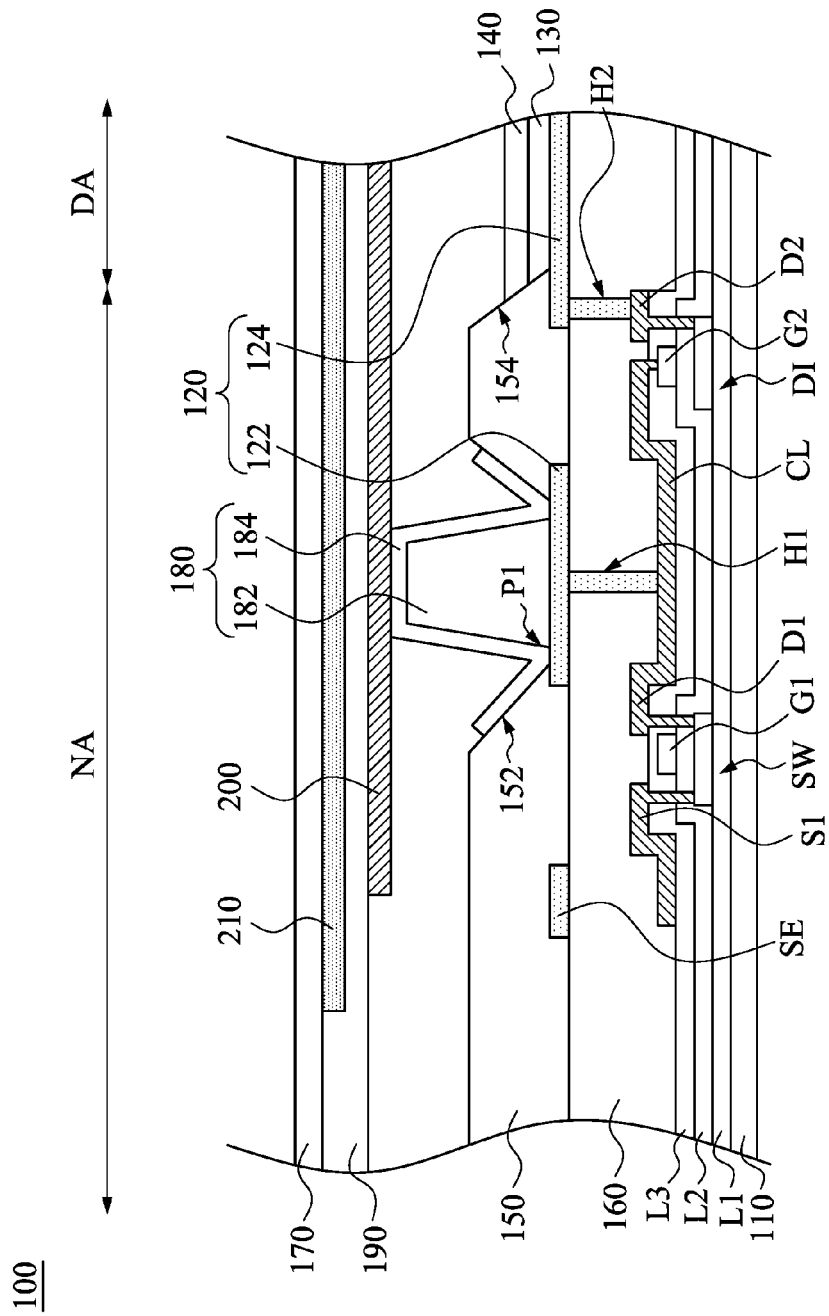
FIG. 11A is a schematic cross-sectional view of a subpixel of a display panel according to a ninth embodiment of the present disclosure.
Figure 11B:
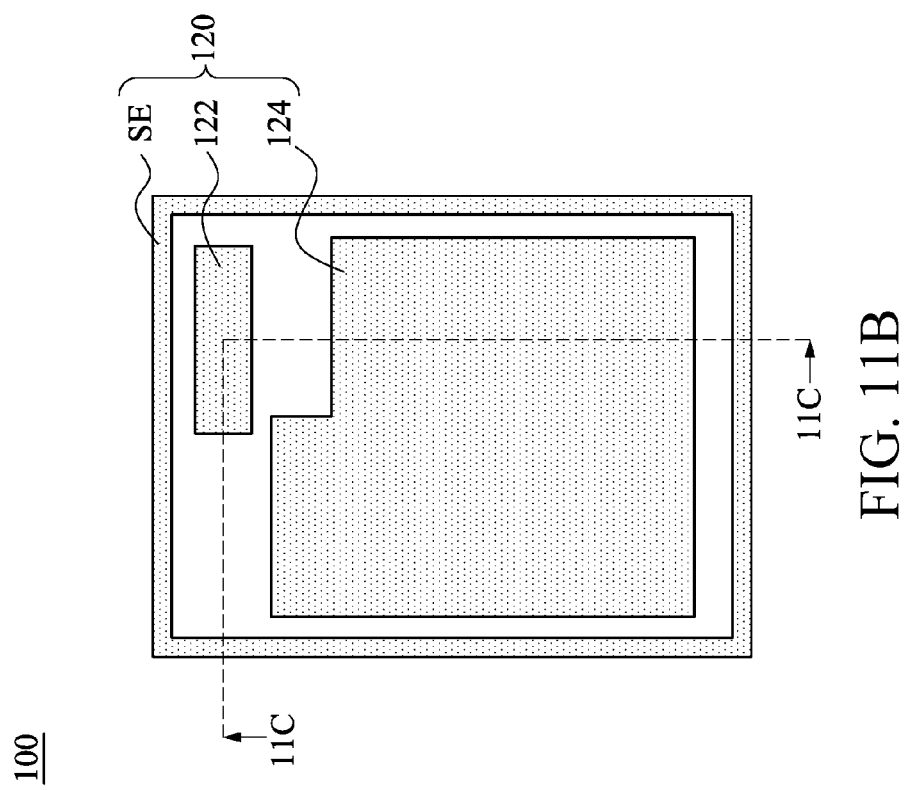
FIG. 11B is a schematic top view of some elements of a first substrate of the subpixel of the display panel in FIG. 11A.
Figure 11C:
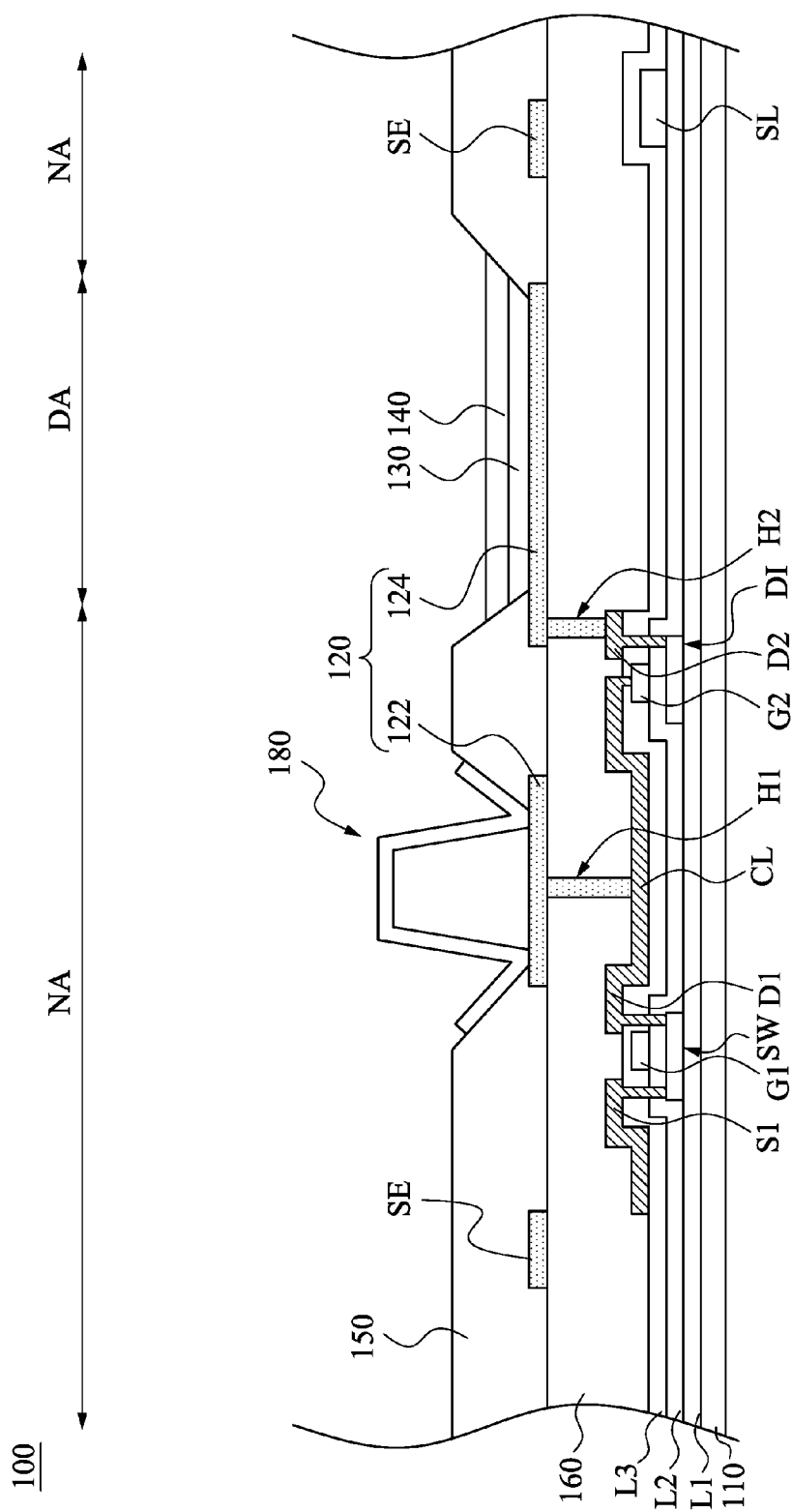
FIG. 11C is a schematic cross-sectional view along a line 11C-11C in FIG. 11B.

FIG. 11A is a schematic cross-sectional view of a subpixel 100 of a display panel according to a ninth embodiment of the present disclosure. FIG. 11B is a schematic top view of some elements of a first substrate 110 of the subpixel 100 of the display panel in FIG. 11A. FIG. 11C is a schematic cross-sectional view along a line 11C-11C in FIG. 11B. In FIG. 11C, a related design on a second substrate is omitted, and for the related design on the second substrate, reference may be made to the foregoing embodiment. The subpixel 100 in this embodiment is similar to the subpixel 100 in the embodiment in FIG. 4, and a difference lies in that a patterned electrode layer 120 of this embodiment further includes a sensing electrode SE. The sensing electrode SE is partially overlapped with a non-light emitting area NA, where a pixel electrode 124 and a first capacitor electrode 122 of each subpixel 100 are both separated from the sensing electrode SE.

In this embodiment, the configuration manner, for example, a non-interlaced embodiment, in FIG. 7A, FIG. 7E or FIG. 7F is used. The sensing electrodes SE may be disposed on a first sensing electrode regions GR1 and a second sensing electrode regions GR2 of the first substrate 110, and the sensing electrode SE of the first sensing electrode region GR1 and the sensing electrode SE of the second sensing electrode region GR2 are separated. In another embodiment, the display panel may selectively include at least one third sensing electrode region GR3, the sensing electrode SE may be disposed in the third sensing electrode region GR3 of the first substrate 110, and the sensing electrode SE of the first sensing electrode region GR1, the sensing electrode SE of the second sensing electrode region GR2, and the sensing electrode SE of the third sensing electrode region GR3 are separated. Reference may be made to the foregoing embodiments for the rest, which is no longer elaborated herein.

Same as that discussed above, the display panel may selectively include a bank 150, disposed on a passivation layer 160 and having a first opening 152 and a second opening 154. The first opening 152 does not cover (or namely not shield) at least a part of the first capacitor electrode 122, that is, the first opening 152 uncovers (or referred to as "shows" or "exposes") at least a part of the first capacitor electrode 122. The second opening 154 does not cover at least a part of the pixel electrode 124, that is, the second opening 154 uncovers (or referred to as "shows" or "exposes") at least a part of the pixel electrode 124. In other words, the first opening 152 is vertically projected on the first capacitor electrode 122, and the first opening 152 and the first capacitor electrode 122 are at least partially overlapped. It may be seen that the first opening 152 is located on at least a part of the first capacitor electrode 122. The second opening 154 is vertically projected on the pixel electrode 124, and the second opening 154 and the pixel electrode 124 are at least partially overlapped. It may be seen that the second opening 154 is located on at least a part of the pixel electrode 124. An electroluminescent layer 130 and a counter electrode 140 are located in the second opening 154, a conductive bump 180 is located in the first opening 152, and a top portion of the conductive bump 180 is in contact with a capacitor dielectric layer 190 or a second capacitor electrode 200 of the second substrate 170, so as to form a structure of a storage capacitor (a capacitor element CA) in this embodiment. Herein, the bank 150 covers the sensing electrode SE, and the conductive bump 180 is also separated from the sensing electrode SE.

Therefore, the sensing electrodes SE are located at peripheries of the first capacitor electrode 122 and the pixel electrode 124. For example, the sensing electrodes SE surround the first capacitor electrode 122 and the pixel electrode 124. The first capacitor electrode 122 may be electrically connected to an end D1 of a switch element SW and a second gate G2 of a driving element DI through a first contact hole H1 of the passivation layer 160 via a connection wire CL. The pixel electrode 124 may be electrically connected to an end D2 of the driving element DI through a second contact hole H2 of the passivation layer 160. Therefore, an extra connection line no longer needs to be designed to respectively supply a voltage to the first capacitor electrode 122 and the pixel electrode 124. Other details in this embodiment are substantially the same as those discussed above, and are no longer elaborated herein.

Figure 12A:
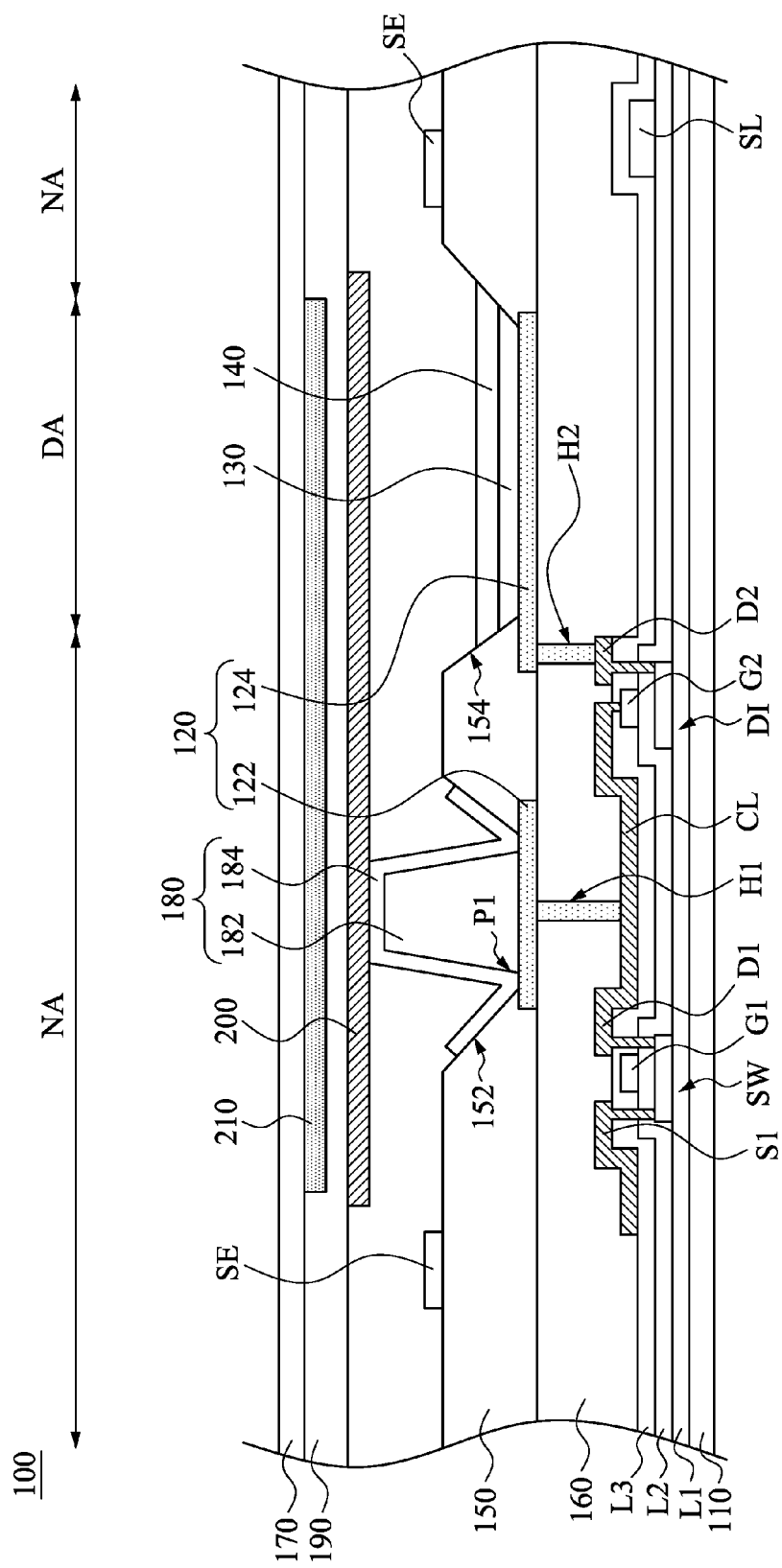
FIG. 12A is a schematic cross-sectional view of a subpixel of a display panel according to a tenth embodiment of the present disclosure.
Figure 12B:
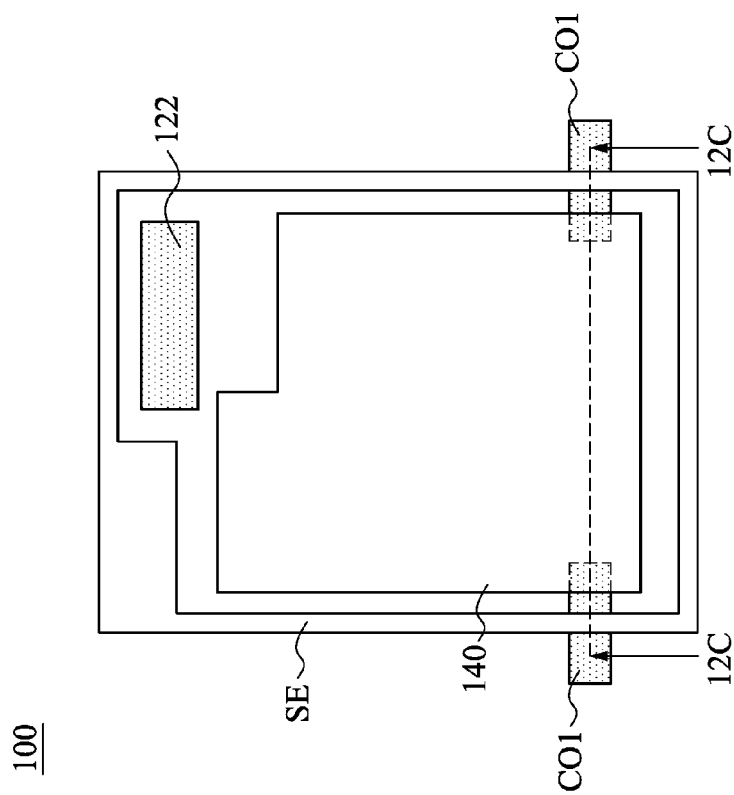
FIG. 12B is a schematic top view of some elements of a first substrate of the subpixel of the display panel in FIG. 12A.
Figure 12C:
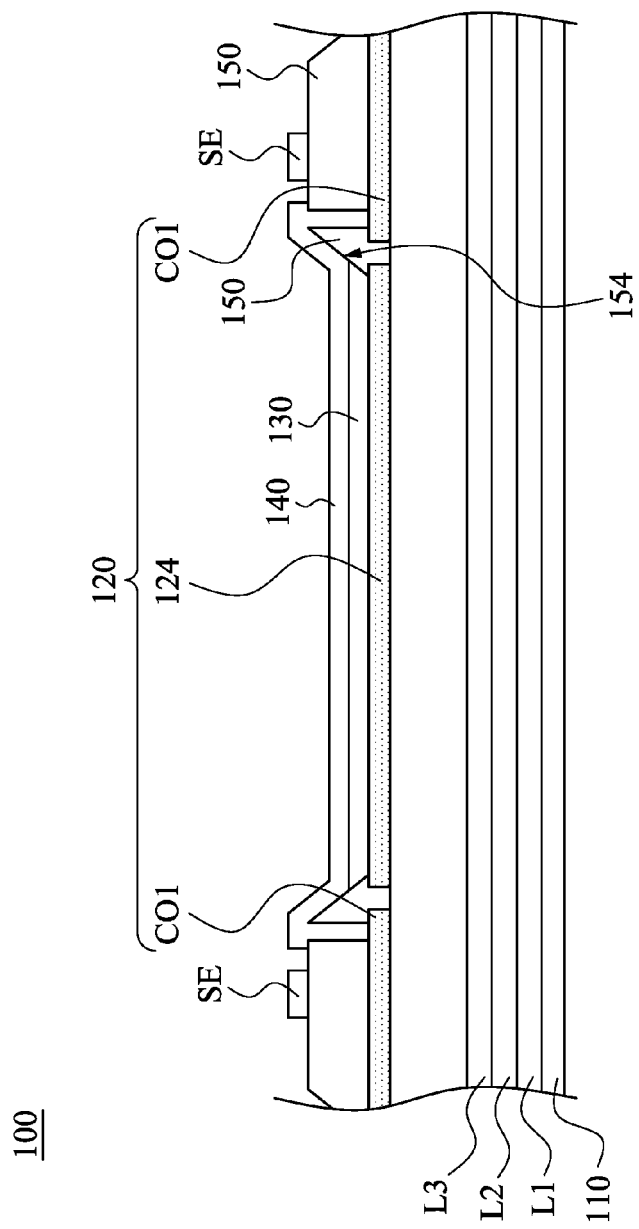
FIG. 12C is a schematic cross-sectional view along a line 12C-12C in FIG. 12B.

FIG. 12A is a schematic cross-sectional view of a subpixel 100 of a display panel according to a tenth embodiment of the present disclosure. FIG. 12B is a schematic top view of some elements of a first substrate 110 of the subpixel 100 of the display panel in FIG. 12A. FIG. 12C is a schematic cross-sectional view along a line 12C-12C in FIG. 12B. In FIG. 12C, a related design on a second substrate is omitted, and for the related design on the second substrate, reference may be made to the foregoing embodiment. The subpixel 100 in this embodiment is similar to the subpixel 100 in the embodiment in FIG. 4, and a difference lies in that the display panel in this embodiment further includes sensing electrodes SE, respectively disposed in a first sensing electrode region GR1 and a second sensing electrode regions GR2 (referring to FIG. 7A, FIG. 7E or FIG. 7F), and the sensing electrodes SE are partially overlapped with a non-light emitting area NA. A pixel electrode 124, a counter electrode 140, and a first capacitor electrode 122 of each subpixel 100 are all separated from the sensing electrodes SE. A conductive bump 180 is also separated from the sensing electrodes SE. The sensing electrodes SE of the first sensing electrode region GR1 and the sensing electrodes SE of the second sensing electrode region GR2 (referring to FIG. 7A, FIG. 7E or FIG. 7F) are separated. In another embodiment, the display panel may selectively include at least one third sensing electrode region GR3, the sensing electrode SE may be disposed in the third sensing electrode region GR3 of the first substrate 110, and the sensing electrodes SE of the first sensing electrode region GR1, the sensing electrodes SE of the second sensing electrode region GR2, and the sensing electrodes SE of the third sensing electrode region GR3 are separated. Reference may be made to the foregoing embodiments for the rest, which is no longer elaborated herein.

Herein, the sensing electrode SE and the counter electrode 140 are formed by a same patterned layer. In multiple embodiments of the present disclosure, the sensing electrodes SE surround the counter electrode 140 to form a closed space. In one of the embodiments of the present disclosure, the display panel further includes at least one first connection electrode CO1, disposed between two adjacent subpixels of the first sensing electrode regions GR1 and the second sensing electrode regions GR2 (referring to FIG. 7A, FIG. 7E or FIG. 7F), respectively, so as to connect the counter electrodes 140 of the subpixels 100. The pixel electrode 124, the sensing electrode SE, and the first capacitor electrode 122 of each subpixel 100 are all separated from the first connection electrode CO1. The first connection electrode CO1 is disposed to be across the sensing electrode SE, so that counter electrodes 140 of adjacent subpixels are electrically connected. Preferably, the first connection electrode CO1 and the pixel electrode 124 are formed by a same patterned layer; however, the present disclosure is not limited thereto.

As discussed above, the display panel includes a bank 150, disposed on a passivation layer 160 of the first substrate 110 and having a first opening 152 and a second opening 154. The first opening 152 does not cover (or namely not shield) at least a part of the first capacitor electrode 122, that is, the first opening 152 uncovers (or referred to as "shows" or "exposes") at least a part of the first capacitor electrode 122. The second opening 154 does not cover at least a part of the pixel electrode 124, that is, the second opening 154 uncovers (or referred to as "shows" or "exposes") at least a part of the pixel electrode 124. In other words, the first opening 152 is vertically projected on the first capacitor electrode 122, and the first opening 152 and the first capacitor electrode 122 are at least partially overlapped. It may be seen that the first opening 152 is located on at least a part of the first capacitor electrode 122. The second opening 154 is vertically projected on the pixel electrode 124, and the second opening 154 and the pixel electrode 124 are at least partially overlapped. It may be seen that the second opening 154 is located on at least a part of the pixel electrode 124. An electroluminescent layer 130 and the counter electrode 140 are located in the second opening 154, the conductive bump 180 is located in the first opening 152, and a top portion of the conductive bump 180 is in contact with a capacitor dielectric layer 190 or a second capacitor electrode 200 of the second substrate 170, so as to form a structure of a storage capacitor (a capacitor element CA) in this embodiment. The sensing electrodes SE are disposed on the bank 150, and the bank 150 covers the first connection electrode CO1. Other details in this embodiment are substantially the same as those discussed above, and are no longer elaborated herein.

It should be understood that, although details are not shown herein, a vertical projection of the foregoing sensing electrode SE on the first substrate 110 may be partially overlapped with a vertical projection of a scan line SL, a power line PL or a data line DL on the first substrate 110, so as to reduce the influence on a light-transmission area (for example, a light emitting area DA). In another embodiment, the foregoing sensing electrode SE may also be not overlapped with the scan line SL, the power line PL or the data line DL.

Figure 13A:
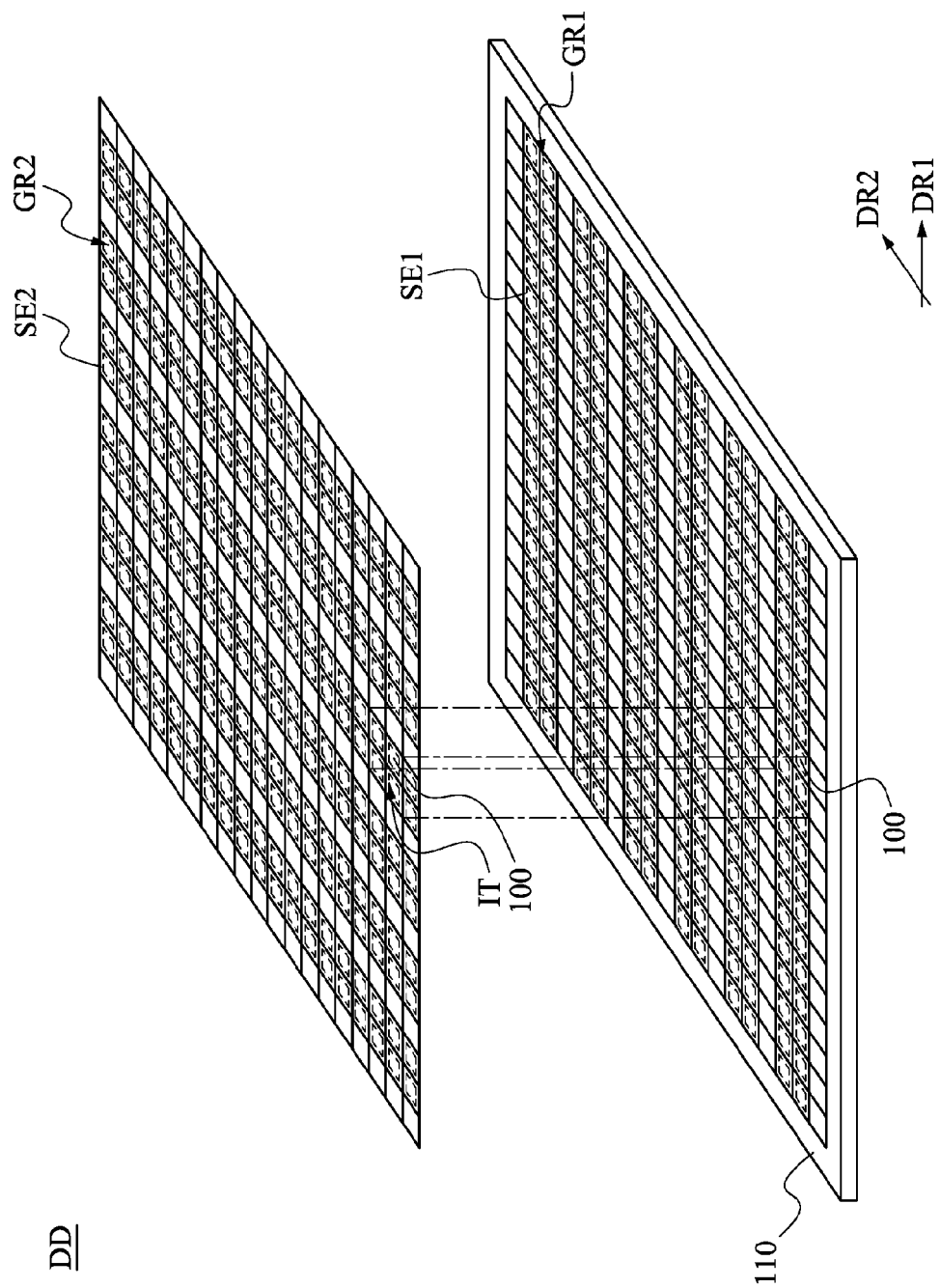
FIG. 13A is a schematic perspective view of a display panel according to an eleventh embodiment of the present disclosure.

FIG. 13A is a schematic perspective view of a display panel DD according to an eleventh embodiment of the present disclosure. This embodiment is similar to the foregoing embodiment, and a difference lies in that the display panel DD in this embodiment has at least one first sensing electrode region GR1 on the first substrate 110, and at least one second sensing electrode region GR2 on the second substrate 170 that is interlaced with and separated from the first sensing electrode region GR1. Herein, the first sensing electrode region GR1 extends in a first direction DR1, and a second sensing electrode region GR2 extends in a second direction DR2. The second direction DR2 is not parallel to the first direction DR1, that is, the first direction DR1 and the second direction DR2 are interlaced (or namely crossover). In multiple embodiments of the present disclosures, for example, the first direction DR1 and the second direction DR2 are set to be perpendicular to each other; however, the present disclosure is not limited thereto. At least one interlaced area IT is provided at an interlaced position (or namely crossover position) between the first sensing electrode region GR1 and the second sensing electrode region GR2. The display panel DD further includes at least one first sensing electrode SE1 and at least one second sensing electrode SE2, respectively disposed in subpixels 100 of the first sensing electrode region GR1 and the second sensing electrode region GR2. The first sensing electrode SE1 and the second sensing electrode SE2 are interlaced in the interlaced area IT, that is, the interlaced area IT includes the first sensing electrode SE1 and the second sensing electrode SE2 and related fitting elements.

Figure 13B:
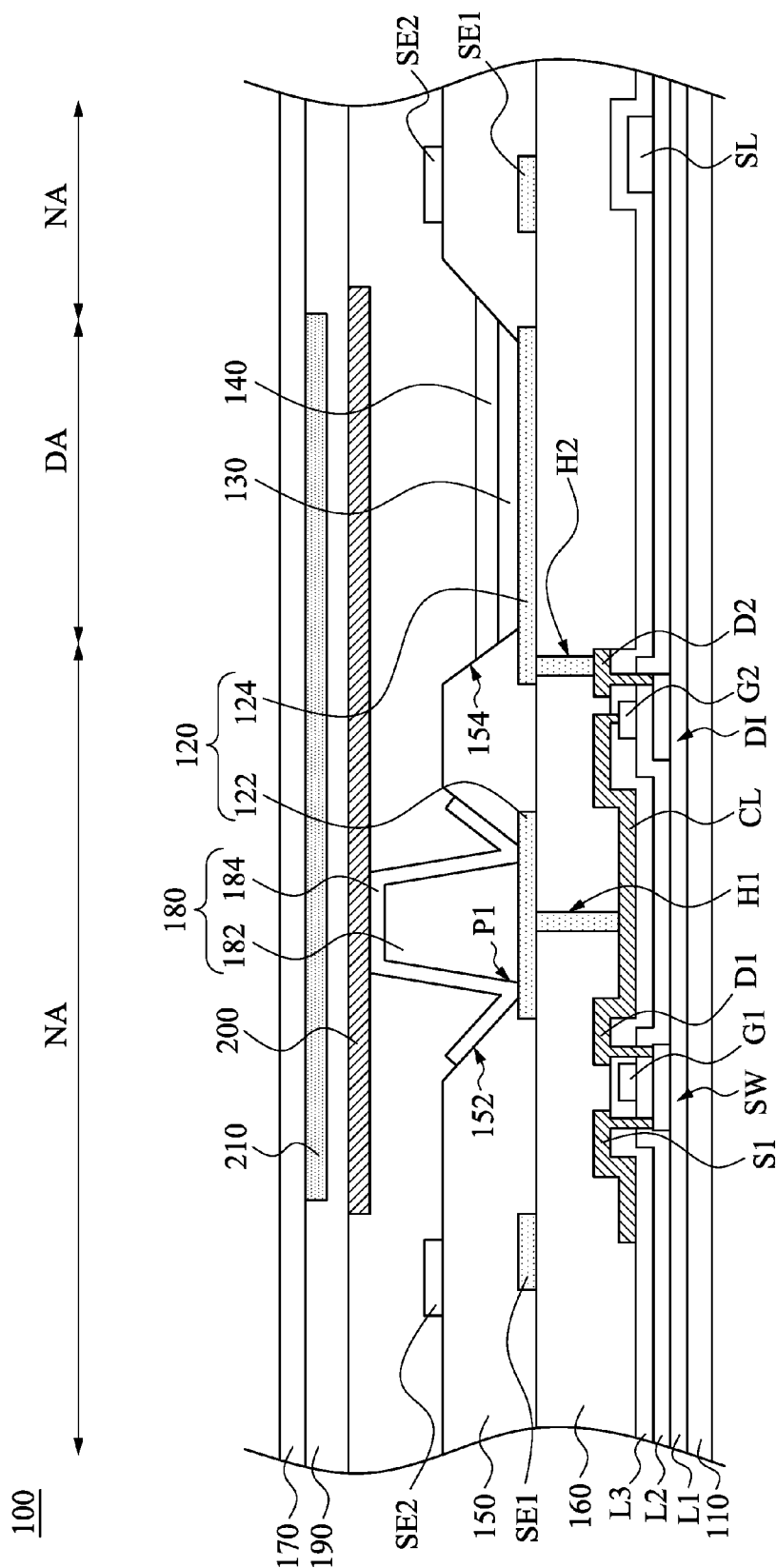
FIG. 13B is a schematic cross-sectional view of a subpixel of the display panel in FIG. 13A in an interlaced area.

FIG. 13B is a schematic cross-sectional view of the subpixel 100 of the display panel in FIG. 13A in the interlaced area IT. Referring to both FIG. 13A and FIG. 13B, specifically, the first sensing electrodes SE1 belong to a patterned electrode layer 120 and are disposed in subpixels 100 of the first sensing electrode region GR1 of the first substrate 110. The first sensing electrode SE1 and a non-light emitting area NA of the subpixel are partially overlapped. A pixel electrode 124 and a first capacitor electrode 122 of each subpixel 100 are both separated from the first sensing electrode SE1. Preferably, the pixel electrode 124, the first capacitor electrode 122, and the first sensing electrode SE1 are formed by a same patterned layer; however, the present disclosure is not limited thereto. A bank 150 covers the first sensing electrode SE1. The second sensing electrodes SE2 are respectively disposed in subpixels 100 of the second sensing electrode region GR2 of the first substrate 110. The second sensing electrode SE2 and the non-light emitting area NA of the subpixel are partially overlapped. The second sensing electrode SE2 is disposed on the bank 150 (for example, a top surface, or namely top portion), and a counter electrode 140 of each subpixel 100 and the second sensing electrode SE2 are separated. Preferably, the second sensing electrode SE2 and the counter electrode 140 are formed by a same patterned layer. The first sensing electrode SE1 and the second sensing electrode SE2 are separated; however, the present disclosure is not limited thereto.

Figure 13C:
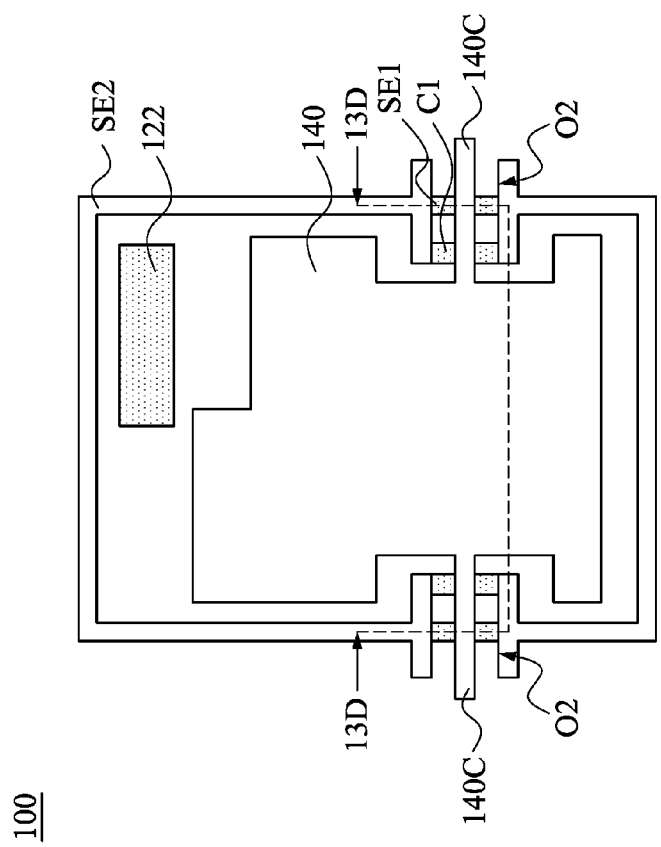
FIG. 13C is a schematic top view of some elements of a first substrate of the subpixel of the display panel in FIG. 13B.
Figure 13D:
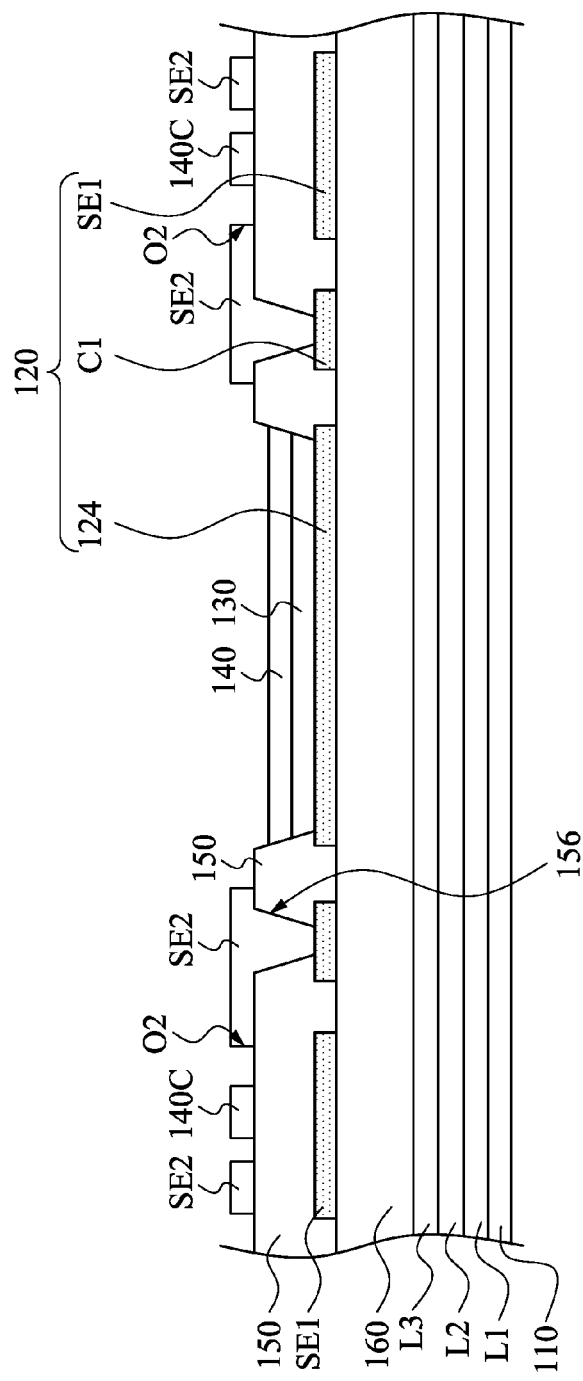
FIG. 13D is a schematic cross-sectional view along a line 13D-13D in FIG. 13C.

FIG. 13C is a schematic top view of some elements of the subpixel 100 of the first substrate of the display panel in FIG. 13B. FIG. 13D is a schematic cross-sectional view along a line 13D-13D in FIG. 13C, and elements on a second substrate 170 are omitted. Referring to FIG. 13B to FIG. 13D at the same time, in this embodiment, the first sensing electrodes SE1 are disposed below the second sensing electrodes SE2 and are located at peripheries of the first capacitor electrode 122 and the pixel electrode 124. For example, the first sensing electrodes SE1 surround the first capacitor electrode 122 and the pixel electrode 124.

In one of the embodiments of the present disclosure, the display panel further includes at least one first connection electrode C1 and at least one second connection electrode 140C. The first connection electrode C1 is disposed at each subpixel 100 of the first substrate 110, so as to connect the second sensing electrodes SE2 of each subpixel 100. The second sensing electrodes SE2 of each subpixel 100 are separated from the counter electrodes 140 where the second sensing electrodes SE2 are located. The second connection electrode 140C is disposed at each subpixel 100 of the first substrate 110, and the second connection electrode 140C is located on the bank 150 (for example, a top surface) and connects counter electrodes 140 of two adjacent subpixels 100 in an interlaced area IT (referring to FIG. 13A and FIG. 13D). Specifically, the second sensing electrode SE2 includes an opening O2. The second connection electrode 140C passes through (extends through) the opening O2 and is electrically connected to a counter electrode (not shown) of another subpixel. The first connection electrode C1 may be across (or namely crossover) the opening O2 to electrically connect second sensing electrodes SE2 on two sides of the second connection electrode 140C.

Referring to FIG. 13A to FIG. 13D at the same time, it should be noted that, in addition to the interlaced area IT, the first sensing electrode region GR1 (extending in the first direction DR1) includes at least one first sensing electrode SE1 and other related elements (some elements on the first substrate 110 as an example: the thin film transistor, the pixel electrode 124, the first capacitor electrode 122, a conductive bump 180, the counter electrode 140, the second connection electrode 140C, and the like), but does not include the first connection electrode C1 and the second sensing electrode SE2. In addition to the interlaced area IT, the second sensing electrode region GR2 (extending in the second direction DR2) includes at least one second sensing electrode SE2 and other related elements (some elements on the first substrate 110 as an example: the thin film transistor, the pixel electrode 124, the first capacitor electrode 122, the counter electrode 140, the conductive bump 180, the first connection electrode C1, the second connection electrode 140C, and the like), but does not include at least one first sensing electrode SE1. Therefore, the subpixel in the interlaced area IT not only includes the foregoing embodiment (for example, one of FIG. 1 to FIG. 6) forming the present disclosure, but also includes the first sensing electrode SE1, the second sensing electrode SE2, the first connection electrode C1, the second connection electrode 140C, and related elements.

In one of the embodiments of the present disclosure, the bank 150 further covers the first sensing electrode SE1 and a part of the first connection electrode C1, and the second connection electrode 140C is located on the bank 150. The bank 150 may further include, in addition to the foregoing first opening 152 and the foregoing second opening 154, a plurality of openings 156. A conductive material is filled in the openings 156 to electrically connect the first connection electrode C1 and the second sensing electrode SE2.

In multiple embodiments of the present disclosure, the first connection electrode C1, the first capacitor electrode 122, the first sensing electrode SE1, and the pixel electrode 124 are formed by a same patterned layer. The second sensing electrode SE2, the second connection electrode 140C, and the counter electrode 140 are formed by a same patterned layer. Preferably, in the interlaced area IT, it may be configured that a vertical projection of the second sensing electrode SE2 on the patterned electrode layer 120 (that is, the first substrate 110) is at least partially overlapped with the first sensing electrode SE1, so as to achieve a desirable sensing effect; however, the present disclosure is not limited thereto. Other details in this embodiment are substantially the same as those discussed above, and are no longer elaborated herein.

Figure 14A:
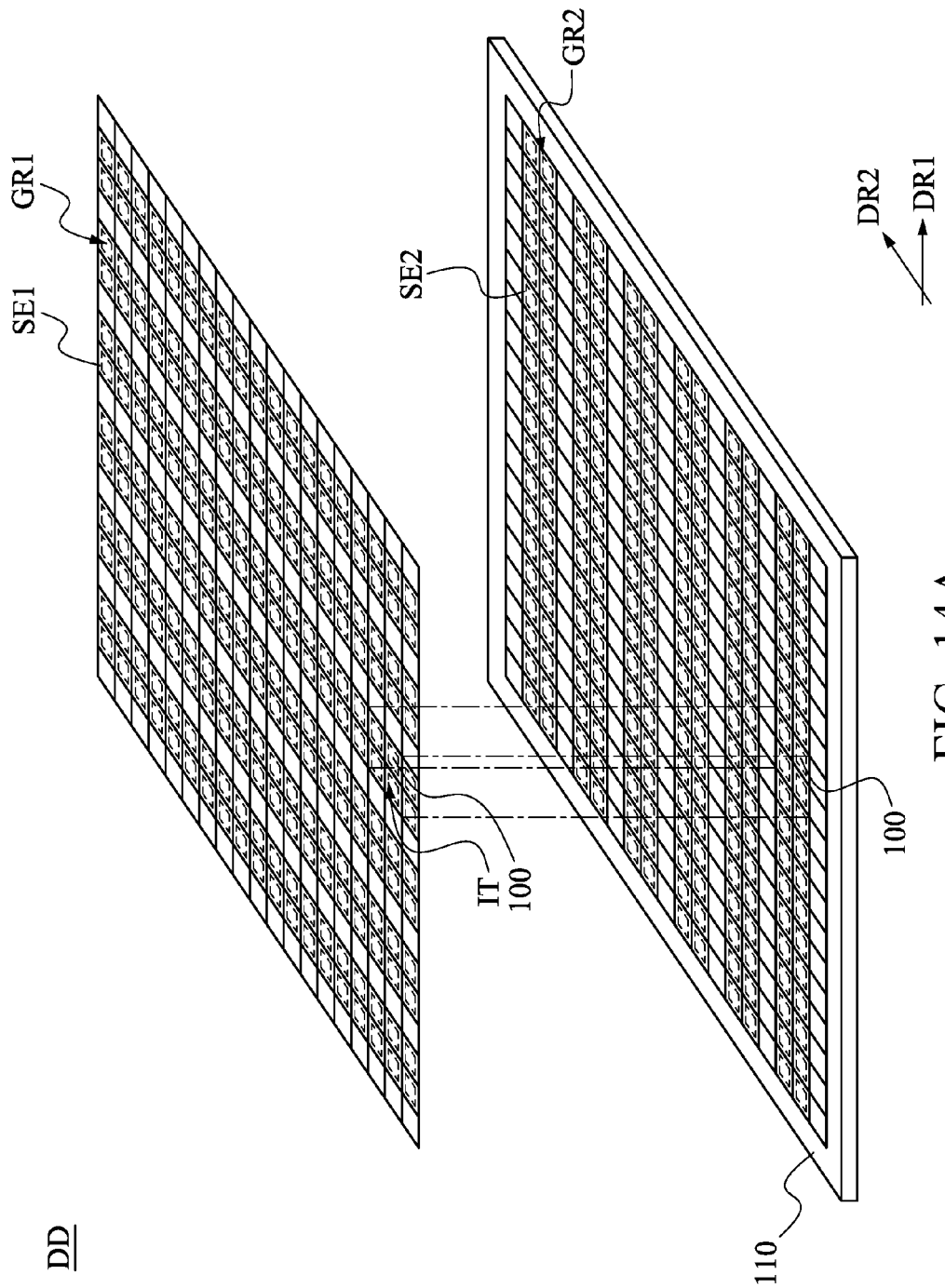
FIG. 14A is a schematic perspective view of a display panel according to a twelfth embodiment of the present disclosure.
Figure 14B:
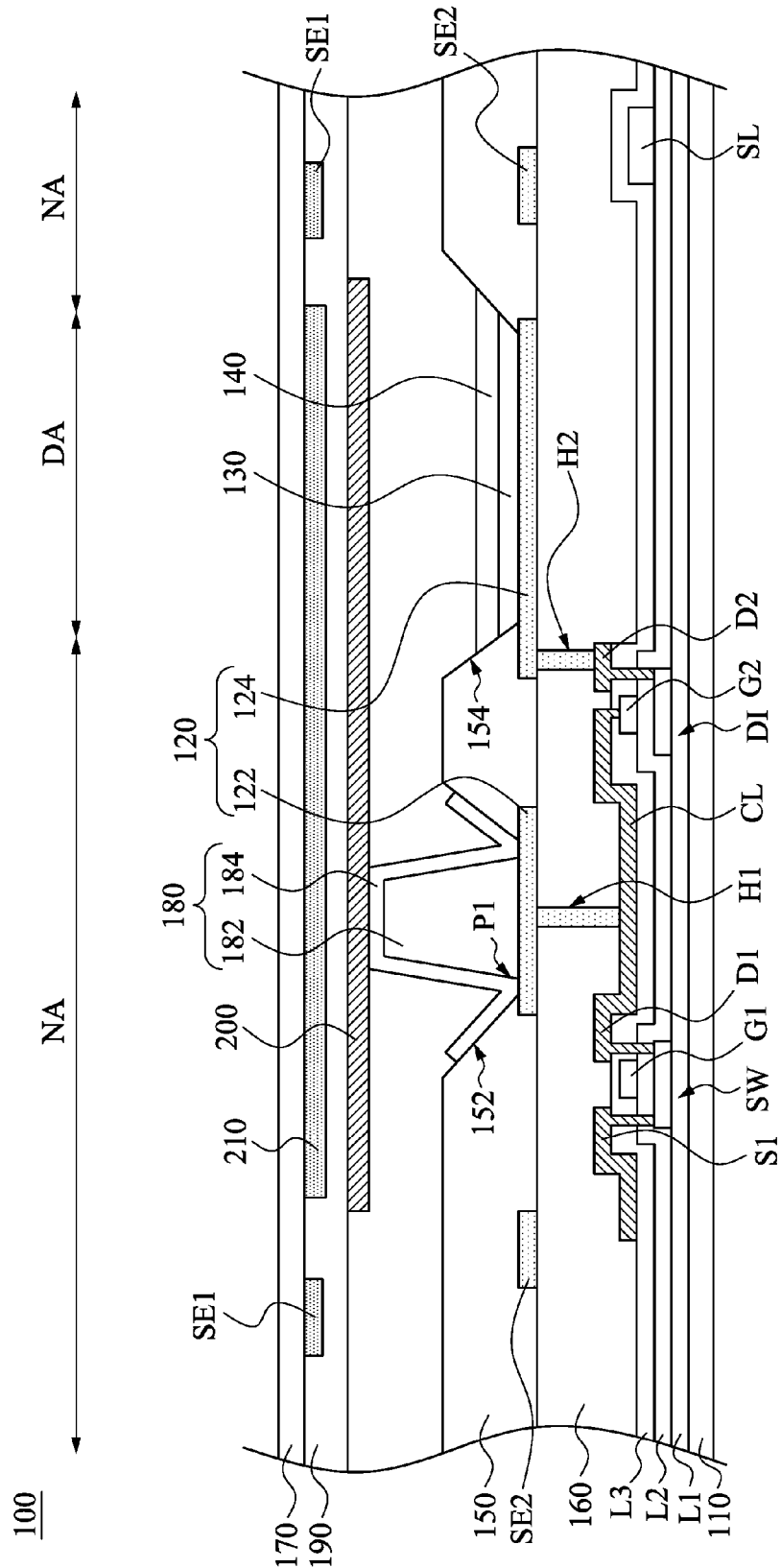
FIG. 14B is a schematic cross-sectional view of a subpixel of the display panel in FIG. 14A in an interlaced area.

FIG. 14A is a schematic perspective view of a display panel DD according to a twelfth embodiment of the present disclosure. FIG. 14B is a schematic cross-sectional view of a subpixel 100 of the display panel in FIG. 14A in an interlaced area IT. FIG. 14C is a schematic top view of some elements of a second substrate 170 (on the right side of FIG. 14C) and some elements of a first substrate 110 (on the left side of FIG. 14C) of the subpixel 100 of the display panel in FIG. 14B. A cross-sectional view of a schematic top view of some elements of the second substrate 170 of the subpixel 100 in this embodiment is similar to that in FIG. 7D. A schematic top view and a cross-sectional view of some elements of the first substrate 110 of the subpixel 100 in this embodiment are similar to the cross-sectional view in FIG. 11A and the schematic top view of some elements of the first substrate 110 in FIG. 11B. A major difference lies in that the display panel of this embodiment includes at least one first sensing electrode SE1 located on the second substrate 170 and at least one second sensing electrode SE2 located on the first substrate 110. However, in the embodiment in FIG. 7D, only a sensing electrode is provided on the second substrate 170, or in the embodiment in FIG. 11A and FIG. 11B, only a sensing electrode is provided on the first substrate 110.

The first sensing electrodes SE1 are respectively disposed at each subpixel 100 of a first sensing electrode region GR1 of the second substrate 170. The first sensing electrodes SE1 are connected to each other. The first sensing electrodes SE1 and a non-light emitting area NA of the subpixel are at least partially overlapped. An upper capacitor electrode 210 and a second capacitor electrode 200 of each subpixel 100 are both separated from the first sensing electrode SE1. The second sensing electrodes SE2 are disposed at each subpixel 100 of a second sensing electrode region GR2 of a first substrate 110 and are connected to each other, and the second sensing electrodes SE2 and the non-light emitting area NA of the subpixel are at least partially overlapped. A pixel electrode 124 and a first capacitor electrode 122 of each subpixel 100 are both separated from the second sensing electrode SE2.

In this embodiment, the display panel further includes at least one first connection electrode C1 and at least one second connection electrode C2. The first connection electrode C1 is disposed each subpixel 100 of the second substrate 170, so as to connect the first sensing electrodes SE1 of each subpixel 100. The second capacitor electrode 200 of each subpixel 100 and each first connection electrode C1 where the second capacitor electrode 200 is located are formed by a same patterned layer, and are separated from each other. The second connection electrode C2 is disposed at each subpixel 100 of the second substrate 170 and connects upper capacitor electrodes 210 of two adjacent subpixels 100, and the first connection electrode C1 and the second connection electrode C2 are interlaced.

Referring to FIG. 14A to FIG. 14C at the same time, it should be noted that, in addition to the interlaced area IT, the first sensing electrode region GR1 (extending in a first direction DR1) includes at least one first sensing electrode SE1 and other related elements (some elements on the second substrate 170 as an example: the upper capacitor electrode 210, the first connection electrode C1, the second connection electrode C2, and the like); however, the first substrate 110 does not include a second sensing electrode SE2. In addition to the interlaced area IT, the second sensing electrode region GR2 (extending in a second direction DR2) includes at least one second sensing electrode SE2 and other related elements (some elements on the first substrate 110 as an example: the thin film transistor, the pixel electrode 124, the conductive bump 180, the first capacitor electrode 122, and the like); however, the second substrate 170 does not include at least one first sensing electrode SE1 and the first connection electrode C1. Therefore, the subpixel in the interlaced area IT not only includes the foregoing embodiment (for example, one of FIG. 1 to FIG. 6) forming the present disclosure, but also includes the first sensing electrode SE1, the second sensing electrode SE2, the first connection electrode C1, the second connection electrode C2, and related elements.

As shown in FIG. 14B, in this embodiment, a bank 150 covers the second sensing electrode SE2 of the first substrate 110. A capacitor dielectric layer 190 covers the first sensing electrode SE1 of the second substrate 170, the second connection electrode C2, and the upper capacitor electrode 210. The first connection electrode C1 is located on the capacitor dielectric layer 190.

In this embodiment, preferably, the first sensing electrode SE1 and the upper capacitor electrode 210 are formed by a same patterned layer. The second sensing electrode SE2, the pixel electrode 124, and the first capacitor electrode 122 are formed by a same patterned layer; however, the present disclosure is not limited thereto. The first sensing electrode SE1 has an opening O1. The second connection electrode C2 passes through (extends through) the opening O1 to electrically connect the upper capacitor electrode 210 and an upper capacitor electrode (not shown) of another subpixel. The first connection electrode C1 is across the opening O1 and electrically connects the first sensing electrodes SE1 on two sides of the second connection electrode C2. The second sensing electrodes SE2 are located at peripheries of the first capacitor electrode 122 and the pixel electrode 124. For example, the second sensing electrodes SE2 surround the first capacitor electrode 122 and the pixel electrode 124. In one of the embodiments, in the interlaced area IT, a vertical projection of the first sensing electrode SE1 on the first substrate 110 is partially overlapped with the second sensing electrode SE2. Other details in this embodiment are substantially the same as those discussed above, and are no longer elaborated herein.

Figure 15A:
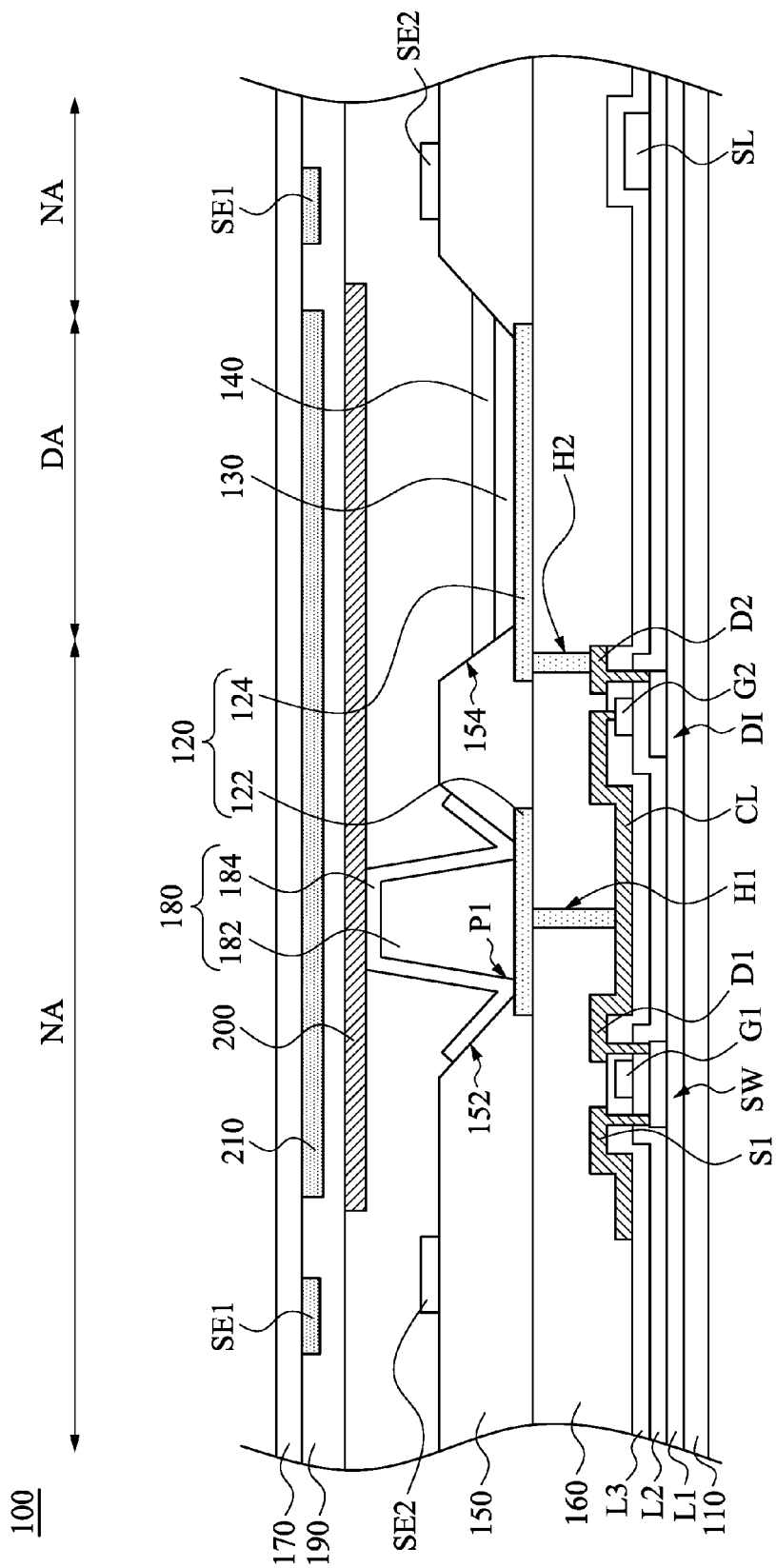
FIG. 15A is a schematic cross-sectional view of a subpixel of a display panel in an interlaced area according to a thirteenth embodiment of the present disclosure.
Figure 15B:
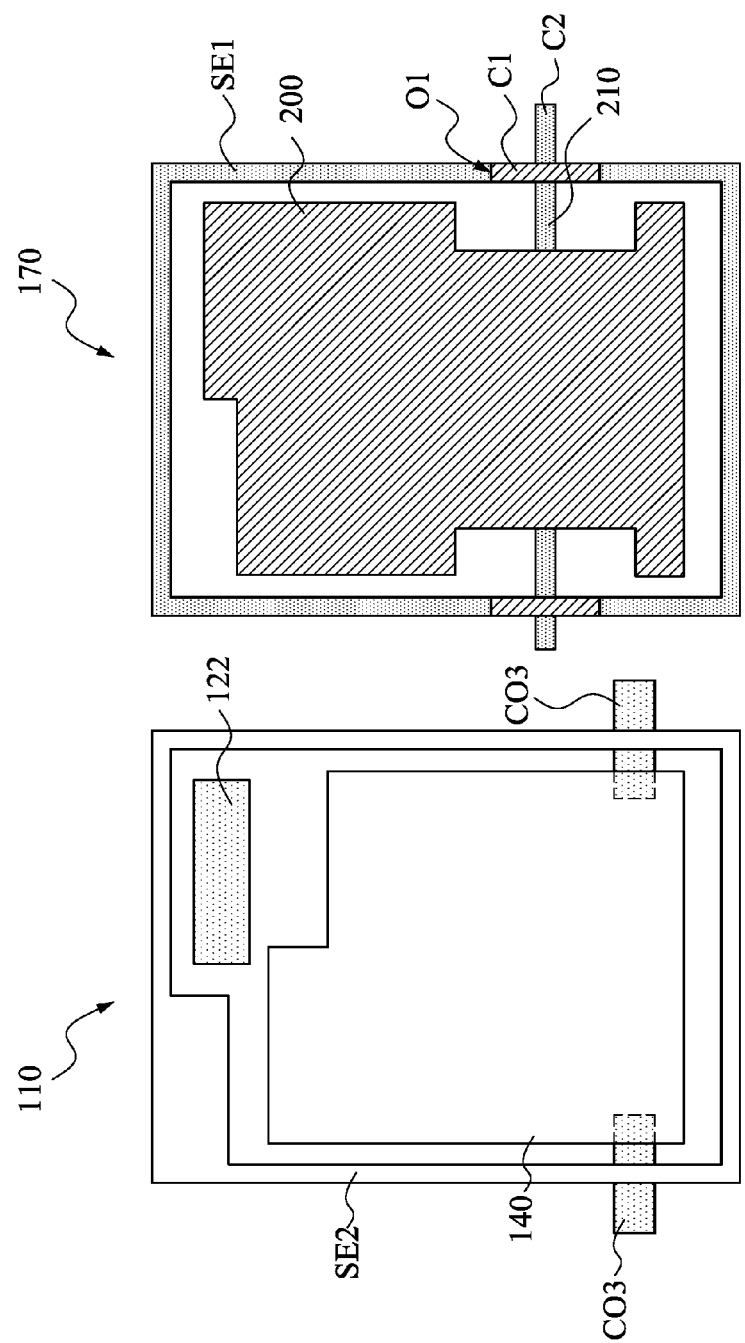
FIG. 15B is a schematic top view of some elements of a first substrate and some elements of a second substrate of the subpixel of the display panel in FIG. 15A.

FIG. 15A is a schematic cross-sectional view of a subpixel 100 of a display panel in an interlaced area IT (referring to FIG. 14A) according to a thirteenth embodiment of the present disclosure. FIG. 15B is a schematic top view of some elements of a second substrate 170 of the subpixel 100 (on the right side of FIG. 15B) and some elements of a first substrate 110 of the subpixel (on the left side of FIG. 15B) of the display panel in FIG. 15A. A cross-sectional view of a schematic top view of some elements of the second substrate 170 of the subpixel 100 in this embodiment and a schematic top view and a cross-sectional view of some elements of the first substrate 110 of the subpixel 100 in the embodiment in FIG. 7C and in this embodiment are similar to the cross-sectional view in FIG. 12A and the schematic top view of some elements of the first substrate 110 in FIG. 12B, and a major difference lies in that: the display panel includes at least one first sensing electrode SE1 located on the second substrate 170 and at least one second the sensing electrode SE2 located on the first substrate 110. However, in the embodiment in FIG. 7C, only the sensing electrode is provided on the second substrate 170, or in the embodiment in FIG. 12A and FIG. 12B, only the sensing electrode is provided on the first substrate 110.

In multiple embodiments of the present disclosure, the second sensing electrodes SE2 are located at a periphery of a counter electrode 140. For example, the second sensing electrodes SE2 surround the counter electrode 140, to form a receiving area (or namely accommodated region) that receives the counter electrode 140. A patterned electrode layer 120 of the display panel further includes at least one third connection electrode CO3, disposed at each subpixel 100 of the first substrate 110. The third connection electrode CO3 is disposed to be across (or namely crossover) the second sensing electrode SE2 to connect counter electrodes 140 of two adjacent subpixels 100. A pixel electrode 124 and the third connection electrode CO3 are separated, and the third connection electrode CO3 and the second sensing electrode SE2 are interlaced. Preferably, the second sensing electrode SE2 and the counter electrode 140 are formed by a same patterned layer, and the pixel electrode 124 and a first capacitor electrode 122 are formed by a same patterned layer; however, the present disclosure is not limited thereto. In one of the embodiments of the present disclosure, the second sensing electrode SE2 is located on a bank 150 (for example, a top surface), and the bank 150 covers a part of the third connection electrode CO3, as shown in FIG. 15A.

Referring to FIG. 14A, FIG. 15A, and FIG. 15B at the same time, it should be noted that, in addition to the interlaced area IT, a first sensing electrode region GR1 (extending in a first direction DR1) includes at least one first sensing electrode SE1 and other related elements (some elements on the second substrate 170 as an example: an upper capacitor electrode 210, a first connection electrode C1, a second connection electrode C2, and the like); however, the first substrate 110 does not include a second sensing electrode SE2. In addition to the interlaced area IT, a second sensing electrode region GR2 (extending in a second direction DR2) includes at least one second sensing electrode SE2 and other related elements (some elements on the first substrate 110 as an example: a thin film transistor, the pixel electrode 124, a conductive bump 180, the first capacitor electrode 122, the third connection electrode CO3, the counter electrode 140, and the like); however, the second substrate 170 does not include at least one first sensing electrode SE1 and the first connection electrode C1. Therefore, the subpixel of the interlaced area IT not only includes the foregoing embodiment (for example, one of FIG. 1 to FIG. 6) forming the present disclosure, but also includes the first sensing electrode SE1, the second sensing electrode SE2, the first connection electrode C1, the second connection electrode C2, the third connection electrode CO3, and related elements.

In one of the embodiments of the present disclosure, a capacitor dielectric layer 190 covers the first sensing electrode SE1, the second connection electrode C2, and the upper capacitor electrode 210 of the second substrate 170, and the first connection electrode C1 is located on the capacitor dielectric layer 190. The first sensing electrode SE1 is disposed in a non-light emitting area NA of the subpixel. The first sensing electrode SE1 has an opening O1. The second connection electrode C2 passes through (extends through) the opening O1 to electrically connect the upper capacitor electrode 210 and an upper capacitor electrode (not shown) of another subpixel. The first connection electrode C1 is across the opening O1 to electrically connect first sensing electrodes SE1 on two sides of the second connection electrode C2 (such as two sides of opening O1). Preferably, the first connection electrode C1 and a second capacitor electrode 200 are formed by a same patterned layer. The first sensing electrode SE1, the second connection electrode C2, and the upper capacitor electrode 210 are formed by a same patterned layer; however, the present disclosure is not limited thereto.

In this embodiment, in the interlaced area IT, a vertical projection of the first sensing electrode SE1 on the patterned electrode layer 120 (that is, the first substrate 110) is partially overlapped with the second sensing electrode SE2. Other details in this embodiment are substantially the same as those discussed above, and are no longer elaborated herein.

Figure 16A:
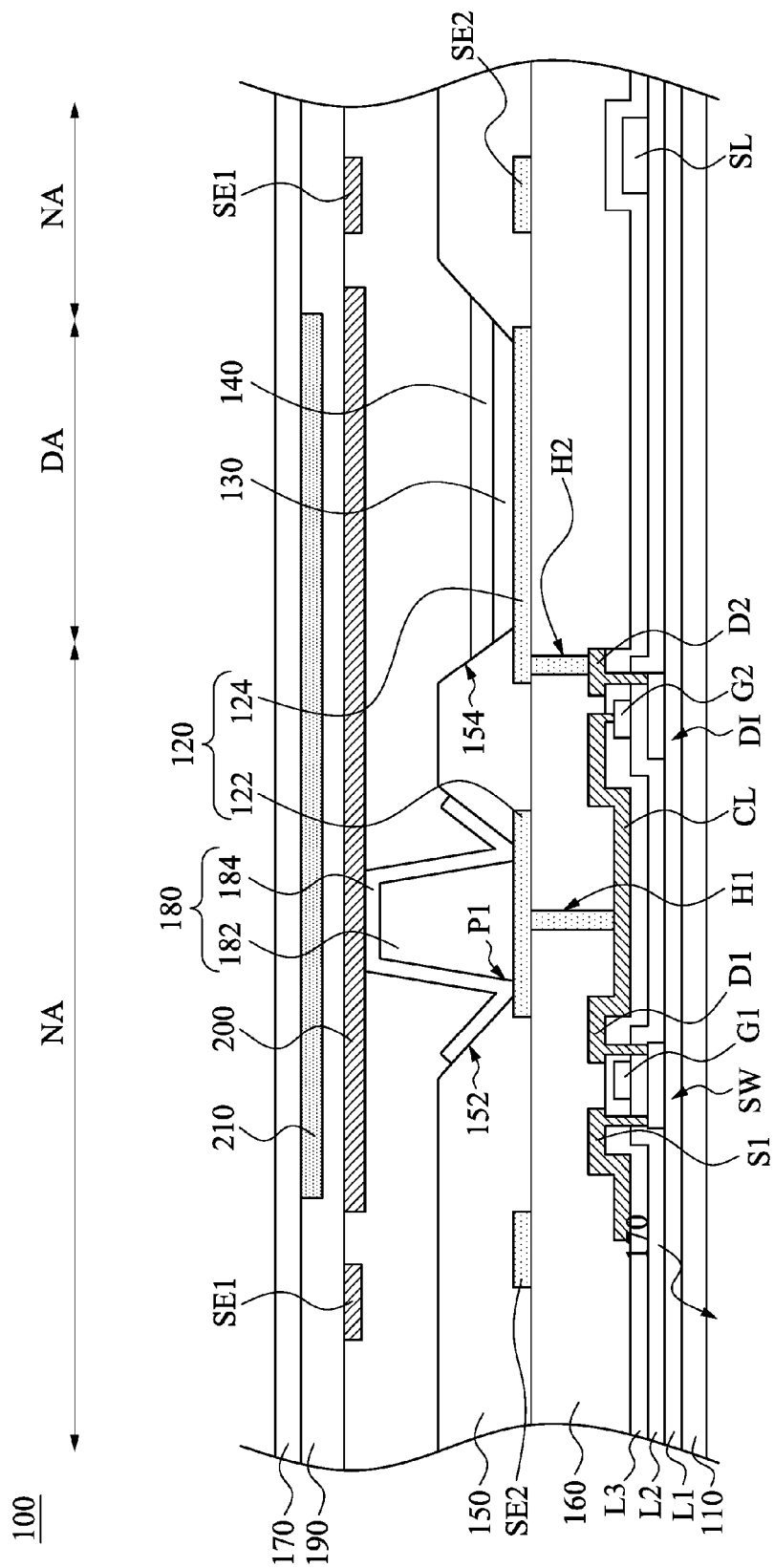
FIG. 16A is a schematic cross-sectional view of a subpixel of a display panel in an interlaced area according to a fourteenth embodiment of the present disclosure.
Figure 16B:
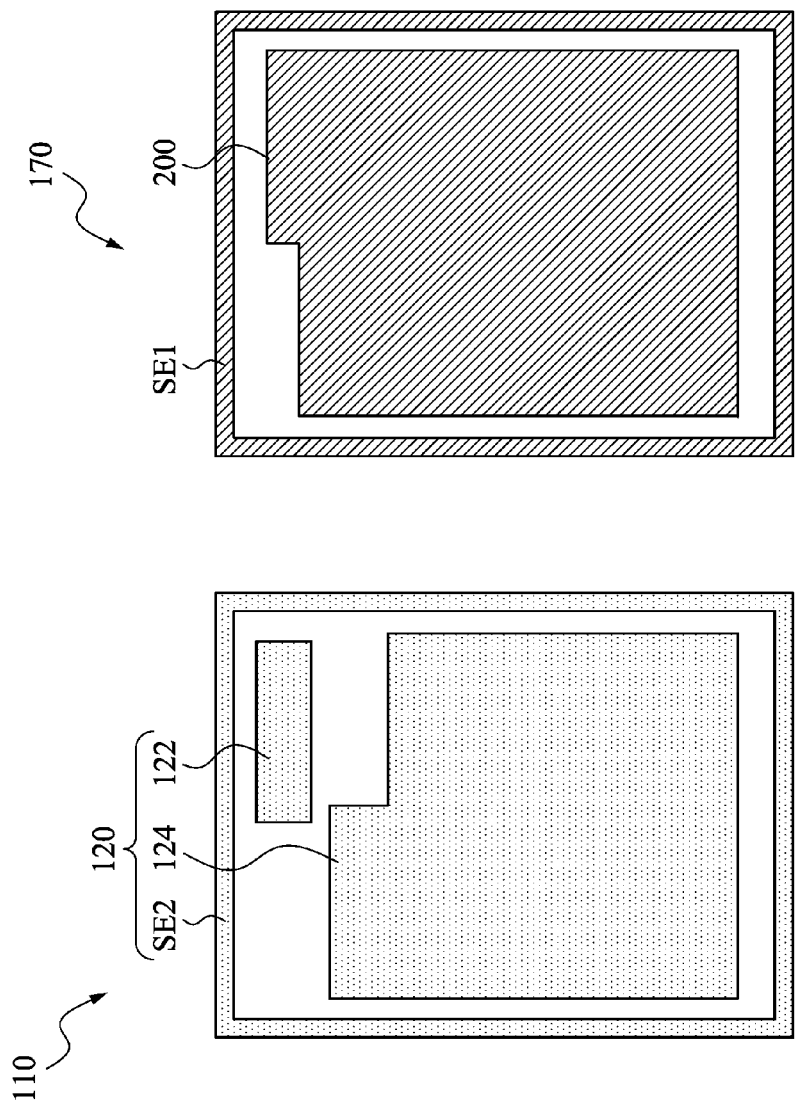
FIG. 16B is a schematic top view of some elements of a first substrate and some elements of a second substrate of the subpixel of the display panel in FIG. 16A.

FIG. 16A is a schematic cross-sectional view of a subpixel 100 of a display panel in an interlaced area IT (referring to FIG. 14A) according to a fourteenth embodiment of the present disclosure. FIG. 16B is a schematic top view of some elements of a second substrate 170 (on the right side of FIG. 16B) and some elements of a first substrate 110 (on the left side of FIG. 16B) of the subpixel 100 of the display panel in FIG. 16A. The subpixel 100 in this embodiment is similar to the subpixel 100 in the embodiment in FIG. 11A, and a difference lies in that the display panel of this embodiment further includes at least one first sensing electrode SE1 located on the second substrate 170 and at least one second sensing electrode SE2 located on the first substrate 110. However, in the embodiment in FIG. 11A and FIG. 11B, only a sensing electrode is provided on the first substrate 110.

Referring to FIG. 14A and FIG. 16A, at least one interlaced area IT is provided at an interlaced position between a first sensing electrode region GR1 and a second sensing electrode region GR2, and the first sensing electrode SE1 and the second sensing electrode SE2 are interlaced in the interlaced area IT. The first sensing electrodes SE1 are respectively disposed at each subpixel 100 of the first sensing electrode region GR1 (referring to FIG. 14A) of the second substrate 170. The first sensing electrodes SE1 are connected to each other. The first sensing electrode SE1 is at least partially overlapped with a non-light emitting area NA of the subpixel. An upper capacitor electrode 210 and a second capacitor electrode 200 of each subpixel 100 are both separated from the first sensing electrode SE1. The second sensing electrodes SE2 are disposed at each subpixel 100 of the second sensing electrode region GR2 (referring to FIG. 14A) of the first substrate 110 and are connected to each other. The second sensing electrode SE2 and the subpixel the non-light emitting area NA are at least partially overlapped. A pixel electrode 124 and a first capacitor electrode 122 of each subpixel 100 are both separated from the second sensing electrode SE2.

Referring to FIG. 14A, FIG. 16A, and FIG. 16B at the same time, it should be noted that, in addition to the interlaced area IT, the first sensing electrode region GR1 (extending in a first direction DR1) includes at least one first sensing electrode SE1 and other related elements (some elements on the second substrate 170 as an example: the upper capacitor electrode 210, the second capacitor electrode 200, and the like); however, the first substrate 110 does not include a second sensing electrode SE2. In addition to the interlaced area IT, the second sensing electrode region (extending in a second direction DR2) GR2 includes at least one second sensing electrode SE2 and other related elements (some elements on the first substrate 110 as an example: a thin film transistor, the pixel electrode 124, the first capacitor electrode 122, a conductive bump 180, a counter electrode 140, and the like); however, the second substrate 170 does not include at least one first sensing electrode SE1. Therefore, the subpixel in the interlaced area IT not only includes the foregoing embodiment (for example, one of FIG. 1 to FIG. 6) forming the present disclosure, but also includes the first sensing electrode SE1, the second sensing electrode SE2, and related elements.

As shown in FIG. 16A, the first sensing electrode SE1 is located on a capacitor dielectric layer 190 of the second substrate 170. A bank 150 covers a part of the second sensing electrode SE2 of the first substrate 110, and for the rest related details, reference is made to the foregoing. In multiple embodiments of the present disclosure, as shown in FIG. 16B, the first sensing electrodes SE1 on the second substrate 170 are located at a periphery of the second capacitor electrode 200. For example, the first sensing electrodes SE1 surround the second capacitor electrode 200, and the second sensing electrodes SE2 on the first substrate 110 are located at the peripheries of the first capacitor electrode 122 and the pixel electrode 124. For example, the second sensing electrodes SE2 surround the first capacitor electrode 122 and the pixel electrode 124. In the interlaced area IT, a vertical projection of the first sensing electrode SE1 on a patterned electrode layer 120 (that is, the first substrate 110) is partially overlapped with the second sensing electrode SE2. Other details in this embodiment are substantially the same as those discussed above, and are no longer elaborated herein.

Figure 17A:
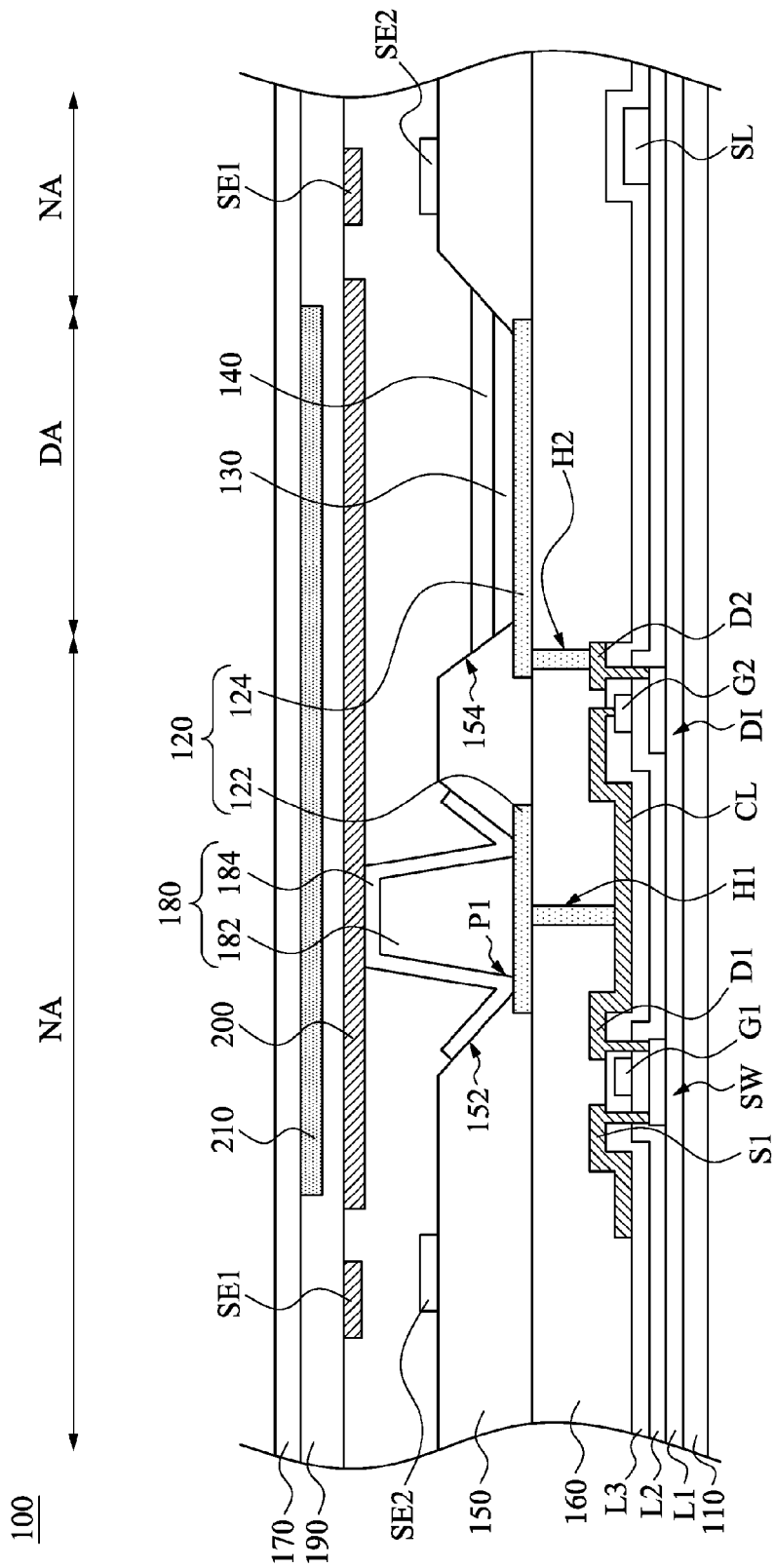
FIG. 17A is a schematic cross-sectional view of a subpixel of a display panel in an interlaced area according to a fifteenth embodiment of the present disclosure.
Figure 17B:
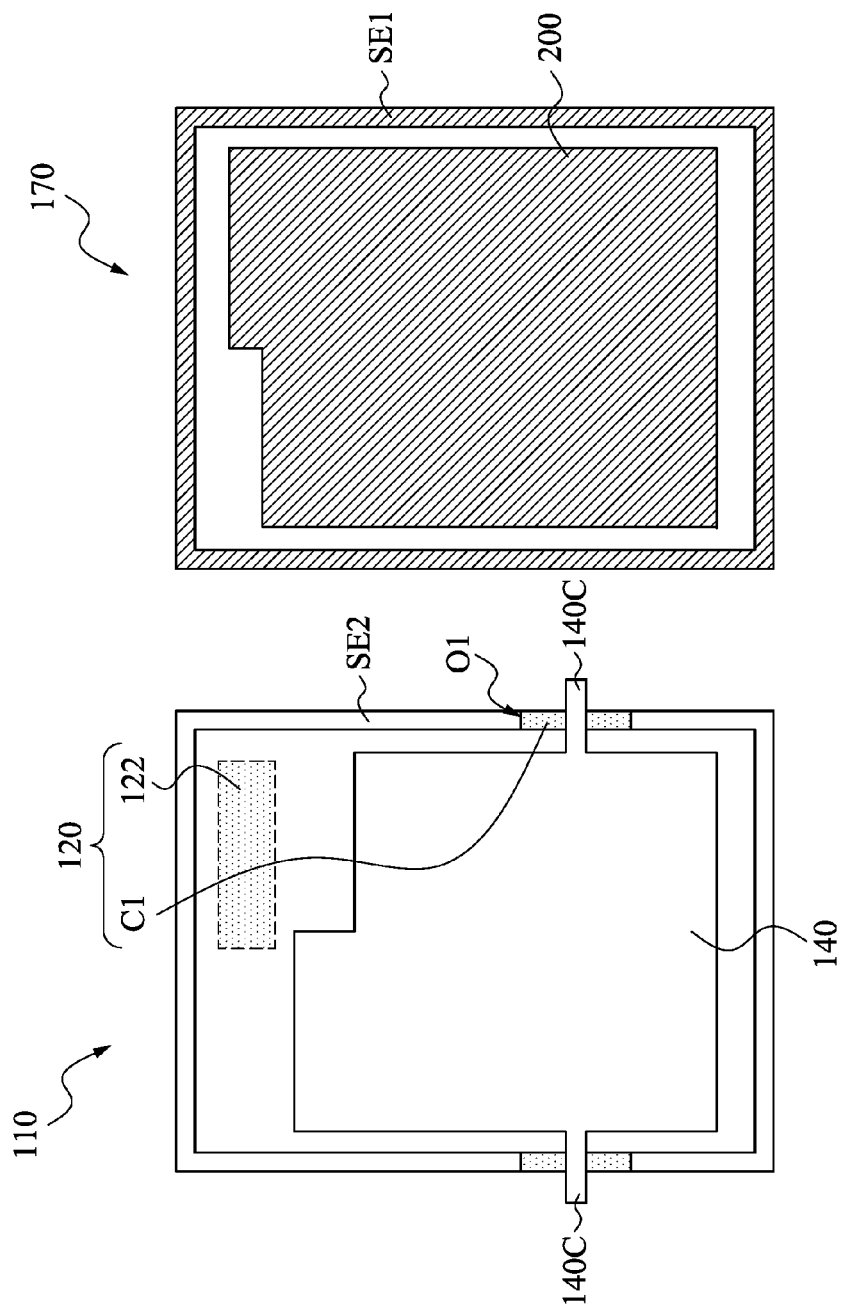
FIG. 17B is a schematic top view of some elements of a first substrate and some elements of a second substrate of the subpixel of the display panel in FIG. 17A.

FIG. 17A is a schematic cross-sectional view of a subpixel 100 of a display panel in an interlaced area IT (referring to FIG. 14A) according to a fifteenth embodiment of the present disclosure. FIG. 17B is a schematic top view of some elements of a second substrate 170 (on the right side of FIG. 17B) and some elements of a first substrate 110 (on the left side of FIG. 17B) of the subpixel 100 of the display panel in FIG. 17A. The subpixel 100 in this embodiment is similar to the subpixel 100 in the embodiment in FIG. 12A, and a major difference lies in that: the display panel includes at least one first sensing electrode SE1 located on the second substrate 170 and at least one second sensing electrode SE2 located on the first substrate 110. However, in the embodiment in FIG. 12A and FIG. 12B, only a sensing electrode is provided on the first substrate 110.

Referring to both FIG. 14A and FIG. 17A, at least one interlaced area IT is provided in an interlaced position between a first sensing electrode region GR1 and a second sensing electrode region GR2, and the first sensing electrode SE1 and the second sensing electrode SE2 are interlaced in the interlaced area IT. The first sensing electrodes SE1 are respectively disposed at each subpixel 100 of the first sensing electrode region GR1 (referring to FIG. 14A) of the second substrate 170. The first sensing electrodes SE1 are connected to each other. The first sensing electrode SE1 and a non-light emitting area NA of the subpixel are at least partially overlapped. An upper capacitor electrode 210 and a second capacitor electrode 200 of each subpixel 100 are both separated from the first sensing electrode SE1. The second sensing electrodes SE2 are disposed at each subpixel 100 of the second sensing electrode region GR2 (referring to FIG. 14A) of the first substrate 110 and are connected to each other. The second sensing electrode SE2 and the subpixel the non-light emitting area NA are at least partially overlapped. A pixel electrode 124 and a first capacitor electrode 122 of each subpixel 100 are both separated from the second sensing electrode SE2, and the first sensing electrode SE1 and the second sensing electrode SE2 are separated.

In this embodiment, the display panel further includes at least one first connection electrode C1 and at least one second connection electrode 140C. The first connection electrode C1 is disposed at each subpixel 100 of the first substrate 110, to connect the second sensing electrodes SE2 of each subpixel 100. The first capacitor electrodes 122 of each subpixel and the first connection electrodes C1 where the first capacitor electrodes are located are separated. The second connection electrodes 140C are disposed at each subpixel 100 of the first substrate 110 and connect counter electrodes 140 of two adjacent subpixels 100, and the first connection electrode C1 and the second connection electrode 140C are interlaced. Preferably, the second sensing electrode SE2, the second connection electrode 140C, and the counter electrode 140 are formed by a same patterned layer, and the pixel electrode 124, the first connection electrode C1, and the first capacitor electrode 122 are formed by a same patterned layer; however, the present disclosure is not limited thereto. In one of the embodiments of the present disclosure, the first sense electrodes SE1 are located on a capacitor dielectric layer 190 of the second substrate 170, the second sensing electrode SE2 and the second connection electrode 140C are located on a bank 150 (for example, a top surface) of the first substrate 110, and the bank 150 covers a part of the first connection electrode C1, as shown in FIG. 17A.

Referring to FIG. 14A, FIG. 17A, and FIG. 17B at the same time. It should be noted that, in addition to the interlaced area, the first sensing electrode region GR1 (extending in a first direction DR1) includes at least one first sensing electrode SE1 and other related elements (some elements on the second substrate 170 as an example: the upper capacitor electrode 210, the second capacitor electrode 200, and the like); however, the first substrate 110 does not include a second sensing electrode SE2. In addition to the interlaced area IT, the second sensing electrode region GR2 (extending in a second direction DR2) includes at least one second sensing electrode SE2 and other related elements (some elements on the first substrate 110 as an example: a thin film transistor, the pixel electrode 124, the first capacitor electrode 122, a conductive bump 180, the first connection electrode C1, the second connection electrode 140C, the counter electrode 140, and the like); however, the second substrate 170 does not include at least one first sensing electrode SE1. Therefore, the subpixel in the interlaced area IT not only includes the foregoing embodiment (for example, one of FIG. 1 to FIG. 6) forming the present disclosure, but also includes the first sensing electrode SE1, the second sensing electrode SE2, the first connection electrode C1, the second connection electrode 140C, and related elements. In another embodiment, a third connection electrode (not shown) may be further included to connect upper capacitor electrodes 210 of two adjacent subpixels.

In multiple embodiments of the present disclosure, the first sensing electrodes SE1 are located at a periphery of the second capacitor electrode 200. For example, the first sensing electrodes SE1 surround the second capacitor electrode 200, and the second sensing electrodes SE2 are located at a periphery of the counter electrode 140. For example, the second sensing electrodes SE2 surround the counter electrode 140. In the interlaced area IT, a vertical projection of the first sensing electrode SE1 on the first substrate 110 and a vertical projection of the second sensing electrode SE2 on the first substrate 110 are partially overlapped.

Herein, a patterned electrode layer 120 includes the first connection electrode C1. The first sensing electrode SE1 includes an opening O1. The second connection electrode 140C passes through (extends through) the opening O1 to electrically connect the counter electrode 140 and a counter electrode of another subpixel. The first connection electrode C1 may be across the opening O1 to electrically connect the first sensing electrodes SE1 on two sides of the second connection electrode 140C. Other details in this embodiment are substantially the same as those discussed above, and are no longer elaborated herein.

It should be understood that, in the foregoing multiple embodiments, vertical projections of the first sensing electrode SE1 and the second sensing electrode SE2 on the first substrate 110 may be partially overlapped with a vertical projection of a scan line SL, a power line PL or a data line DL on the first substrate 110, so as to reduce influence on a light-transmission area (for example, a light emitting area DA); however, the present disclosure is not limited thereto. In addition, if the foregoing sensing electrode needs to be made into a loop-form sensing electrode (for example, an electromagnetic sensing element), a connection electrode may be additionally disposed between two adjacent sensing electrodes or at tail ends. Alternatively, a connection electrode may be additionally disposed between the first or second sensing electrodes or at tail ends, to enable the first or second sensing electrodes to form a loop-form sensing electrode. Alternatively, a connection electrode may be additionally disposed between the first and second sensing electrodes or at tail ends, to enable the first and second sensing electrodes to form a loop-form sensing electrode.

Multiple embodiments of the present disclosure provide a subpixel of a display panel. It is designed that a capacitor dielectric layer is provided inside the subpixel, so as to increase an area for a storage capacitor, that is, a storage capacitor element (solid state) is located between two substrates, and increase an aperture ratio. In one of the embodiments, a self-capacitance or mutual-capacitance sensing electrode is designed, and the sensing electrode and a patterned conductive layer inside the subpixel are formed at the same time, so as to provide the subpixel with a sensing (for example, touch control) function and a display function, and to simplify process steps to reduce a cost. In addition, it is designed that the sensing electrode is located near a wire, to prevent a light emitting area from being affected.

Although the present disclosure is disclosed as above by multiple embodiments, these embodiments are not used to limit the present disclosure. Any person skilled in the art may make various changes and modifications without departing from the spirit and scope of the present disclosure, and therefore the protection scope of the present disclosure should be as defined by the appended claims.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A display panel, having a first substrate and a second substrate disposed on the first substrate, and the display panel comprising a plurality of subpixels, wherein at least one of the subpixels comprises:
    a switch element, disposed on the first substrate, and comprising a first end, a second end, and a first gate, wherein the first end is electrically connected to a data line that extends in a first direction, the first gate is electrically connected to a scan line that extends in a second direction, and the first direction is not parallel to the second direction;
    a driving element, disposed on the first substrate, and comprising a first end, a second end, and a second gate, wherein the first end is electrically connected to a power line, the second gate is electrically connected to the second end of the switch element, and the power line is electrically connected to a first voltage source;
    a passivation layer, disposed on the first substrate, and covering the scan line, the data line, the power line, the switch element, the driving element, and the first substrate;
    a patterned electrode layer, disposed on the passivation layer of the first substrate, wherein the patterned electrode layer includes a first capacitor electrode and a pixel electrode separated from the first capacitor electrode, the pixel electrode is electrically connected to the second end of the driving element, and the first capacitor electrode is electrically connected to the second end of the switch element;
    an electroluminescent layer, located on the pixel electrode of the first substrate;
    a counter electrode, disposed on the electroluminescent layer of the first substrate and electrically connected to a second voltage source, wherein the second voltage source is different from the first voltage source;
    a conductive bump, protrusively disposed on the first capacitor electrode of the first substrate, wherein the conductive bump comprises a conductive material;
    an upper capacitor electrode, disposed on an inner surface of the second substrate; and
    a capacitor dielectric layer, covering the upper capacitor electrode of the second substrate, wherein the conductive bump, the capacitor dielectric layer, and the upper capacitor electrode form a storage capacitor.

2. The display panel according to claim 1, wherein the subpixel further comprises a second capacitor electrode, disposed on the capacitor dielectric layer of the second substrate and located between the capacitor dielectric layer and the conductive bump, and wherein two opposite surfaces of the second capacitor electrode are respectively in contact with the capacitor dielectric layer and the conductive bump, and the conductive bump, the second capacitor electrode, the capacitor dielectric layer, and the upper capacitor electrode form the storage capacitor.

3. The display panel according to claim 2, wherein a lower surface of the second capacitor electrode has a concave first portion and a protrusive second portion located on at least one side of the first portion, and a top portion of the conductive bump is corresponding to the first portion on the lower surface of the second capacitor electrode.

4. The display panel according to claim 1, wherein each subpixel has a light emitting area and a non-light emitting area at least disposed on a side of the light emitting area, and the first capacitor electrode is located in the non-light emitting area, and the conductive bump comprises:
    a bump, located on the first capacitor electrode; and
    a third capacitor electrode, at least covering the bump and being connected to the first capacitor electrode.

5. The display panel according to claim 4, wherein the bump has at least one opening, and the third capacitor electrode is electrically connected to the first capacitor electrode through the opening.

6. The display panel according to claim 1, wherein the subpixel further comprises:
    a bank, disposed on the passivation layer and having a first opening and a second opening, wherein the first opening does not cover at least a part of the first capacitor electrode, the second opening does not cover at least a part of the pixel electrode, and the electroluminescent layer and the counter electrode are located in the second opening.

7. The display panel according to claim 6, wherein a thickness of the conductive bum is greater than a thickness of the bank.

8. The display panel according to claim 1, wherein each subpixel has a light emitting area corresponding to the electroluminescent layer and a non-light emitting area at least disposed on a side of the light emitting area, the display panel has at least two first sensing electrode regions and at least two second sensing electrode regions separated from the first sensing electrode regions, and the display panel further comprises:
    a plurality of sensing electrodes, respectively disposed in the subpixels of the first sensing electrode regions and the second sensing electrode regions on the second substrate, and the sensing electrode of each subpixel being partially overlapped with the non-light emitting area, wherein the sensing electrodes in the first sensing electrode regions and the sensing electrodes in the second sensing electrode regions are separated.

9. The display panel according to claim 8, further comprising:
    at least one first connection electrode, disposed on the second substrate, wherein the first connection electrode is adapted to connect upper capacitor electrodes of two adjacent subpixels, and the first connection electrode and the sensing electrode are separated and partially overlapped, wherein each subpixel of the first sensing electrode regions and the second sensing electrode regions disposed on the second substrate further comprises:

a second capacitor electrode, disposed on the second substrate and located between the capacitor dielectric layer and the conductive bump, wherein the second capacitor electrode and the upper capacitor electrode are at least partially overlapped.

10. The display panel according to claim 9, wherein the first sensing electrode regions and the second sensing electrode regions are respectively arranged in different extending directions, and wherein the extending directions each other interlaced, the display panel further has at least one first bridge electrode region and at least one the second bridge electrode region adjacent to the first bridge electrode region, the first bridge electrode region is located between the first sensing electrode region and the second bridge electrode region, the second bridge electrode region is located in an interlaced position between the extending directions of the first sensing electrode regions and the second sensing electrode regions, and the display panel further comprises:

a second connection electrode, disposed on the second substrate, and located at each subpixel of the first bridge electrode region and the second bridge electrode region, so as to connect the sensing electrodes located in the first sensing electrode regions; and a third connection electrode, disposed on the second substrate, and located at each subpixel of the second bridge electrode region, so as to connect the sensing electrodes located in the second sensing electrode regions, wherein the second connection electrode and the third connection electrode are separated and interlaced.

11. The display panel according to claim 10, wherein the second connection electrode comprises:

at least one first sub-electrode segment, located between two adjacent subpixels in the first bridge electrode region, wherein the first sub-electrode segment and the sensing electrode located in the first bridge electrode region are partially overlapped and connected; and at least one second sub-electrode segment, connected to the first sub-electrode segment.

12. The display panel according to claim 1, wherein each subpixel has a light emitting area corresponding to the electroluminescent layer and a non-light emitting area at least disposed on a side of the light emitting area, the display panel has at least two first sensing electrode regions and at least two second sensing electrode regions separated from the first sensing electrode regions, and the display panel further comprises:

a plurality of sensing electrodes, respectively disposed in the subpixels of the first sensing electrode regions and the second sensing electrode regions on the second substrate, and the sensing electrode being partially overlapped with the light emitting area in each subpixel, wherein the sensing electrodes in the first sensing electrode regions and the sensing electrodes in the second sensing electrode regions are separated; and at least one first connection electrode, disposed on the second substrate, wherein the first connection electrode connects sensing electrodes of two adjacent subpixels.

13. The display panel according to claim 12, wherein the upper capacitor electrode is partially overlapped with the non-light emitting area, and the subpixel further comprises:

a second capacitor electrode, disposed on the second substrate and located between the capacitor dielectric layer and the conductive bump, wherein the second capacitor electrode is partially overlapped with the upper capacitor electrode; and at least one second connection electrode, disposed on the second substrate, wherein the second connection electrode connects upper capacitor electrodes of two adjacent subpixels, and the second connection electrode and the first connection electrode are separated and interlaced.

14. The display panel according to claim 13, wherein the first sensing electrode regions and the second sensing electrode regions are respectively arranged in different extending directions, wherein the extending directions are interlaced with each other, the display panel further has a bridge electrode region located in an interlaced position between the extending directions of the first sensing electrode regions and the second sensing electrode regions, and the display panel further comprises:

a third connection electrode, disposed on the second substrate, and located in each subpixel of the bridge electrode region, so as to connect the sensing electrodes located in the second sensing electrode regions, wherein the third connection electrode and a sensing electrode of each subpixel located in the bridge electrode region are interlaced.

15. The display panel according to claim 12, wherein the first sensing electrode regions and the second sensing electrode regions are respectively arranged in different extending directions, wherein the extending directions are interlaced with each other, the display panel further has a first bridge electrode region located in an interlaced position between the extending directions of the first sensing electrode regions and the second sensing electrode regions, and the display panel further comprises:

a plurality of second capacitor electrodes, disposed on the second substrate, and respectively located between the capacitor dielectric layer and the conductive bump in each subpixel area, wherein the second capacitor electrodes are partially overlapped with the upper capacitor electrode;

at least one second connection electrode, disposed on the second substrate, and located in each subpixel of the bridge electrode region, so as to electrically connect the sensing electrodes located in the second sensing electrode regions, wherein the second connection electrode and a sensing electrode of each subpixel located in the bridge electrode region are separated; and at least one third connection electrode, disposed on the second substrate, and located in the subpixel of the bridge electrode regions, so as to connect the second connection electrodes of two adjacent subpixel areas located in each bridge electrode region.

16. The display panel according to claim 1, wherein each subpixel has a light emitting area corresponding to the electroluminescent layer and a non-light emitting area at least disposed on a side of the light emitting area, the display panel has a plurality of sensing electrode regions, and the patterned electrode layer further comprises:

a sensing electrode, disposed in each subpixel of each sensing electrode region of the first substrate, and the sensing electrode of each subpixel being partially overlapped with the non-light emitting area, wherein the sensing electrode of each subpixel at least partially surrounds the pixel electrode and the first capacitor electrode, and the pixel electrode and the first capacitor electrode are separated from the sensing electrode.

17. The display panel according to claim 16, further comprising:
a bank, disposed on the passivation layer of the first substrate and having a first opening and a second opening, wherein the first opening does not cover at least a part of the first capacitor electrode, the second opening does not cover at least a part of the pixel electrode, the electroluminescent layer and the counter electrode are located in the second opening, and the bank covers the sensing electrode.

18. The display panel according to claim 1, wherein each subpixel has a light emitting area corresponding to the electroluminescent layer and a non-light emitting area at least disposed on a side of the light emitting area, the display panel has a plurality of sensing electrode regions, and the display panel further comprises:
a plurality of sensing electrodes, respectively disposed in the subpixels in the sensing electrode regions of the first substrate, and the sensing electrode of each subpixel being partially overlapped with the non-light emitting area, wherein the sensing electrode of each subpixel at least partially surrounds the counter electrode, and the pixel electrode, the counter electrode, and the first capacitor electrode are all separated from the sensing electrode.

19. The display panel according to claim 18, further comprising:
at least one first connection electrode, respectively disposed between two adjacent subpixels in each sensing electrode region, so as to connect the counter electrodes of the subpixels, and the pixel electrode, the sensing electrode, and the first capacitor electrode of each subpixel are all separated from the first connection electrode.

20. The display panel according to claim 19, further comprising:
a bank, disposed on the passivation layer of the first substrate and having a first opening and a second opening, wherein the first opening does not cover at least a part of the first capacitor electrode, the second opening does not cover at least a part of the pixel electrode, the electroluminescent layer and the counter electrode are located in the second opening, the sensing electrode is disposed on the bank, and the bank covers the first connection electrode.

21. The display panel according to claim 1, wherein each subpixel has a light emitting area corresponding to the electroluminescent layer and a non-light emitting area at least disposed on a side of the light emitting area, the display panel has at least one first sensing electrode region and at least one second sensing electrode region that is interlaced with and separated from the first sensing electrode region, and the patterned electrode layer further comprises:
a plurality of first sensing electrodes, respectively disposed at each subpixel of the first sensing electrode region of the first substrate and connected to each other, and the first sensing electrode being partially overlapped with the non-light emitting area, wherein the sensing electrode of each subpixel at least partially surrounds and is separated from the pixel electrode and the first capacitor electrode,
wherein the display panel further comprises:
a bank, disposed on the passivation layer of the first substrate and having a first opening and a second opening, wherein the first opening does not cover at least a part of the first capacitor electrode, the second opening does not cover at least a part of the pixel electrode, the electroluminescent layer and the counter electrode are located in the second opening, and the bank covers the first sensing electrode; and
a plurality of second sensing electrodes, respectively disposed at each subpixel of the second sensing electrode region of the first substrate and connected to each other, the second sensing electrodes being partially overlapped with the non-light emitting area, wherein the second sensing electrodes are disposed on the bank and at least partially surround the counter electrode, the counter electrode of each subpixel is separated from the second sensing electrodes, and the first sensing electrode and the second sensing electrodes are separated.

22. The display panel according to claim 21, wherein the first sensing electrode regions and the second sensing electrode regions are respectively arranged in different extending directions and are interlaced with each other to have at least one interlaced area, the first and second sensing electrodes are at least partially overlapped in the interlaced area, the display panel further comprises:
a plurality of first connection electrodes, respectively disposed at each subpixel of the first substrate, so as to connect the second sensing electrodes of each subpixel; and
a plurality of second connection electrodes, respectively disposed at each subpixel of the first substrate, wherein the second connection electrode is located on the bank and is adapted to connect counter electrodes of two adjacent subpixels in the interlaced area, and the first connection electrode and the second connection electrode are interlaced with each other.

23. The display panel according to claim 22, wherein the bank further covers a part of the first connection electrode.

24. The display panel according to claim 1, wherein each subpixel has a light emitting area corresponding to the electroluminescent layer and a non-light emitting area at least disposed on a side of the light emitting area, the display panel has at least one first sensing electrode region and at least one second sensing electrode region that is interlaced with and separated from the first sensing electrode region, and the display panel further comprises:
a plurality of first sensing electrodes, respectively disposed at each subpixel of the first sensing electrode region of the second substrate and connected to each other, the first sensing electrodes being partially overlapped with the non-light emitting area, wherein a capacitor upper electrode of each subpixel is separated from the first sensing electrodes; and
a plurality of second sensing electrodes, respectively disposed at each subpixel of the second sensing electrode region of the first substrate and connected to each other, the second sensing electrodes being partially overlapped with the non-light emitting area, wherein the second sensing electrodes of each subpixel at least partially surround and are separated from the pixel electrode and the first capacitor electrode.

25. The display panel according to claim 24, further comprising:
a bank, disposed on the passivation layer of the first substrate and having a first opening and a second opening, wherein the first opening does not cover at least a part of the first capacitor electrode, the second opening does not cover at least a part of the pixel electrode, and the electroluminescent layer and the counter electrode are located in the second opening.

26. The display panel according to claim 25, wherein the first sensing electrode regions and the second sensing electrode regions are respectively arranged in different extending directions, and are interlaced with each other to have at least one interlaced area, and the first and second sensing electrodes are at least partially overlapped in the interlaced area, and the display panel further comprises:
a plurality of first connection electrode, respectively disposed at each subpixel of the second substrate, so as to connect the first sensing electrodes of each subpixel, wherein the second capacitor electrode of each subpixel is separated from each first connection electrode where the second capacitor electrode is located; and
a plurality of second connection electrode, respectively disposed at each subpixel of the second substrate, and connecting capacitor upper electrodes on two adjacent subpixels, wherein the first connection electrode and the second connection electrode are interlaced.

27. The display panel according to claim 26, wherein the bank covers the second sensing electrodes, the capacitor dielectric layer covers the first sensing electrodes, the second connection electrode, and the upper capacitor electrode, and the first connection electrode is located on the capacitor dielectric layer.

28. The display panel according to claim 25, further comprising:
a plurality of third connection electrode, respectively disposed at each subpixel of the first substrate and connecting counter electrodes of two adjacent subpixels, wherein the pixel electrode and the third connection electrode of each subpixel are separated, and the third connection electrode and the second sensing electrodes are interlaced.

29. The display panel according to claim 28, wherein the second sensing electrodes are located on the bank, the bank covers a part of the third connection electrode, the capacitor dielectric layer covers the first sensing electrodes, the second connection electrode, and the upper capacitor electrode, and the first connection electrode is located on the capacitor dielectric layer.

30. The display panel according to claim 25, wherein the first sensing electrode regions and the second sensing electrode regions are respectively arranged in different extending directions and are interlaced with each other to have at least one interlaced area, the first and second sensing electrodes are at least partially overlapped in the interlaced area, the first sensing electrodes are located on the capacitor dielectric layer, and the bank covers a part of the second sensing electrodes.

31. The display panel according to claim 25, wherein the first sensing electrode regions and the second sensing electrode regions are respectively arranged in different extending directions and are interlaced with each other to have at least one interlaced area, the first and second sensing electrodes are at least partially overlapped in the interlaced area, and the display panel further comprises:
a plurality of first connection electrode, respectively disposed at each subpixel of the first substrate, so as to connect the first sensing electrodes of each subpixel, wherein the first capacitor electrode of each subpixel is separated from each first connection electrode where the first capacitor electrode is located; and
a plurality of second connection electrode, respectively disposed at each subpixel of the first substrate, and connecting counter electrodes of two adjacent subpixels, wherein the first connection electrode and the second connection electrode are interlaced.

32. The display panel according to claim 31, wherein the first sensing electrodes are located on the capacitor dielectric layer, the second sensing electrodes and the second connection electrodes are located on the bank, and the bank covers the first connection electrodes.

33. A display panel, comprising:
a substrate;
an upper capacitor electrode, disposed on an inner surface of the substrate;
a capacitor dielectric layer, covering the upper capacitor electrode;
a first sensing electrode, disposed on the inner surface of the substrate;
a counter substrate, disposed opposite the substrate, wherein the counter substrate has at least one pixel electrode and a first capacitor electrode separated from the pixel electrode, the pixel electrode is connected to an end of a driving element, a gate of the driving element is electrically connected to an end of a switch element, and the first capacitor electrode is connected to the end of the switch element;
a conductive bump, disposed on the first capacitor electrode of the counter substrate, and partially overlapped with the upper capacitor electrode in a vertical projection direction;
an electroluminescent layer, sandwiched between the substrate and the counter substrate, and located on the pixel electrode; and
a counter electrode, disposed on the electroluminescent layer.

34. The display panel according to claim 33, wherein the first sensing electrode surrounds the upper capacitor electrode.

35. The display panel according to claim 33, further comprising:
a first connection electrode, disposed on the inner surface of the substrate, and electrically connected to the upper capacitor electrode or the first sensing electrode; and
a second capacitor electrode, disposed on the inner surface of the substrate, and located on a side, facing and close to the counter substrate, of the capacitor dielectric layer.

36. The display panel according to claim 33, further comprising a second sensing electrode, disposed on the inner surface of the substrate or an inner surface of the counter substrate, wherein the second sensing electrode and the first sensing electrode are interlaced.

37. The display panel according to claim 33, wherein the upper capacitor electrode surrounds the first sensing electrode.

38. A display panel, comprising:
a substrate;
an upper capacitor electrode, disposed on an inner surface of the substrate;
a capacitor dielectric layer, covering the upper capacitor electrode;
a counter substrate, opposite the substrate setting;
a patterned electrode layer, disposed on an inner surface of the counter substrate, wherein a patterned electrode layer comprises a first capacitor electrode and a pixel electrode separated from the first capacitor electrode, the pixel electrode is connected to an end of a driving element, a gate of the driving element is electrically connected to an end of a switch element, and the first capacitor electrode is connected to the end of the switch element;

a conductive bump, disposed on the first capacitor electrode of the counter substrate, and partially overlapped with the upper capacitor electrode in a vertical projection direction;

an electroluminescent layer, located on the pixel electrode;

a counter electrode, disposed on the electroluminescent layer; and a first sensing electrode, disposed on the inner surface of the counter substrate.

39. The display panel according to claim 38, wherein the patterned electrode layer further comprises a first connection electrode, disposed on the counter substrate and electrically connected to the counter electrode.

40. The display panel according to claim 39, further comprising a second sensing electrode, disposed on the counter substrate and interlaced with the first sensing electrode.

41. The display panel according to claim 40, wherein the patterned electrode layer further comprises a second connection electrode, electrically connected to the second sensing electrode.

42. The display panel according to claim 38, further comprising:

a bank, disposed on the patterned electrode layer of the counter substrate and having a first opening and a second opening, wherein the first opening does not cover at least a part of the first capacitor electrode, the second opening does not cover at least a part of the pixel electrode, and the electroluminescent layer and the counter electrode are located in the second opening.

* * * * *